United States Patent
Lee et al.

(10) Patent No.: US 12,446,379 B2
(45) Date of Patent: Oct. 14, 2025

(54) DISPLAY DEVICE AND TITLED DISPLAY DEVICE

(71) Applicant: Samsung Display Co., LTD., Yongin-si (KR)

(72) Inventors: Kye Uk Lee, Seoul (KR); Jae Phil Lee, Hwaseong-si (KR); Hyun Joon Kim, Hwaseong-si (KR); Jung Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 487 days.

(21) Appl. No.: 18/082,787

(22) Filed: Dec. 16, 2022

(65) Prior Publication Data

US 2023/0238497 A1 Jul. 27, 2023

(30) Foreign Application Priority Data

Jan. 26, 2022 (KR) .................. 10-2022-0011623

(51) Int. Cl.
*H10H 20/857* (2025.01)
*G09F 9/302* (2006.01)
(Continued)

(52) U.S. Cl.
CPC ......... *H10H 20/857* (2025.01); *G09F 9/3026* (2013.01); *G09F 9/33* (2013.01);
(Continued)

(58) Field of Classification Search
CPC .. H10H 20/857; H10H 20/831; H10H 29/142; H10H 29/10; H10H 20/83;
(Continued)

(56) References Cited

U.S. PATENT DOCUMENTS 11,328,629 B2 5/2022 Lee et al.
11,985,854 B2 5/2024 Seo et al.
(Continued)

FOREIGN PATENT DOCUMENTS

JP 2020-13954 1/2020
KR 10-2019-0063793 6/2019
(Continued)

OTHER PUBLICATIONS

International Search Report Corresponding to International Application No. PCT/KR2022/014721, dated Jan. 16, 2023.
(Continued)

*Primary Examiner* — Chanh D Nguyen
*Assistant Examiner* — Gloryvid Figueroa-Gibson
(74) *Attorney, Agent, or Firm* — CANTOR COLBURN LLP

(57) ABSTRACT

A display device comprises anode electrodes respectively corresponding to sub-pixels, cathode electrodes respectively corresponding to the sub-pixels and respectively spaced apart from the anode electrodes, a cathode line electrically connected to the cathode electrodes, anode pads respectively overlapping the plurality of anode electrodes in a plan view, cathode pads respectively overlapping the cathode electrodes in a plan view, and a cathode line pad overlapping at least part of the cathode line in a plan view.

32 Claims, 48 Drawing Sheets

(51) Int. Cl.
 *G09F 9/33* (2006.01)
 *G09G 3/32* (2016.01)
 *H01L 25/075* (2006.01)
 *H10H 20/831* (2025.01)
 *H10H 29/14* (2025.01)

(52) U.S. Cl.
 CPC ............ *G09G 3/32* (2013.01); *H01L 25/0753* (2013.01); *H10H 20/831* (2025.01); *H10H 29/142* (2025.01); *G09G 2310/0275* (2013.01)

(58) Field of Classification Search
 CPC ............ G09F 9/3026; G09F 9/33; G09F 9/30; G09G 3/32; G09G 2310/0275; G09G 2300/026; G09G 3/2011; G09G 3/2014; G09G 2300/0426; G09G 2300/08; G09G 2300/0819; G09G 2300/0852; G09G 2300/0861; G09G 2310/0262; G09G 2310/061; G09G 2310/067; G09G 2330/04; G09G 3/3233; H01L 25/0753; H01L 25/075; G06F 3/1446; H10D 86/443; H10D 86/451; H10D 86/60; H10D 86/441; H10D 86/40
 See application file for complete search history.

(56) References Cited

U.S. PATENT DOCUMENTS

| | | |
|---|---|---|
| 2002/0145205 A1 | 10/2002 | Hirano et al. |
| 2012/0061711 A1 | 3/2012 | Li et al. |
| 2019/0179591 A1 | 6/2019 | Kuo et al. |
| 2021/0249491 A1* | 8/2021 | Kim ............... H10K 71/60 |
| 2021/0257525 A1 | 8/2021 | Ryu et al. |
| 2021/0325711 A1 | 10/2021 | Choi et al. |
| 2023/0268474 A1 | 8/2023 | Jeong et al. |

FOREIGN PATENT DOCUMENTS

| | | |
|---|---|---|
| KR | 10-2019-0068112 | 6/2019 |
| KR | 1020200108146 A | 9/2020 |
| KR | 10-2021-0018591 | 2/2021 |
| KR | 1020210012391 A | 2/2021 |
| KR | 10-2021-0064921 | 6/2021 |
| KR | 10-2023-0113467 | 7/2023 |

OTHER PUBLICATIONS

Written Opinion corresponding to International Application No. PCT/KR2022/014721, dated Jan. 16, 2023.
European Search Report; Application No. 22924315.9; mailed Jun. 5, 2025; 12 pages.

* cited by examiner

FIG. 1
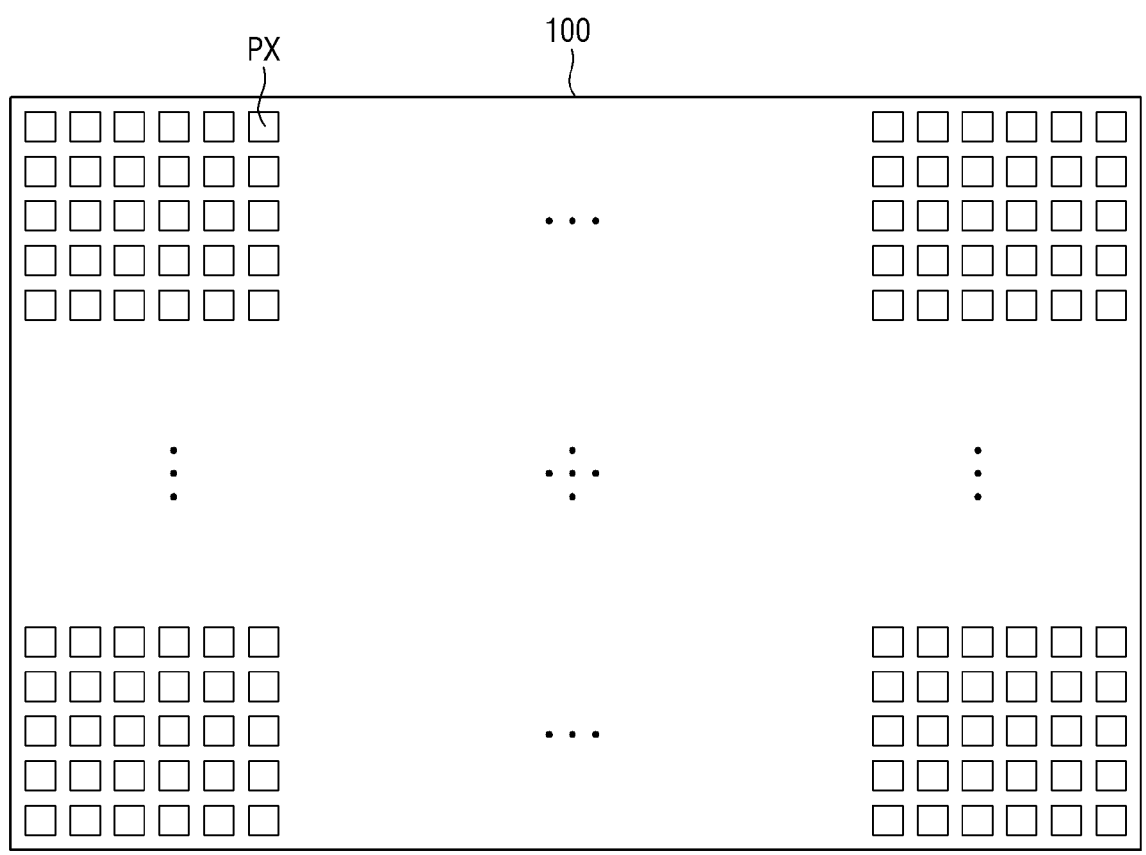
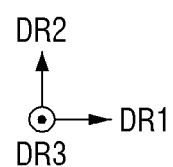

DISPLAY DEVICE AND TITLED DISPLAY DEVICE

CROSS-REFERENCE TO RELATED APPLICATION

This application claims priority to and benefits of Korean Patent Application No. 10-2022-0011623 under 35 U.S.C. § 119, filed on Jan. 26, 2022, in the Korean Intellectual Property Office (KIPO), the entire contents of which are incorporated herein by reference.

BACKGROUND

1. Technical Field

The disclosure relates to a display device and a tiled display device.

2. Description of the Related Art

With the advance of information-oriented society, more demands are placed on display devices for displaying images in various ways. The display device may be a flat panel display device such as a liquid crystal display, a field emission display and a light emitting display.

A light emitting display device may include an organic light emitting display device including an organic light emitting diode as a light emitting element or a light emitting diode display device including an inorganic light emitting diode such as a light emitting diode (LED) as a light emitting element. In the case of the organic light emitting display device, the luminance or grayscale of light of the organic light emitting diode is adjusted by adjusting the magnitude of the driving current applied to the organic light emitting diode. Since, however, the wavelength of light emitted from the inorganic light emitting diode varies depending on the driving current, an image quality may deteriorate in case that the inorganic light emitting diode is driven in the same manner as the organic light emitting diode.

SUMMARY

Aspects of the disclosure provide a display device capable of reducing short circuit failure of a light emitting element, and a tiled display device including the display device.

It should be noted that objects of the disclosure are not limited to the above-described objects, and other objects of the disclosure will be apparent to those skilled in the art from the following descriptions.

According to an embodiment, a display device comprises a plurality of sub-pixels arranged in a display area; an active layer disposed on a substrate; a gate insulating layer overlapping the active layer in a plan view; a first interlayer insulating layer overlapping a first conductive layer disposed on the gate insulating layer in a plan view; a second interlayer insulating layer overlapping a second conductive layer disposed on the first interlayer insulating layer in a plan view; a first planarization layer overlapping a third conductive layer disposed on the second interlayer insulating layer in a plan view; a second planarization layer overlapping a fourth conductive layer disposed on the first planarization layer in a plan view; a third planarization layer overlapping a fifth conductive layer disposed on the second planarization layer in a plan view; a sixth conductive layer disposed on the third planarization layer; and a seventh conductive layer disposed on at least part of the sixth conductive layer. The sixth conductive layer comprises a plurality of anode electrodes respectively corresponding to the plurality of sub-pixels; a plurality of cathode electrodes respectively corresponding to the plurality of sub-pixels and respectively spaced apart from the plurality of anode electrodes; and a cathode line electrically connected to the plurality of cathode electrodes. The seventh conductive layer comprises a plurality of anode pads respectively overlapping the plurality of anode electrodes in a plan view; a plurality of cathode pads respectively overlapping the plurality of cathode electrodes in a plan view; and a cathode line pad overlapping at least part of the cathode line in a plan view.

The display device may further comprise a light emitting element disposed on an anode electrode and a cathode electrode of each of the plurality of sub-pixels, wherein the light emitting element has a flip chip type.

In the plurality of sub-pixels, the plurality of anode pads may be respectively disposed on the anode electrode, respectively overlap top surfaces and side surfaces of the plurality of anode electrodes in a plan view, and be in contact with the third planarization layer, and the plurality of cathode pads may be respectively disposed on the plurality of cathode electrodes, respectively overlap top surfaces and side surfaces of the plurality of cathode electrodes in a plan view, and be in contact with the third planarization layer.

In each of the plurality of sub-pixels, the cathode line pad may overlap an edge of the cathode line facing a corresponding one of the plurality of anode electrodes and a corresponding one of the plurality of cathode electrodes in a plan view.

The cathode line pad may be disposed on the edge of the cathode line, overlap a top surface and a side surface of the edge of the cathode line in a plan view, and be in contact with the third planarization layer.

In each of the plurality of sub-pixels, the cathode line pad may be spaced apart from a corresponding one of the plurality of anode pads, correspond to a boundary between the cathode line and a corresponding one of the plurality of anode electrodes and the plurality of cathode electrodes, and form a closed loop shape together with at least part of an edge of a corresponding one of the plurality of cathode pads, and the plurality of anode electrodes and the plurality of cathode electrodes of sub-pixels adjacent in a direction among the plurality of sub-pixels may be arranged side by side in the direction.

The cathode line pad may correspond to each of the plurality of sub-pixels. The cathode line pad of each of the sub-pixels adjacent in the direction may be spaced apart from each other.

The display device may further comprise a plurality of pixels each comprising two or more sub-pixels adjacent to each other in the direction among the plurality of sub-pixels. The cathode line pad may correspond to each of the plurality of pixels and be further disposed at a boundary between the two or more sub-pixels of each of the plurality of pixels. The cathode line pad of each of the sub-pixels adjacent in the direction and corresponding to different ones of the pixels may be spaced apart from each other.

The cathode line pad may correspond to the sub-pixels adjacent in the direction and may further be disposed at a boundary between the sub-pixels adjacent in the direction.

The cathode line pad may overlap an entire area of the cathode line in a plan view.

Each of the plurality of anode pads, the plurality of cathode pads, and the cathode line pad may extend onto the third planarization layer.

The display device may further comprise a scan write line to which a scan write signal is applied; a scan initialization line to which a scan initialization signal is applied; a sweep signal line to which a sweep signal is applied; a first data line to which a first data voltage is applied; and a second data line to which a second data voltage is applied. Each of the plurality of sub-pixels may be electrically connected to the scan write line, the scan initialization line, the sweep signal line, the first data line, and the second data line. Each of the plurality of sub-pixels may comprise a first pixel driver that generates a control current in response to the first data voltage of the first data line; a second pixel driver that generates a driving current applied to the anode electrode in response to the second data voltage of the second data line; and a third pixel driver that controls a period in which the driving current is applied to a corresponding one of the plurality of anode electrodes in response to the control current of the first pixel driver. The first pixel driver may comprise a first transistor that generates the control current in response to the first data voltage; a second transistor that applies the first data voltage of the first data line to a first electrode of the first transistor in response to the scan write signal; a third transistor that applies an initialization voltage of an initialization voltage line to a gate electrode of the first transistor in response to the scan initialization signal; a fourth transistor that connects a gate electrode and a second electrode of the first transistor in response to the scan write signal; and a first capacitor disposed between the sweep signal line and the gate electrode of the first transistor.

The display device may further comprise a first power line to which a first power voltage is applied; a second power line to which a second power voltage is applied; a first emission line to which a first emission signal is applied; a scan control line to which a scan control signal is applied. The first pixel driver may further comprise a fifth transistor that electrically connects the first power line to the first electrode of the first transistor in response to the first emission signal; a sixth transistor that electrically connects the second electrode of the first transistor to a first node in response to the first emission signal; and a seventh transistor that electrically connects the sweep signal line to a gate-off voltage line to which a gate-off voltage is applied in response to the scan control signal.

The second pixel driver may comprise an eighth transistor that generates the driving current in response to the second data voltage; a ninth transistor that applies the second data voltage of the second data line to a first electrode of the eighth transistor in response to the scan write signal; a tenth transistor that applies an initialization voltage of the initialization voltage line to a gate electrode of the eighth transistor in response to the scan initialization signal; and an eleventh transistor that electrically connects the gate electrode and a second electrode of the eighth transistor in response to the scan write signal.

The second pixel driver further comprises a twelfth transistor that electrically connects the second power line to the second node in response to the first emission signal; a thirteenth transistor that electrically connects the second power line to a first electrode of the ninth transistor in response to the first emission signal; a fourteenth transistor that electrically connects the first power line to a second node in response to the scan control signal; and a second capacitor disposed between the gate electrode of the eighth transistor and the second node.

The third pixel driver that comprises a fifteenth transistor comprising a gate electrode electrically connected to a third node; a sixteenth transistor that electrically connects the first node to the initialization voltage line in response to the scan control signal; a seventeenth transistor electrically connects a second electrode of the fifteenth transistor to a first electrode of a light emitting element in response to a second emission signal; an eighteenth transistor that electrically connects the first electrode of the light emitting element to the initialization voltage line in response to the scan control signal; and a third capacitor disposed between the first node and the initialization voltage line.

The display device may further comprise a test signal line to which a test signal is applied; and a third power line to which a third power voltage is applied. The third pixel driver may further comprise a nineteenth transistor that electrically connects the first electrode of the light emitting element to the third power line in response to the test signal. The cathode line may be electrically connected to the third power line.

The active layer may comprise a channel, a source electrode, and a drain electrode of each of the first, second, third, fourth, fifth, sixth, seventh, eighth, ninth, tenth, eleventh, twelfth, thirteenth, fourteenth, fifteenth, sixteenth, seventeenth, eighteenth, and nineteenth transistors. The first conductive layer may comprise a gate electrode of each of the first, second, third, fourth, fifth, sixth, seventh, eighth, ninth, tenth, eleventh, twelfth, thirteenth, fourteenth, fifteenth, sixteenth, seventeenth, eighteenth, and nineteenth transistors, and first, third, and fifth capacitor electrodes which are first parts of the first, second, and third capacitors, respectively. The second conductive layer may comprise second, fourth, and sixth capacitor electrodes which are second parts of the first, second, and third capacitors, respectively.

The third conductive layer may comprise the initialization voltage line, the scan initialization line, the scan write line, the first emission line, a second emission line, a first horizontal power line to which the first power voltage is applied, the sweep signal line, a gate-off voltage line, a scan control line, a test signal line, and a third power auxiliary line to which the third power voltage is applied. The fourth conductive layer may comprise the first data line, a first vertical power line to which the first power voltage is applied, the second data line, and a first anode connection electrode. The first anode connection electrode may be electrically connected to the drain electrode of the seventeenth transistor and the drain electrode of the eighteenth transistor.

The fifth conductive layer may comprise the third power line; and a second anode connection electrode electrically connected to the first anode connection electrode.

The display device may further comprise a passivation layer disposed on the third planarization layer and overlapping an edge of each of the plurality of anode pads, an edge of each of the plurality of cathode pads, the cathode line pad, and the cathode line, in a plan view. In each of the plurality of sub-pixels, a corresponding one of the plurality of anode pads may be electrically connected to a first contact electrode of a light emitting element through an anode contact electrode, and a corresponding one of the plurality of cathode pads may be electrically connected to a second contact electrode of the light emitting element through a cathode contact electrode.

A tiled display device comprises display devices; and a seam between the display devices, wherein one of the display devices comprises a plurality of sub-pixels arranged in a display area; an active layer disposed on a substrate; a gate insulating layer overlapping the active layer in a plan view; a first interlayer insulating layer overlapping a first conductive layer disposed on the gate insulating layer in a plan view; a second interlayer insulating layer overlapping a second conductive layer disposed on the first interlayer insulating layer in a plan view; a first planarization layer overlapping a third conductive layer disposed on the second interlayer insulating layer in a plan view; a second planarization layer overlapping a fourth conductive layer disposed on the first planarization layer in a plan view; a third planarization layer overlapping a fifth conductive layer disposed on the second planarization layer in a plan view; a sixth conductive layer disposed on the third planarization layer; and a seventh conductive layer disposed on at least part of the sixth conductive layer, wherein the sixth conductive layer comprises a plurality of anode electrodes respectively corresponding to the plurality of sub-pixels; a plurality of cathode electrodes respectively corresponding to the plurality of sub-pixels and respectively spaced apart from the plurality of anode electrodes; and a cathode line electrically connected to the plurality of cathode electrodes, and the seventh conductive layer comprises a plurality of anode pads respectively overlapping the plurality of anode electrodes in a plan view; a plurality of cathode pads respectively overlapping the plurality of cathode electrodes in a plan view; and a cathode line pad overlapping at least part of the cathode line in a plan view.

The substrate may be made of glass.

One of the display devices may further comprise pads disposed on a first surface of the substrate; and a side line disposed on a first surface, a second surface and a side surface of the substrate, the side line electrically connected to one of the pads, the side surface disposed between the first surface and the second surface.

One of the display devices may further comprise a connection line disposed on the second surface of the substrate; and a flexible film connected to the connection line through a conductive adhesive member, the side line may be electrically connected to the connection line.

The display devices may be arranged in a matrix form having m rows and n columns.

One of the display devices may further comprise a light emitting element disposed on an anode electrode and a cathode electrode of each of the plurality of sub-pixels, the light emitting element may have a flip chip type.

In the plurality of sub-pixels, the plurality of anode pads may be respectively disposed on the plurality of anode electrodes, respectively may overlap top surfaces and side surfaces of the plurality of anode electrodes in a plan view, and may be in contact with the third planarization layer. The plurality of cathode pads may be respectively disposed on the plurality of cathode electrodes, may respectively overlap top surfaces and side surfaces of the plurality of cathode electrodes in a plan view, and may be in contact with the third planarization layer.

In each of the plurality of sub-pixels, the cathode line pad may overlap an edge of the cathode line facing a corresponding one of the plurality of anode electrodes and a corresponding one of the plurality of cathode electrodes in a plan view.

The cathode line pad may be disposed on the edge of the cathode line, may overlap a top surface and a side surface of the edge of the cathode line in a plan view, and may be in contact with the third planarization layer.

In each of the plurality of sub-pixels, the cathode line pad may be spaced apart from a corresponding one of the plurality of anode pads, may correspond to a boundary between the cathode line and a corresponding one of the plurality of anode electrodes and the plurality of cathode electrodes, and may form a closed loop shape together with at least part of an edge of a corresponding one of the plurality of cathode pads, and the plurality of anode electrodes and the plurality of cathode electrodes of sub-pixels adjacent in a direction among the plurality of sub-pixels may be arranged side by side in the direction.

Each of the plurality of anode pads, the plurality of cathode pads, and the cathode line pad may extend onto the third planarization layer.

The display device according to embodiments includes a plurality of anode electrodes respectively corresponding to a plurality of sub-pixels, a plurality of cathode electrodes respectively corresponding to the plurality of sub-pixels and spaced apart from the plurality of anode electrodes, a cathode line connected to the plurality of cathode electrodes, a plurality of anode pads respectively covering the plurality of anode electrodes, a plurality of cathode pads respectively covering the plurality of cathode electrodes, and a cathode line pad covering at least part of the cathode line.

In each of the plurality of sub-pixels, the anode pad covers the top surface and the side surfaces of the anode electrode, the cathode pad covers the top surface and the side surfaces of the cathode electrode, and the cathode line pad covers the top surface and the side surface of the edge of the cathode line respectively facing the anode electrode and the cathode electrode.

Accordingly, the side surfaces of the anode electrode, the side surfaces of the cathode electrode, and the side surface of the edge of the cathode line are not exposed to a patterning process for arranging the anode pad, the cathode pad, and the cathode line pad, and deformation into an undercut structure does not occur. Accordingly, the separation of a passivation layer due to the undercut structure may be prevented, which makes it possible to prevent the short circuit failure of the light emitting element.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view illustrating a display device according to an embodiment;

DETAILED DESCRIPTION OF THE EMBODIMENTS

Figure 2:
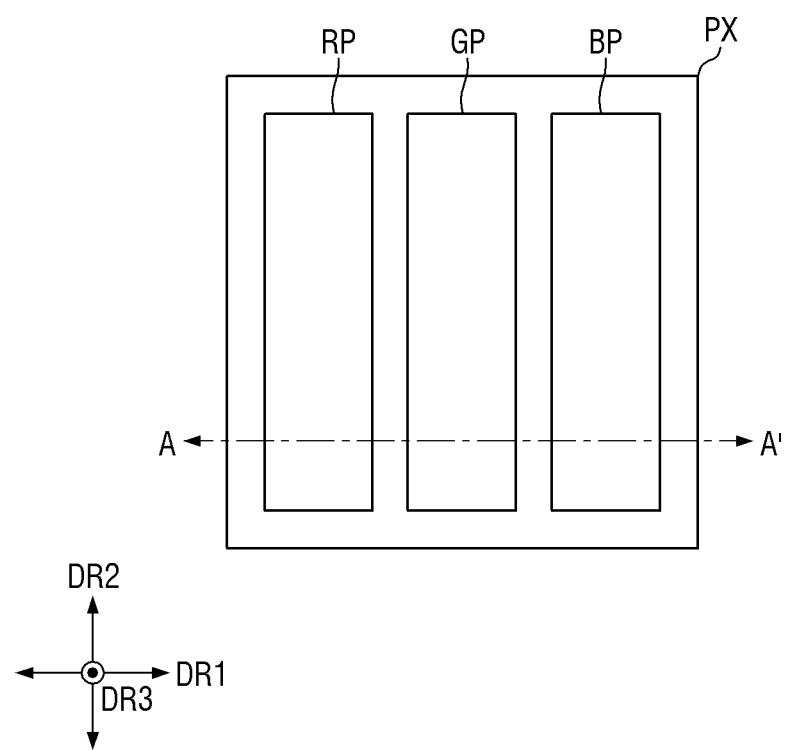
FIG. 2 is a schematic plan view illustrating an example of a pixel of FIG. 1.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the phrase "in a plan view" means when an object portion is viewed from above, and the phrase "in a cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 3:
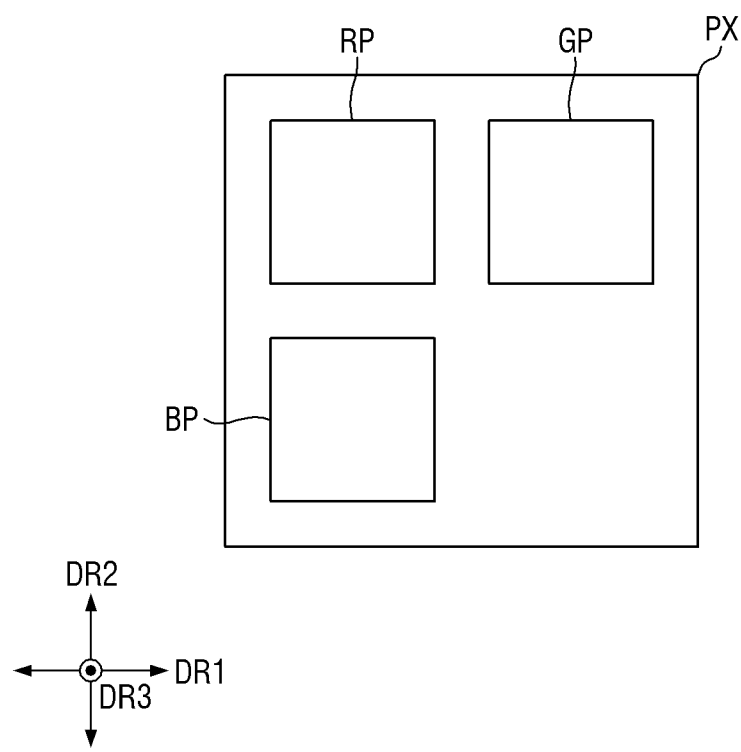
FIG. 3 is a schematic plan view illustrating another example of the pixel of FIG. 1.

FIG. 1 is a schematic plan view illustrating a display device according to an embodiment. FIG. 2 is a schematic plan view illustrating an example of a pixel of FIG. 1. FIG. 3 is a schematic plan view illustrating another example of the pixel of FIG. 1.

Referring to FIG. 1, a display device including a flat display panel 100 is a device for displaying a moving image or a still image. The display device 1 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display panel 100 may, in a plan view, be formed in a rectangular shape having long sides in a first direction DR1 and short sides in a second direction DR2 crossing the first direction DR1. The corners formed by meeting of the long sides in the first direction DR1 and the short sides in the second direction DR2 may be rounded to have a curvature (e.g., a predetermined or selectable curvature) or may be right-angled. The planar shape of the display panel 100 is not limited to the rectangular shape, and may be formed in another polygonal shape, a circular shape or an elliptical shape. The display panel 100 may be formed to be flat, but the disclosure is not limited thereto. For example, the display panel 100 may include a curved portion formed at left and right ends and having a curvature or a varying curvature. The display panel 100 may be formed flexibly so that it can be curved, bent, folded, or rolled.

The display panel 100 may further include pixels PX, scan lines extending in the first direction DR1, and data lines extending in the second direction DR2 to display an image. The pixels PX may be arranged in a matrix form in the first direction DR1 and the second direction DR2.

Each of the pixels PX may include sub-pixels RP, GP, and BP as shown in FIGS. 2 and 3. FIGS. 2 and 3 illustrate that each of the pixels PX includes three sub-pixels RP, GP, and BP, for example, a first sub-pixel RP, a second sub-pixel GP, and a third sub-pixel BP, but the embodiment of the disclosure is not limited thereto.

The first sub-pixel RP, the second sub-pixel GP, and the third sub-pixel BP may be connected to any one of the data lines and at least one of the scan lines.

Each of the first sub-pixel RP, the second sub-pixel GP, and the third sub-pixel BP may have a rectangular, square, or rhombic shape in a plan view.

For example, as shown in FIG. 2, each of the first sub-pixel RP, the second sub-pixel GP, and the third sub-pixel BP may have a rectangular shape having short sides in the first direction DR1 and long sides in the second direction DR2 in a plan view.

As another example, as shown in FIG. 3, each of the first sub-pixel RP, the second sub-pixel GP, and the third sub-pixel BP may have a square or rhombic shape including sides having a same length in the first direction DR1 and the second direction DR2 in a plan view.

As shown in FIG. 2, the first sub-pixel RP, the second sub-pixel GP, and the third sub-pixel BP may be arranged in the first direction DR1. As another example, the first sub-pixel RP and one of the second sub-pixel GP and the third sub-pixel BP may be arranged in the first direction DR1, and the first sub-pixel RP and the other one thereof may be arranged in the second direction DR2.

For example, as shown in FIG. 3, the first sub-pixel RP and the second sub-pixel GP may be arranged in the first direction DR1, and the first sub-pixel RP and the third sub-pixel BP may be arranged in the second direction DR2.

As another example, the second sub-pixel GP and one of the first sub-pixel RP and the third sub-pixel BP may be arranged in the first direction DR1, and the second sub-pixel GP and the other one thereof may be arranged in the second direction DR2. As another example, the third sub-pixel BP and one of the first sub-pixel RP and the second sub-pixel GP may be arranged in the first direction DR1, and the third sub-pixel BP and the other one thereof may be arranged in the second direction DR2.

The first sub-pixel RP may emit first light, the second sub-pixel GP may emit second light having a color different from that of the first light, and the third sub-pixel BP may emit third light having a color different from those of the first light and the second light.

For example, the first light may be light of a red wavelength band, the second light may be light of a green wavelength band, and the third light may be light of a blue wavelength band. The red wavelength band may be about 600 nm to about 750 nm, the green wavelength band may be about 480 nm to about 560 nm, and the blue wavelength band may be about 370 nm to about 460 nm, but the embodiment of the disclosure is not limited thereto.

Each of the first sub-pixel RP, the second sub-pixel GP, and the third sub-pixel BP may include, as a light emitting element that emits light, an inorganic light emitting element having an inorganic semiconductor. For example, the inorganic light emitting element may be a flip chip type micro light emitting diode (LED), but the embodiment of the disclosure is not limited thereto.

As shown in FIGS. 2 and 3, the area of the first sub-pixel RP, the area of the second sub-pixel GP, and the area of the third sub-pixel BP may be substantially the same, but the embodiment of the disclosure is not limited thereto. At least one of the area of the first sub-pixel RP, the area of the second sub-pixel GP, and the area of the third sub-pixel BP may be different from another one thereof. As another example, any two of the area of the first sub-pixel RP, the area of the second sub-pixel GP, and the area of the third sub-pixel BP may be substantially the same, and the other one thereof may be different from the two. As another example, the area of the first sub-pixel RP, the area of the second sub-pixel GP, and the area of the third sub-pixel BP may be different from each other.

Figure 4:
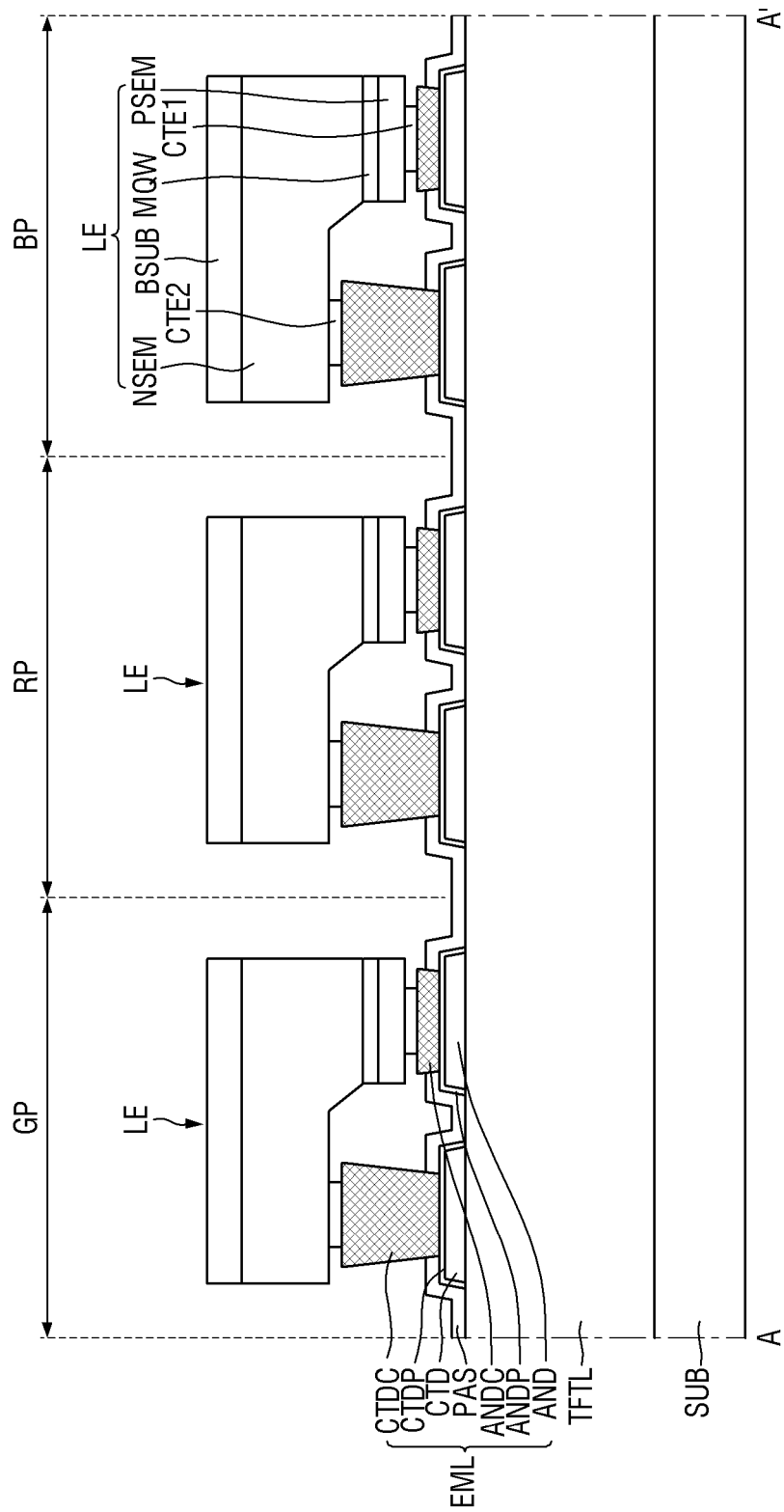
FIG. 4 is a schematic cross-sectional view illustrating an example of the display device taken along line A-A' of FIG. 3.

FIG. 4 is a schematic cross-sectional view illustrating an example of the display device taken along line A-A' of FIG. 3.

Referring to FIG. 4, a thin film transistor layer TFTL may be disposed on a substrate SUB. The thin film transistor layer TFTL may be a layer on which thin film transistors (TFT) are formed. The thin film transistor layer TFTL will be described in detail later.

The substrate SUB may be a member for supporting the display device 10. The substrate SUB may be a rigid substrate made of glass. As another example, the substrate SUB may be a flexible substrate which can be bent, folded or rolled. In this case, the substrate SUB may include an insulating material such as a polymer resin such as polyimide (PI).

A light emitting element layer EML may be disposed on the thin film transistor layer TFTL.

The light emitting element layer EML includes anode electrodes AND, cathode electrodes CTD, and light emitting elements LE.

The light emitting element layer EML may further include an anode contact electrode ANDC disposed between the light emitting element LE and the anode electrode AND, and a cathode contact electrode CTDC disposed between the light emitting element LE and the cathode electrode CTD.

Each of the light emitting elements LE may include a base substrate BSUB, an n-type semiconductor NSEM, an active layer MQW, a p-type semiconductor PSEM, a first contact electrode CTE1, and a second contact electrode CTE2.

The base substrate BSUB may be a sapphire substrate, but the embodiment of the specification is not limited thereto.

The n-type semiconductor NSEM may be disposed on a surface of the base substrate BSUB. For example, the n-type semiconductor NSEM may be disposed on the bottom surface of the base substrate BSUB. The n-type semiconductor NSEM may be formed of GaN doped with an n-type conductive dopant such as Si, Ge, or Sn.

The active layer MQW may be disposed on part of a surface of the n-type semiconductor NSEM. The active layer MQW may include a material having a single or multiple quantum well structure. In case that the active layer MQW contains a material having a multiple quantum well structure, the active layer MQW may have a structure in which well layers and barrier layers are alternately laminated each other. The well layer may be formed of InGaN, and the barrier layer may be formed of GaN or AlGaN, but the disclosure is not limited thereto. As another example, the active layer MQW may have a structure in which semiconductor materials having large band gap energy and semiconductor materials having small band gap energy are alternately stacked each other, and may include other group III to V semiconductor materials according to the wavelength band of emitted light.

The p-type semiconductor PSEM may be disposed on a surface of the active layer MQW. The p-type semiconductor PSEM may be formed of GaN doped with a p-type conductive dopant such as Mg, Zn, Ca, Se, or Ba.

The first contact electrode CTE1 may be disposed on the p-type semiconductor PSEM, and the second contact electrode CTE2 may be disposed on another part of a surface of the n-type semiconductor NSEM. The another part of the surface of the n-type semiconductor NSEM on which the second contact electrode CTE2 is disposed may be placed apart from the part of the surface of the n-type semiconductor NSEM on which the active layer MQW is disposed.

The first contact electrode CTE1 and the anode electrode AND may be bonded to each other by the anode contact electrode ANDC.

The second contact electrode CTE2 and the cathode electrode CTD may be bonded to each other by the cathode contact electrode CTDC.

The anode contact electrode ANDC and the cathode contact electrode CTDC may be conductive adhesive members such as an anisotropic conductive film (ACF) or an anisotropic conductive paste (ACP).

As another example, the light emitting element LE may not include the anode contact electrode ANDC and the cathode contact electrode CTDC. Instead, the first contact electrode CTE1 and the anode electrode AND, and the second contact electrode CTE2 and the cathode electrode CTD may be bonded by a soldering process.

The light emitting element LE may be the flip chip type micro LED.

The flip chip type light emitting element LE includes the first contact electrode CTE1 disposed on the p-type semiconductor PSEM, and the second contact electrode CTE2 disposed on the n-type semiconductor NSEM exposed by partially removing the active layer MQW and the p-type semiconductor PSEM. For example, the flip chip type light emitting element LE has a mesa structure in which the first contact electrode CTE1 protrudes more than the second contact electrode CTE2.

Accordingly, the display panel 100 according to an embodiment may include a step correction structure for correcting a step between the first contact electrode CTE1 and the second contact electrode CTE2.

For example, as shown in FIG. 4, the step correction structure may include a correction hole CRH penetrating at least part of the uppermost organic layer of the thin film transistor layer TFTL.

Each of the first sub-pixel RP, the second sub-pixel GP, and the third sub-pixel BP includes the light emitting element LE connected to the anode electrode AND and the cathode electrode CTD. The anode electrode AND corresponds to each of the sub-pixels RP, GP, and BP, and thus may be referred to as a pixel electrode. Further, the cathode electrode CTD commonly corresponds to the sub-pixels RP, GP, and BP, and thus may be referred to as a common electrode.

The anode electrodes AND and the cathode electrodes CTD may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu).

The lengths of the light emitting element LE in the first direction DR1, in the second direction DR2, and in the third direction DR3 may each be several to several hundreds of m. For example, the lengths of the light emitting element LE in the first direction DR1, in the second direction DR2, and in the third direction DR3 may each be about 100 m or less. However, the embodiments are not limited thereto.

The light emitting elements LE may be formed by being grown on a semiconductor substrate such as a silicon wafer. Each of the light emitting elements LE may be directly transferred from the silicon wafer onto the anode electrode AND and the cathode electrode CTD of the substrate SUB. As another example, each of the light emitting elements LE may be transferred onto the anode electrode AND and the cathode electrode CTD of the substrate SUB through an electrostatic method using an electrostatic head or a stamping method using an elastic polymer material such as PDMS or silicon as a transfer substrate.

The light emitting element layer EML may further include a passivation layer PAS covering (or overlapping) the edges of the anode electrode AND and the cathode electrode CTD.

For example, the passivation layer PAS may be formed as (or formed of) an inorganic layer such as a silicon nitride layer, a silicon oxynitride layer, a silicon oxide layer, a titanium oxide layer, or an aluminum oxide layer.

Figure 5:
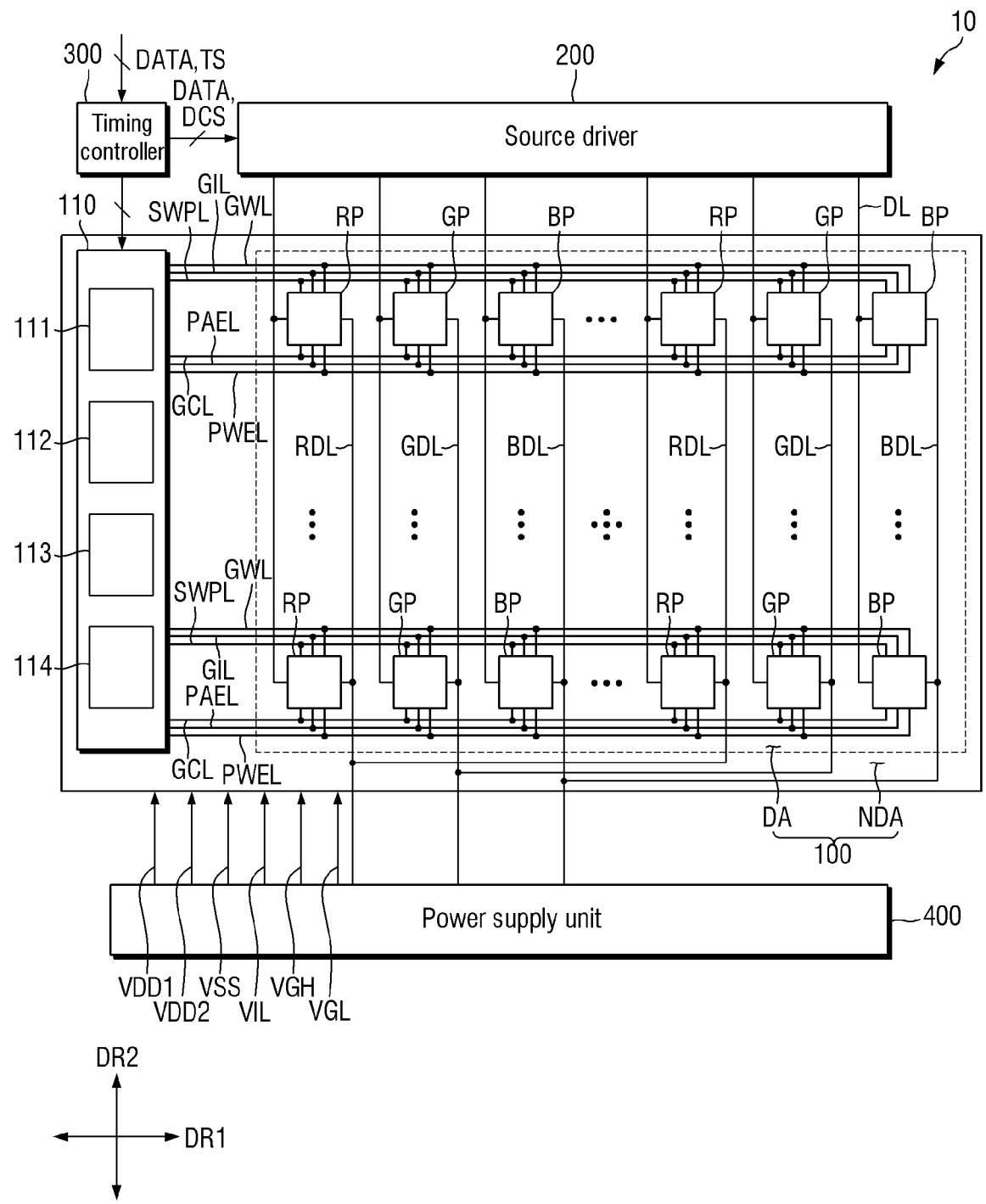
FIG. 5 is a schematic block diagram illustrating a display device according to an embodiment.

FIG. 5 is a schematic block diagram illustrating a display device according to an embodiment.

Referring to FIG. 5, a display device 10 according to an embodiment includes a display panel 100, a scan driver 110, a source driver 200, a timing controller 300, and a power supply part 400.

A display area DA of the display panel 100 may include sub-pixels RP, GP, and BP for displaying an image, scan write lines GWL connected to the sub-pixels RP, GP, and BP, scan initialization lines GIL, scan control lines GCL, sweep signal lines SWPL, pulse width modulation (PWM) emission lines PWEL, pulse amplitude modulation (PAM) emission lines PAEL, PWM data lines DL, first PAM data lines RDL, second PAM data lines GDL, and third PAM data lines BDL.

The scan write lines GWL, the scan initialization lines GIL, the scan control lines GCL, the sweep signal lines SWPL, the PWM emission lines PWEL, and the PAM emission lines PAEL may extend in a first direction DR1, and may be disposed in a second direction DR2 intersecting the first direction DR1. The PWM data lines DL, the first PAM data lines RDL, the second PAM data lines GDL, and the third PAM data lines BDL may extend in the second direction DR2, and may be disposed in the first direction DR1. The first PAM data lines RDL may be electrically connected to each other, the second PAM data lines GDL may be electrically connected to each other, and the third PAM data lines BDL may be electrically connected to each other.

The sub-pixels RP, GP, and BP may include first sub-pixels RP emitting first light, second sub-pixels GP emitting second light, and third sub-pixels BP emitting third light. The first light indicates light of a red wavelength band, the second light indicates light of a green wavelength band, and the third light indicates light of a blue wavelength band. For example, the main peak wavelength of the first light may be in a range of about 600 nm to about 750 nm, the main peak wavelength of the second light may be in a range of about 480 nm to about 560 nm, and the main peak wavelength of the third light may be in a range of about 370 nm to about 460 nm.

Each of the sub-pixels RP, GP, and BP may be connected to any one of the scan write lines GWL, any one of the scan initialization lines GIL, any one of the scan control lines GCL, any one of the sweep signal lines SWPL, any one of the PWM emission lines PWEL, and any one of the PAM emission lines PAEL. Further, each of the first sub-pixels RP may be connected to any one of the PWM data lines DL and any one of the first PAM data lines RDL. Further, each of the second sub-pixels GP may be connected to any one of the PWM data lines DL and any one of the second PAM data lines GDL. Further, each of the third sub-pixels BP may be connected to any one of the PWM data lines DL and any one of the third PAM data lines BDL.

In a non-display area NDA of the display panel 100, a scan driver 110 for applying signals to the scan write lines GWL, the scan initialization lines GIL, the scan control lines GCL, the sweep signal lines SWPL, the PWM emission lines PWEL, and the PAM emission lines PAEL may be disposed. Although FIG. 5 illustrates that the scan driver 110 is disposed at an edge of the display panel 100 in the first direction DR1, the disclosure is not limited thereto. The scan driver 110 may be disposed at edges of the display panel 100 in the first direction DR1.

The scan driver 110 may include a first scan signal driver 111, a second scan signal driver 112, a sweep signal driver 113, and an emission signal driver 114.

The first scan signal driver 111 may receive a first scan driving control signal GDCS1 from the timing controller 300. The first scan signal driver 111 may output scan initialization signals to the scan initialization lines GIL in response to the first scan driving control signal GDCS1, and may output scan write signals to the scan write lines GWL. For example, the first scan signal driver 111 may output scan signals, for example, the scan initialization signals and the scan write signals.

The second scan signal driver 112 may receive a second scan driving control signal GDCS2 from the timing controller 300. The second scan signal driver 112 may output scan control signals to the scan control lines GCL in response to the second scan driving control signal GDCS2.

The sweep signal driver 113 may receive a first emission control signal ECS1 and a sweep control signal SWCS from the timing controller 300. The sweep signal driver 113 may output PWM emission signals to the PWM emission lines PWEL in response to the first emission control signal ECS1, and may output sweep signals to the sweep signal lines SWPL. For example, the sweep signal driver 113 may output the PWM emission signals and the sweep signals.

The emission signal driver (or emission signal output part) 114 may receive a second emission control signal ECS2 from the timing controller 300. The emission signal driver 114 may output PAM emission signals to the PAM emission lines PAEL in response to the second emission control signal ECS2.

The timing controller 300 receives digital video data DATA and timing signals TS. The timing controller 300 may generate a scan timing control signal STCS for controlling the operation timing of the scan driver 110 in response to the timing signals TS. The scan timing control signal STCS may generate the first scan driving control signal GDCS1, the second scan driving control signal GDCS2, the first emission control signal ECS1, the second emission control signal ECS2, and the sweep control signal SWCS. Further, the timing controller 300 may generate a source control signal DCS for controlling the operation timing of the source driver 200.

The timing controller 300 outputs the first scan driving control signal GDCS1, the second scan driving control signal GDCS2, the first emission control signal ECS1, the second emission control signal ECS2, and the sweep control signal SWCS to the scan driver 110. The timing controller 300 outputs the digital video data DATA and the source control signal DCS to the source driver 200.

The source driver 200 converts the digital video data DATA into analog PWM data voltages and outputs the analog PWM data voltages to the PWM data lines DL. Accordingly, the sub-pixels RP, GP, and BP may be selected by the scan write signals of the scan driver 110, and PWM data voltages may be supplied to the selected sub-pixels RP, GP, and BP.

The power supply part 400 may commonly output a first PAM data voltage to the first PAM data lines RDL, commonly output a second PAM data voltage to the second PAM data lines GDL, and commonly output a third PAM data voltage to the third PAM data lines BDL. Further, the power supply part 400 may generate power voltages and output them to the display panel 100.

The power supply part 400 may output a first power voltage VDD1, a second power voltage VDD2, a third power voltage VSS, an initialization voltage VINT, a gate-on voltage VGL, and a gate-off voltage VGH to the display panel 100. The first power voltage VDD1 and the second power voltage VDD2 may be a high potential driving voltage for driving the light emitting element of each of the sub-pixels RP, GP, and BP. The initialization voltage VINT may be a low potential driving voltage for driving the light emitting element of each of the sub-pixels RP, GP, and BP. The initialization voltage VINT and the gate-off voltage VGH may be applied to each of the sub-pixels RP, GP, and BP, and the gate-on voltage VGL and the gate-off voltage VGH may be applied to the scan driver 110.

Each of the source driver 200, the timing controller 300, and the power supply part 400 may be formed as an integrated circuit. Further, the source driver 200 may be formed as integrated circuits.

Figure 6:
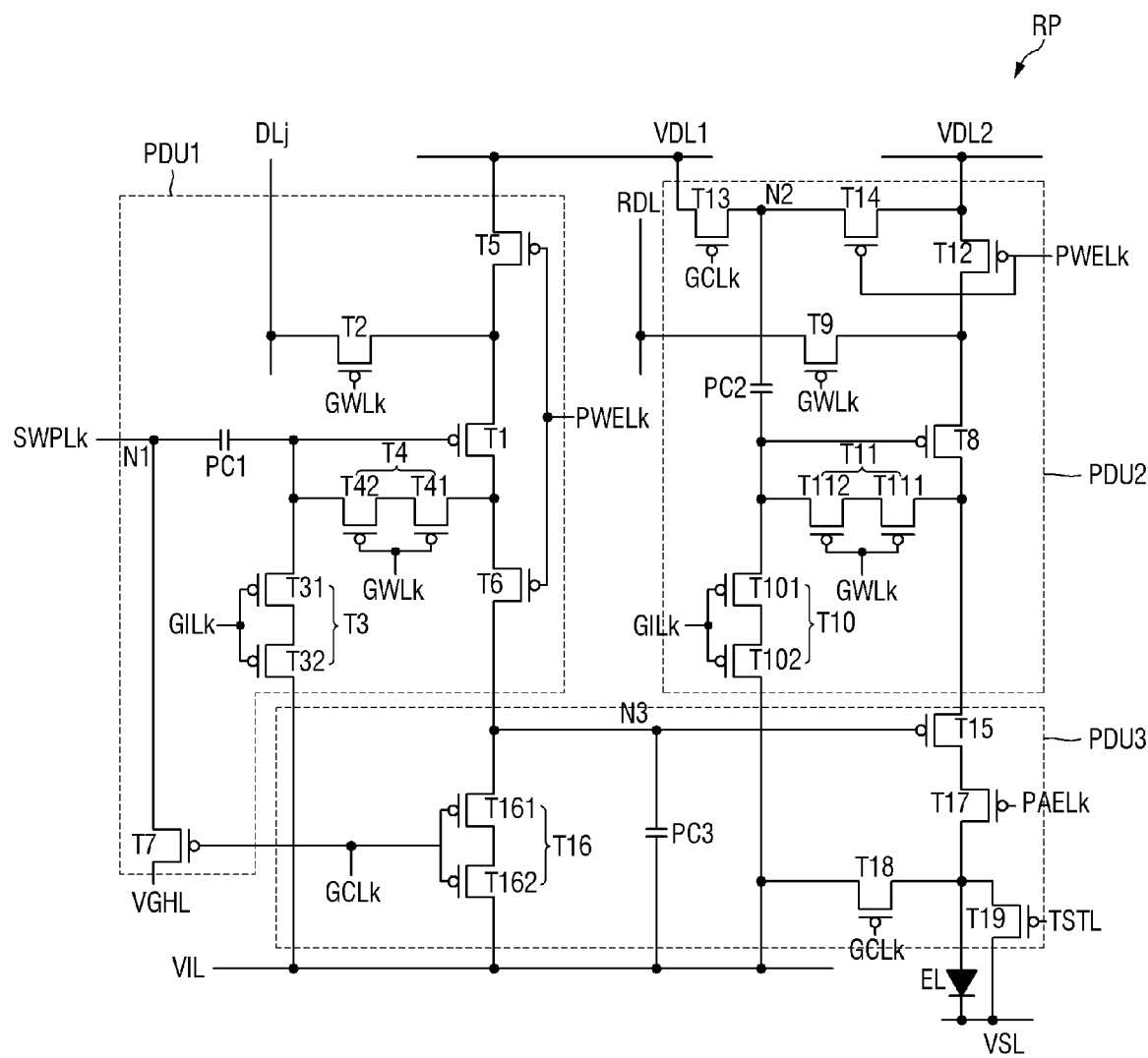
FIG. 6 is a schematic diagram of an equivalent circuit illustrating a first sub-pixel according to an embodiment.

FIG. 6 is a schematic diagram of an equivalent circuit illustrating a first sub-pixel according to an embodiment.

Referring to FIG. 6, the first sub-pixel RP according to an embodiment may be connected to the $k^{th}$ (k being a positive integer) scan write line GWLk, the $k^{th}$ scan initialization line GILk, the $k^{th}$ scan control line GCLk, the $k^{th}$ sweep signal line SWPLk, the $k^{th}$ PWM emission line PWELk, and the $k^{th}$ PAM emission line PAELk. Further, the first sub-pixel RP may be connected to a $j^{th}$ PWM data line DLj and the first PAM data line RDL. Further, the first sub-pixel RP may be connected to a first power line VDL1 to which the first power voltage VDD1 is applied, a second power line VDL2 to which the second power voltage VDD2 is applied, a third power line VSL to which the third power voltage VSS is applied, an initialization voltage line VIL to which the initialization voltage VINT is applied, and a gate-off voltage line VGHL to which the gate-off voltage VGH is applied. For simplicity of description, the $j^{th}$ PWM data line DLj may be referred to as a first data line, and the first PAM data line RDL may be referred to as a second data line.

The first sub-pixel RP may include a light emitting element EL, a first pixel driver PDU1, a second pixel driver PDU2, and a third pixel driver PDU3.

The first pixel driver PDU1, the second pixel driver PDU2, and the third pixel driver PDU3 are connected to each other, and the light emitting element EL emits light in response to a driving current Ids generated by the second pixel driver PDU2.

The light emitting element EL may be disposed between a seventeenth transistor T17 and the third power line VSL. A first electrode of the light emitting element EL may be connected to a second electrode of the seventeenth transistor T17, and a second electrode thereof may be connected to the third power line VSL. The first electrode of the light emitting element EL may be an anode electrode (for example, a pixel electrode) and the second electrode thereof may be a cathode electrode (for example, a common electrode). The light emitting element EL may be an inorganic light emitting element including a first electrode, a second electrode, and an inorganic semiconductor disposed between the first electrode and the second electrode. For example, the light emitting element EL may be a micro light emitting diode formed as an inorganic semiconductor, but is not limited thereto.

The first pixel driver PDU1 generates a control current Ic in response to a $j^{th}$ PWM data voltage of the $j^{th}$ PWM data line DLj to control the voltage of a third node N3 of the third pixel driver PDU3. Since the pulse width of the driving current Ids flowing through the light emitting element EL may be adjusted by the control current Ic of the first pixel driver PDU1, the first pixel driver PDU1 may be a pulse width modulation (PWM) part for performing pulse width modulation of the driving current Ids flowing through the light emitting element EL.

The first pixel driver PDU1 may include first to seventh transistors T1 to T7 and a first capacitor (or first pixel capacitor) PC1.

The first transistor T1 controls the control current Ic flowing between a second electrode and a first electrode in response to the PWM data voltage applied to a gate electrode thereof.

The second transistor T2 is turned on by a $k^{th}$ scan write signal of the $k^{th}$ scan write line GWLk to supply the PWM data voltage of the $j^{th}$ PWM data line DLj to the first electrode of the first transistor T1. A gate electrode of the second transistor T2 may be connected to the $k^{th}$ scan write line GWLk, a first electrode thereof may be connected to the $j^{th}$ PWM data line DLj, and a second electrode thereof may be connected to the first electrode of the first transistor T1.

The third transistor T3 is turned on by a $k^{th}$ scan initialization signal of the $k^{th}$ scan initialization line GILk to connect the initialization voltage line VIL to the gate electrode of the first transistor T1. Accordingly, during the turn-on period of the third transistor T3, the gate electrode of the first transistor T1 may be discharged to the initialization voltage VINT of the initialization voltage line VIL. The gate-on voltage VGL of the $k^{th}$ scan initialization signal may be different from the initialization voltage VINT of the initialization voltage line VIL. In particular, since the difference voltage between the gate-on voltage VGL and the initialization voltage VINT is greater than the threshold voltage of the third transistor T3, the third transistor T3 may be stably turned on even after the initialization voltage VINT is applied to the gate electrode of the first transistor T1. Therefore, in case that the third transistor T3 is turned on, the initialization voltage VINT may be stably applied to the gate electrode of the first transistor T1 regardless of the threshold voltage of the third transistor T3.

The third transistor T3 may include transistors connected in series. For example, the third transistor T3 may include a first sub-transistor T31 and a second sub-transistor T32. Accordingly, it is possible to prevent the voltage of the gate electrode of the first transistor T1 from leaking through the third transistor T3. A gate electrode of the first sub-transistor T31 may be connected to the $k^{th}$ scan initialization line GILk, a first electrode thereof may be connected to the gate electrode of the first transistor T1, and a second electrode thereof may be connected to a first electrode of the second sub-transistor T32. A gate electrode of the second sub-transistor T32 may be connected to the $k^{th}$ scan initialization line GILk, the first electrode thereof may be connected to the second electrode of the first sub-transistor T31, and a second electrode thereof may be connected to the initialization voltage line VIL.

The fourth transistor T4 is turned on by the $k^{th}$ scan write signal of the $k^{th}$ scan write line GWLk to connect the gate electrode and the second electrode of the first transistor T1. Accordingly, during the turn-on period of the fourth transistor T4, the first transistor T1 may operate as a diode.

The fourth transistor T4 may include transistors connected in series. For example, the fourth transistor T4 may include a third sub-transistor T41 and a fourth sub-transistor T42. Accordingly, it is possible to prevent the voltage of the gate electrode of the first transistor T1 from leaking through the fourth transistor T4. A gate electrode of the third sub-transistor T41 may be connected to the $k^{th}$ scan write line GWLk, a first electrode thereof may be connected to the second electrode of the first transistor T1, and a second electrode thereof may be connected to a first electrode of the fourth sub-transistor T42. A gate electrode of the fourth sub-transistor T42 may be connected to the $k^{th}$ scan write line GWLk, the first electrode thereof may be connected to the second electrode of the third sub-transistor T41, and a second electrode thereof may be connected to the gate electrode of the first transistor T1.

The fifth transistor T5 is turned on by the $k^{th}$ PWM emission signal of the $k^{th}$ PWM emission line PWELk to connect the first electrode of the first transistor T1 to the first power line VDL1. A gate electrode of the fifth transistor T5 may be connected to the $k^{th}$ PWM emission line PWELk, a first electrode thereof may be connected to the first power line VDL1, and a second electrode thereof may be connected to the first electrode of the first transistor T1.

The sixth transistor T6 is turned on by the $k^{th}$ PWM emission signal of the $k^{th}$ PWM emission line PWELk to connect the second electrode of the first transistor T1 to the third node N3 of the third pixel driver PDU3. A gate electrode of the sixth transistor T6 may be connected to the $k^{th}$ PWM emission line PWELk, a first electrode thereof may be connected to the second electrode of the first transistor T1, and a second electrode thereof may be connected to the third node N3 of the third pixel driver PDU3.

The seventh transistor T7 is turned on by the $k^{th}$ scan control signal of the $k^{th}$ scan control line GCLk to supply the gate-off voltage VGH of the gate-off voltage line VGHL to a first node N1 connected to the $k^{th}$ sweep signal line SWPLk. Accordingly, it is possible to prevent the change in the voltage of the gate electrode of the first transistor T1 from being reflected in a $k^{th}$ sweep signal of the $k^{th}$ sweep signal line SWPLk by the first capacitor PC1 during the period in which the initialization voltage VINT is applied to the gate electrode of the first transistor T1 and the period in which the PWM data voltage of the $j^{th}$ PWM data line DLj and a threshold voltage Vth1 of the first transistor T1 are programmed. A gate electrode of the seventh transistor T7 may be connected to the $k^{th}$ scan control line GCLk, a first electrode thereof may be connected to the gate-off voltage line VGHL, and a second electrode thereof may be connected to the first node N1.

The first capacitor PC1 may be disposed between the gate electrode of the first transistor T1 and the first node N1. An electrode of the first capacitor PC1 may be connected to the gate electrode of the first transistor T1, and another electrode thereof may be connected to the first node N1.

The first node N1 may be the contact point of the $k^{th}$ sweep signal line SWPLk, the second electrode of the seventh transistor T7, and another electrode of the first capacitor PC1.

The second pixel driver PDU2 generates the driving current Ids applied to the light emitting element EL in response to the first PAM data voltage of the first PAM data line RDL. The second pixel driver PDU2 may be a pulse amplitude modulation (PAM) part for performing pulse amplitude modulation. The second pixel driver PDU2 may be a constant current generator for generating a constant driving current Ids in response to the first PAM data voltage.

Further, the second pixel driver PDU2 of each of the first sub-pixels RP may receive a same first PAM data voltage regardless of the luminance of the first sub-pixel RP to generate a same driving current Ids. Similarly, the second pixel driver PDU2 of each of the second sub-pixels GP may receive a same second PAM data voltage regardless of the luminance of the second sub-pixel GP to generate a same driving current Ids. The third pixel driver PDU3 of each of the third sub-pixels BP may receive a same third PAM data voltage regardless of the luminance of the third sub-pixel BP to generate a same driving current Ids.

The second pixel driver PDU2 may include eighth to fourteenth transistors T8 to T14 and a second capacitor (or second pixel capacitor) PC2.

The eighth transistor T8 controls the driving current Ids flowing to the light emitting element EL in response to the voltage applied to the gate electrode.

The ninth transistor T9 is turned on by the $k^{th}$ scan write signal of the $k^{th}$ scan write line GWLk to supply the first PAM data voltage of the first PAM data line RDL to a first electrode of the eighth transistor T8. A gate electrode of the eighth transistor T8 may be connected to the $k^{th}$ scan write line GWLk, a first electrode thereof may be connected to the first PAM data line RDL, and a second electrode thereof may be connected to the first electrode of the eighth transistor T1.

The tenth transistor T10 is turned on by the $k^{th}$ scan initialization signal of the $k^{th}$ scan initialization line GILk to connect the initialization voltage line VIL to the gate electrode of the eighth transistor T8. Accordingly, during the turn-on period of the tenth transistor T10, the gate electrode of the eighth transistor T8 may be discharged to the initialization voltage VINT of the initialization voltage line VIL. The gate-on voltage VGL of the $k^{th}$ scan initialization signal may be different from the initialization voltage VINT of the initialization voltage line VIL. In particular, since the difference voltage between the gate-on voltage VGL and the initialization voltage VINT is greater than the threshold voltage of the tenth transistor T10, the tenth transistor T10 may be stably turned on even after the initialization voltage VINT is applied to the gate electrode of the eighth transistor T8. Therefore, in case that the tenth transistor T10 is turned on, the initialization voltage VINT may be stably applied to the gate electrode of the eighth transistor T8 regardless of the threshold voltage of the tenth transistor T10.

The tenth transistor T10 may include transistors connected in series. For example, the tenth transistor T10 may include a fifth sub-transistor T101 and a sixth sub-transistor T102. Accordingly, the voltage of the gate electrode of the eighth transistor T8 may be prevented from leaking through the tenth transistor T10. A gate electrode of the fifth sub-transistor T101 may be connected to the $k^{th}$ scan initialization line GILk, a first electrode thereof may be connected to the gate electrode of the eighth transistor T8, and a second electrode thereof may be connected to a first electrode of the sixth sub-transistor T102. A gate electrode of the sixth sub-transistor T102 may be connected to the $k^{th}$ scan initialization line GILk, the first electrode thereof may be connected to the second electrode of the fifth sub-transistor T101, and a second electrode thereof may be connected to the initialization voltage line VIL.

The eleventh transistor T11 is turned on by the $k^{th}$ scan write signal of the $k^{th}$ scan write line GWLk to connect the gate electrode and the second electrode of the eighth transistor T8. Accordingly, during the turn-on period of the eleventh transistor T11, the eighth transistor T8 may operate as a diode.

The eleventh transistor T11 may include transistors connected in series. For example, the eleventh transistor T11 may include a seventh sub-transistor T111 and an eighth sub-transistor T112. Accordingly, it is possible to prevent the voltage of the gate electrode of the eighth transistor T8 from leaking through the eleventh transistor T11. A gate electrode of the seventh sub-transistor T111 may be connected to the $k^{th}$ scan write line GWLk, a first electrode thereof may be connected to the second electrode of the eighth transistor T8, and a second electrode thereof may be connected to a first electrode of the eighth sub-transistor T112. A gate electrode of the eighth sub-transistor T112 may be connected to the $k^{th}$ scan write line GWLk, the first electrode thereof may be connected to the second electrode of the seventh sub-transistor T111, and a second electrode thereof may be connected to the gate electrode of the eighth transistor T8.

The twelfth transistor T12 is turned on by the $k^{th}$ PWM emission signal of the $k^{th}$ PWM emission line PWELk to connect the first electrode of the eighth transistor T8 to the second power line VDL2. A gate electrode of the twelfth transistor T12 may be connected to the $k^{th}$ PWM emission line PWELk, a first electrode thereof may be connected to the first power line VDL1, and a second electrode thereof may be connected to the first electrode of the eighth transistor T8.

The thirteenth transistor T13 is turned on by the $k^{th}$ scan control signal of the $k^{th}$ scan control line GCLk to connect the first power line VDL1 to a second node N2. A gate electrode of the thirteenth transistor T13 may be connected to the $k^{th}$ scan control line GCLk, a first electrode thereof may be connected to the first power line VDL1, and a second electrode thereof may be connected to the second node N2.

The fourteenth transistor T14 is turned on by the $k^{th}$ PWM emission signal of the $k^{th}$ PWM emission line PWELk to connect the second power line VDL2 to the second node N2. Accordingly, in case that the fourteenth transistor T14 is turned on, the second power voltage VDD2 of the second power line VDL2 may be supplied to the second node N2. A gate electrode of the fourteenth transistor T14 may be connected to the $k^{th}$ PWM emission line PWELk, a first electrode thereof may be connected to the second power line VDL2, and a second electrode thereof may be connected to the second node N2.

The second capacitor PC2 may be disposed between the gate electrode of the eighth transistor T8 and the second node N2. An electrode of the second capacitor PC2 may be connected to the gate electrode of the eighth transistor T8, and another electrode thereof may be connected to the second node N2.

The second node N2 may be the contact point of the second electrode of the thirteenth transistor T13, the second electrode of the fourteenth transistor T14, and another electrode of the second capacitor PC2.

The third pixel driver PDU3 adjusts the period in which the driving current Ids is applied to the light emitting element EL in response to the voltage of the third node N3.

The third pixel driver PDU3 may include fifteenth to nineteenth transistors T15 to T19 and a third capacitor (or third pixel capacitor) PC3.

The fifteenth transistor T15 is turned on or turned off depending on the voltage of the third node N3. In case that the fifteenth transistor T15 is turned on, the driving current Ids of the eighth transistor T8 may be supplied to the light emitting element EL, and in case that the fifteenth transistor T15 is turned off, the driving current Ids of the eighth transistor T8 may not be supplied to the light emitting element EL. Therefore, the turn-on period of the fifteenth transistor T15 may be substantially the same as the emission period of the light emitting element EL. A gate electrode of the fifteenth transistor T15 may be connected to the third node N3, a first electrode thereof may be connected to the second electrode of the eighth transistor T8, and a second electrode thereof may be connected to a first electrode of the seventeenth transistor T17.

The sixteenth transistor T16 is turned on by the $k^{th}$ scan control signal of the $k^{th}$ scan control line GCLk to connect the initialization voltage line VIL to the third node N3. Accordingly, during the turn-on period of the sixteenth transistor T16, the third node N3 may be discharged to the initialization voltage of the initialization voltage line VIL.

The sixteenth transistor T16 may include transistors connected in series. For example, the sixteenth transistor T16 may include a ninth sub-transistor T161 and a tenth sub-transistor T162. Accordingly, it is possible to prevent the voltage of the third node N3 from leaking through the sixteenth transistor T16. A gate electrode of the ninth sub-transistor T161 may be connected to the $k^{th}$ scan control line GCLk, a first electrode thereof may be connected to the third node N3, and a second electrode thereof may be connected to a first electrode of the tenth sub-transistor T162. A gate electrode of the tenth sub-transistor T162 may be connected to the $k^{th}$ scan control line GCLk, the first electrode thereof may be connected to the second electrode of the ninth sub-transistor T161, and a second electrode thereof may be connected to the initialization voltage line VIL.

The seventeenth transistor T17 is turned on by the $k^{th}$ PAM emission signal of the $k^{th}$ PAM emission line PAELk to connect the second electrode of the fifteenth transistor T15 to the first electrode of the light emitting element EL. A gate electrode of the seventeenth transistor T17 may be connected to the $k^{th}$ PAM emission line PAELk, the first electrode thereof may be connected to the second electrode of the fifteenth transistor T15, and a second electrode thereof may be connected to the first electrode of the light emitting element EL.

The eighteenth transistor T18 is turned on by the $k^{th}$ scan control signal of the $k^{th}$ scan control line GCLk to connect the initialization voltage line VIL to the first electrode of the light emitting element EL. Accordingly, during the turn-on period of the eighteenth transistor T18, the first electrode of the light emitting element EL may be discharged to the initialization voltage of the initialization voltage line VIL. A gate electrode of the eighteenth transistor T18 may be connected to the $k^{th}$ scan control line GCLk, a first electrode thereof may be connected to the first electrode of the light emitting element EL, and a second electrode thereof may be connected to the initialization voltage line VIL.

The nineteenth transistor T19 is turned on by the test signal of a test signal line TSTL to connect the first electrode of the light emitting element EL to the third power line VSL. A gate electrode of the nineteenth transistor T19 may be connected to the test signal line TSTL, a first electrode thereof may be connected to the first electrode of the light emitting element EL, and a second electrode thereof may be connected to the third power line VSL.

The third capacitor PC3 may be disposed between the third node N3 and the initialization voltage line VIL. An electrode of the third capacitor PC2 may be connected to the third node N3, and another electrode thereof may be connected to the initialization voltage line VIL.

The third node N3 may be the contact point of the second electrode of the sixth transistor T6, the gate electrode of the fifteenth transistor T15, the first electrode of the ninth sub-transistor T161, and the electrode of the third capacitor PC3.

Any one of the first electrode and the second electrode of each of the first to nineteenth transistors T1 to T19 may be a source electrode, and the other may be a drain electrode. The active layer of each of the first to nineteenth transistors T1 to T19 may be formed of any one of polysilicon, amorphous silicon, and an oxide semiconductor. In case that the active layer of each of the first to nineteenth transistors T1 to T19 is polysilicon, it may be formed by a low-temperature polycrystalline silicon (LTPS) process.

Further, although FIG. 6 illustrates that each of the first to nineteenth transistors T1 to T19 is formed as the P-type MOSFET, the embodiment of the specification is not limited thereto. For example, each of the first to nineteenth transistors T1 to T19 may be formed as an N-type MOSFET, or at least part of the first to nineteenth transistors T1 to T19 may be formed as N-type MOSFET.

As another example, in order to improve the black display capability of the light emitting element EL by blocking a leakage current, in the first sub-pixel RP, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as the N-type MOSFETs. The gate electrode of the third sub-transistor T41 and the gate electrode of the fourth sub-transistor T42 of the fourth transistor T4, and the gate electrode of the seventh sub-transistor T111 and the gate electrode of the eighth sub-transistor T112 of the eleventh transistor T11 may be connected to the $k^{th}$ scan write line GWLk. A $k^{th}$ scan initialization signal GIk and the $k^{th}$ scan write line GWLk may have a pulse generated by the gate-off voltage VGH. Further, the active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an oxide semiconductor, and the active layers of the other transistors may be formed of polysilicon.

As another example, any one of the first sub-transistor T31 and the second sub-transistor T32 of the third transistor T3 may be formed as the N-type MOSFET and the other may be formed as the P-type MOSFET. Of the first sub-transistor T31 and the second sub-transistor T32 of the third transistor T3, the transistor formed as the N-type MOSFET may be formed of an oxide semiconductor, and the transistor formed as the P-type MOSFET may be formed of polysilicon.

As another example, any one of the third sub-transistor T41 and the fourth sub-transistor T42 of the fourth transistor T4 may be formed as the N-type MOSFET, and the other may be formed as the P-type MOSFET. Of the third sub-transistor T41 and the fourth sub-transistor T42 of the fourth transistor T4, the transistor formed as the N-type MOSFET may be formed of an oxide semiconductor, and the transistor formed as the P-type MOSFET may be formed of polysilicon.

As another example, any one of the fifth sub-transistor T101 and the sixth sub-transistor T102 of the tenth transistor T10 may be formed as the N-type MOSFET, and the other may be formed as the P-type MOSFET. Of the fifth sub-transistor T101 and the sixth sub-transistor T102 of the tenth transistor T10, the transistor formed as the N-type MOSFET may be formed of an oxide semiconductor, and the transistor formed as the P-type MOSFET may be formed of polysilicon.

As another example, any one of the seventh sub-transistor T111 and the eighth sub-transistor T112 of the eleventh transistor T11 may be formed as the N-type MOSFET, and the other may be formed as the P-type MOSFET. Of the seventh sub-transistor T111 and the eighth sub-transistor T112 of the eleventh transistor T11, the transistor formed as the N-type MOSFET may be formed of an oxide semiconductor, and the transistor formed as the P-type MOSFET may be formed of polysilicon.

The second sub-pixel GP and the third sub-pixel BP according to an embodiment may be substantially the same as the first sub-pixel RP described with reference to FIG. 6. Therefore, the description of the second sub-pixel GP and the third sub-pixel BP according to an embodiment will be omitted.

Figure 7A:
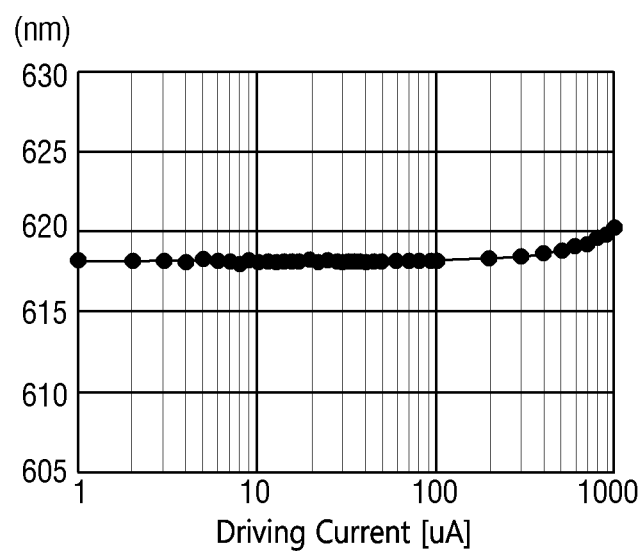
FIGS. 7A-7C show graphs illustrating the wavelength of light emitted from the light emitting element of a first sub-pixel, the wavelength of light emitted from the light emitting element of a second sub-pixel, and the wavelength of light emitted from the light emitting element of a third sub-pixel in response to a driving current according to an embodiment, respectively.
Figure 7B:
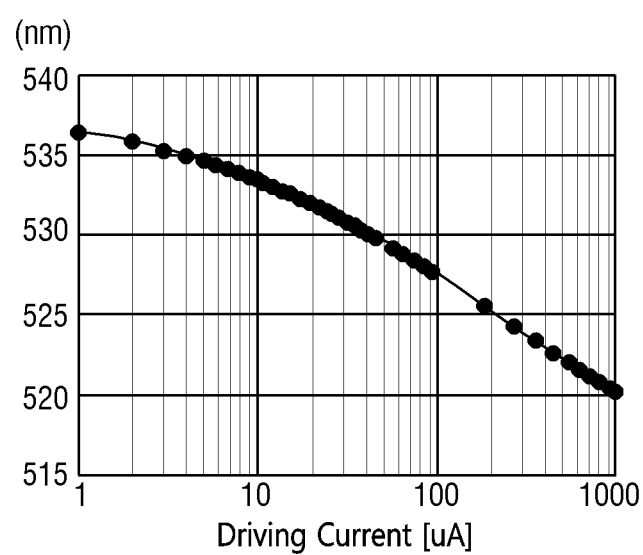
Figure 7C:
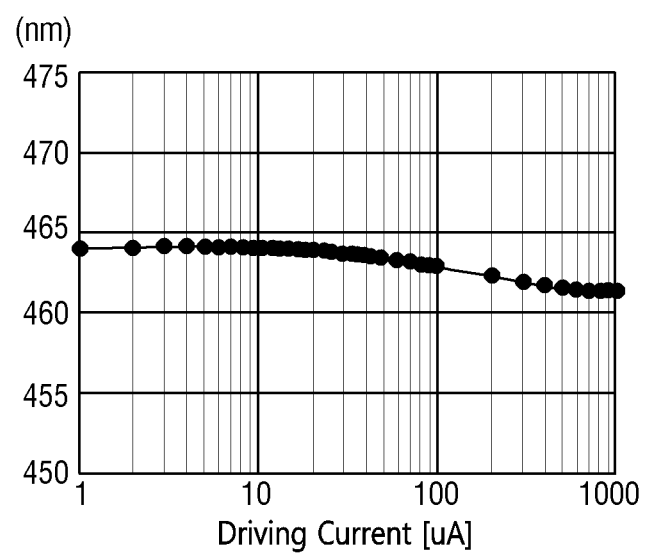

FIGS. 7A-7C show graphs illustrating the wavelength of light emitted from the light emitting element of a first sub-pixel, the wavelength of light emitted from the light emitting element of a second sub-pixel, and the wavelength of light emitted from the light emitting element of a third sub-pixel in response to a driving current according to an embodiment, respectively.

FIG. 7A, shows the wavelength of the light emitted from the light emitting element EL of the first sub-pixel RP in response to the driving current Ids applied to the light emitting element EL of the first sub-pixel RP in case that the light emitting element EL of the first sub-pixel RP includes an inorganic material, e.g., GaN.

FIG. 7B shows the wavelength of the light emitted from the light emitting element EL of the second sub-pixel GP in response to the driving current Ids applied to the light emitting element EL of the second sub-pixel GP in case that the light emitting element EL of the second sub-pixel GP includes an inorganic material, e.g., GaN.

FIG. 7C illustrates the wavelength of the light emitted from the light emitting element EL of the third sub-pixel BP in response to the driving current Ids applied to the light emitting element EL of the third sub-pixel BP in case that the light emitting element EL of the third sub-pixel BP includes an inorganic material, e.g., GaN.

In each of the graphs of FIGS. 7A-7C, the X-axis represents the driving current Ids, and the Y-axis represents the wavelength of the light emitted from the light emitting element.

Referring to FIGS. 7A-7C, in case that the driving current Ids applied to the light emitting element EL of the first sub-pixel RP is about 1 μA to about 300 μA, the wavelength of the light emitted from the light emitting element EL of the first sub-pixel RP is constant at about 618 nm. As the driving current Ids applied to the light emitting element EL of the first sub-pixel RP increases from about 300 μA to about 1000 μA, the wavelength of the light emitted from the light emitting element EL of the first sub-pixel RP increases from about 618 nm to about 620 nm.

As the driving current Ids applied to the light emitting element EL of the second sub-pixel GP increases from about 1 μA to about 1000 μA, the wavelength of the light emitted from the light emitting element EL of the second sub-pixel GP decreases from about 536 nm to about 520 nm.

As the driving current Ids applied to the light emitting element EL of the third sub-pixel BP increases from about 1 μA to about 1000 μA, the wavelength of the light emitted from the light emitting element EL of the third sub-pixel BP decreases from about 464 nm to about 461 nm.

In summary, the wavelength of the light emitted from the light emitting element EL of the first sub-pixel RP and the wavelength of the light emitted from the light emitting element EL of the third sub-pixel BP are hardly changed even in case that the driving current Ids is changed. In contrast, the wavelength of the light emitted from the light emitting element EL of the second sub-pixel GP is in inverse proportion to the driving current Ids. Therefore, in the case of adjusting the driving current Ids applied to the light emitting element EL of the second sub-pixel GP, the wavelength of the light emitted from the light emitting element EL of the second sub-pixel GP may be changed, and the color coordinates of the image displayed by the display panel 100 may be changed.

Figure 8A:
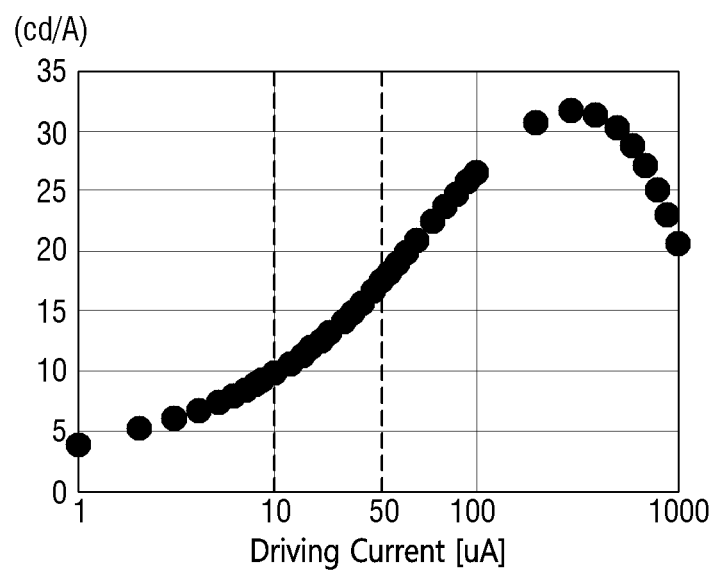
FIGS. 8A-8C show graphs illustrating the luminous efficiency of the light emitting element of a first sub-pixel, the luminous efficiency of the light emitting element of a second sub-pixel, and the luminous efficiency of the light emitting element of a third sub-pixel in response to a driving current according to an embodiment, respectively.
Figure 8B:
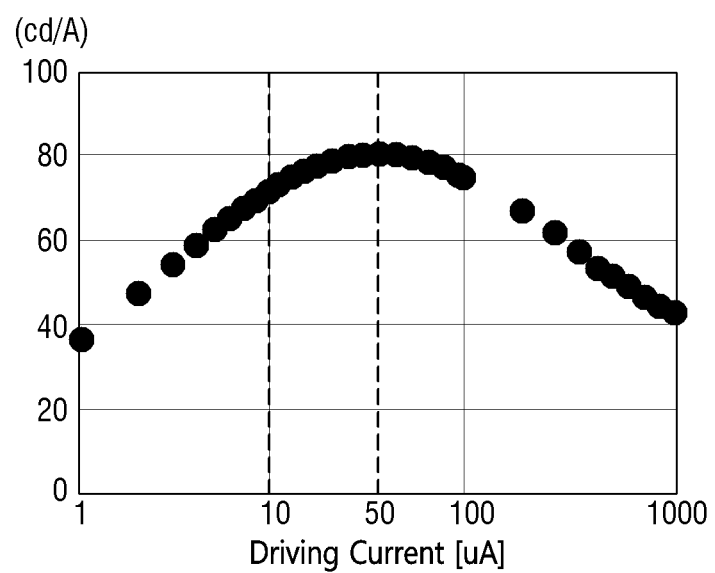
Figure 8C:
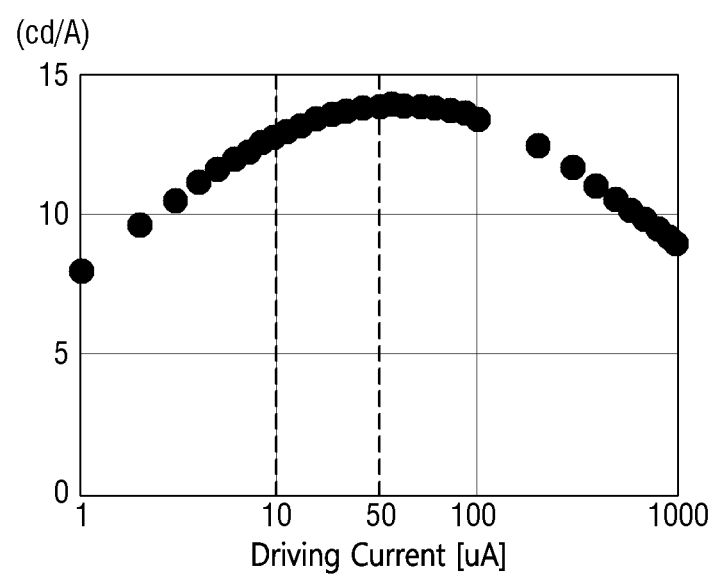

FIGS. 8A-8C shows graphs illustrating the luminous efficiency of the light emitting element of a first sub-pixel, the luminous efficiency of the light emitting element of a second sub-pixel, and the luminous efficiency of the light emitting element of a third sub-pixel in response to a driving current according to an embodiment, respectively.

FIG. 8A shows the luminous efficiency of the light emitting element EL of the first sub-pixel RP in response to the driving current Ids applied to the light emitting element EL of the first sub-pixel RP in case that the light emitting element EL of the first sub-pixel RP is formed of an inorganic material.

FIG. 8B shows the luminous efficiency of the light emitting element EL of the second sub-pixel GP in response to the driving current Ids applied to the light emitting element EL of the second sub-pixel GP in case that the light emitting element EL of the second sub-pixel GP is formed of an inorganic material.

FIG. 8C shows the luminous efficiency of the light emitting element EL of the third sub-pixel BP in response to the driving current Ids applied to the light emitting element EL of the third sub-pixel BP in case that the light emitting element EL of the third sub-pixel BP is formed of an inorganic material.

Referring to FIGS. 8A-8C, in case that the driving current Ids applied to the light emitting element EL of the first sub-pixel RP is about 10 μA, the luminous efficiency of the light emitting element EL of the first sub-pixel RP is about 8.5 cd/A. In case that the driving current Ids applied to the light emitting element EL of the first sub-pixel RP is about 50 μA, the luminous efficiency of the light emitting element EL of the first sub-pixel RP is about 18 cd/A. For example, in case that the driving current Ids applied to the light emitting element EL of the first sub-pixel RP is about 50 μA, the luminous efficiency is increased by about 2.1 times compared to when it is about 10 μA.

In case that the driving current Ids applied to the light emitting element EL of the second sub-pixel GP is about 10 μA, the luminous efficiency of the light emitting element EL of the second sub-pixel GP is about 72 cd/A. In case that the driving current Ids applied to the light emitting element EL of the second sub-pixel GP is about 50 μA, the luminous efficiency of the light emitting element EL of the second sub-pixel GP is about 80 cd/A. For example, in case that the driving current Ids applied to the light emitting element EL of the second sub-pixel GP is about 50 μA, the luminous efficiency is increased by about 1.1 times compared to when it is about 10 μA.

In case that the driving current Ids applied to the light emitting element EL of the third sub-pixel BP is about 10 µA, the luminous efficiency of the light emitting element EL of the third sub-pixel BP is about 14 cd/A. In case that the driving current Ids applied to the light emitting element EL of the third sub-pixel BP is about 50 µA, the luminous efficiency of the light emitting element EL of the third sub-pixel BP is about 13.2 cd/A. For example, in case that the driving current Ids applied to the light emitting element EL of the third sub-pixel BP is about 50 µA, the luminous efficiency is increased by about 1.06 times compared to when it is about 10 µA.

In summary, the luminous efficiency of the light emitting element of the first sub-pixel RP, the luminous efficiency of the light emitting element of the second sub-pixel GP, and the luminous efficiency of the third sub-pixel BP may vary depending on the driving current Ids.

As shown in FIGS. 7A to 8C, in case that the driving current Ids applied to the light emitting element EL of the second sub-pixel GP is adjusted, the color coordinates of the image displayed by the display panel 100 may vary. Further, the luminous efficiency of the light emitting element of the first sub-pixel RP, the luminous efficiency of the light emitting element of the second sub-pixel GP, and the luminous efficiency of the third sub-pixel BP may vary depending on the driving current Ids. Therefore, it is required to maintain the color coordinates of the image displayed by the display panel 100 at constant values, to maintain the driving current Ids in each of the first sub-pixel RP, the second sub-pixel GP, and the third sub-pixel BP at a constant level so that the light emitting element EL of the first sub-pixel RP, the light emitting element EL of the second sub-pixel GP, and the light emitting element EL of the third sub-pixel BP have an optimal luminous efficiency, and to adjust the luminance of each of the first sub-pixel RP, the second sub-pixel GP, and the third sub-pixel BP by adjusting the period in which the driving current Ids is applied.

For example, as shown in FIG. 6, the second pixel driver PDU2 of the first sub-pixel RP generates the driving current Ids so that the light emitting element EL of the first sub-pixel RP is driven with the optimal luminous efficiency in response to the first PAM data voltage of the first PAM data line RDL. The first pixel driver PDU1 of the first sub-pixel RP generates the control current Ic in response to the PWM data voltage of the PWM data line to control the voltage of the third node N3 of the third pixel driver PDU3, and the third pixel driver PDU3 adjusts the period in which the driving current Ids is applied to the light emitting element EL in response to the voltage of the third node N3. Therefore, in the first sub-pixel RP, it is possible to generate a constant driving current Ids so that the light emitting element thereof is driven with the optimal luminous efficiency, and also possible to adjust the luminance of the light emitted from the light emitting element EL by adjusting the duty ratio of the light emitting element EL, for example, the period in which the driving current Ids is applied to the light emitting element EL.

Further, the second pixel driver PDU2 of the second sub-pixel GP generates the driving current Ids so that the light emitting element EL of the second sub-pixel GP is driven with the optimal luminous efficiency in response to the second PAM data voltage of the second PAM data line GDL. The first pixel driver PDU1 of the second sub-pixel GP generates the control current Ic in response to the PWM data voltage of the PWM data line to control the voltage of the third node N3 of the third pixel driver PDU3, and the third pixel driver PDU3 adjusts the period in which the driving current Ids is applied to the light emitting element EL in response to the voltage of the third node N3. Therefore, in the second sub-pixel GP, it is possible to generate a constant driving current Ids so that the light emitting element thereof is driven with the optimal luminous efficiency, and also possible to adjust the luminance of the light emitted from the light emitting element EL by adjusting the duty ratio of the light emitting element EL, for example, the period in which the driving current Ids is applied to the light emitting element EL.

Further, the second pixel driver PDU2 of the third sub-pixel BP generates the driving current Ids so that the light emitting element EL of the third sub-pixel BP is driven with the optimal luminous efficiency in response to the third PWM data voltage of the third PAM data line BDL. The first pixel driver PDU1 of the third sub-pixel BP generates the control current Ic in response to the PWM data voltage of the PWM data line to control the voltage of the third node N3 of the third pixel driver PDU3, and the third pixel driver PDU3 adjusts the period in which the driving current Ids is applied to the light emitting element EL in response to the voltage of the third node N3. Therefore, in the third sub-pixel BP, it is possible to generate a constant driving current Ids so that the light emitting element thereof is driven with the optimal luminous efficiency, and also possible to adjust the luminance of the light emitted from the light emitting element EL by adjusting the duty ratio of the light emitting element EL, for example, the period in which the driving current Ids is applied to the light emitting element EL.

Therefore, it is possible to reduce or prevent deterioration of an image quality due to the change in the wavelength of the emitted light depending on the driving current applied to the light emitting element EL. Further, each of the light emitting element EL of the first sub-pixel RP, the light emitting element EL of the second sub-pixel GP, and the light emitting element EL of the third sub-pixel BP may emit light with the optimal luminous efficiency.

Figure 9:
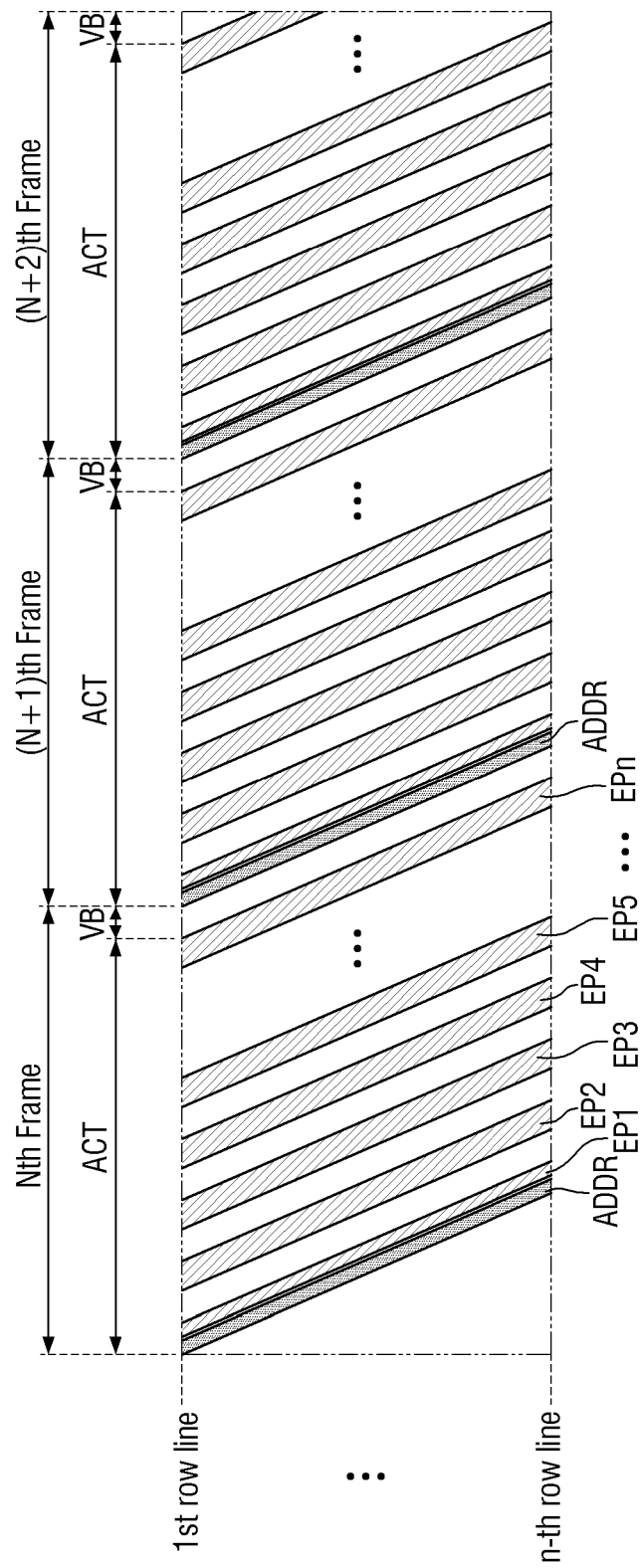
FIG. 9 schematically illustrates an example of the operation of a display device during $N^{th}$ to $(N+2)^{th}$ frame periods.

FIG. 9 illustrates an example of the operation of a display device during $N^{th}$ to $(N+2)^{th}$ frame periods.

Referring to FIG. 9, each of the $N^{th}$ to $(N+2)^{th}$ frame periods may include an active period ACT and a blank period VB. The active period ACT may include an address period ADDR in which the PWM data voltage and first/second/third PWM data voltages are supplied to each of the first to third sub-pixels RP, GP, and BP, and emission periods EP1, EP2, EP3, EP4, EP5, . . . , EPn in which the light emitting element EL of each of the sub-pixels SP emits light. The blank period VB may be the period in which the sub-pixels RP, GP, and BP of the display panel 100 are idle.

The address period ADDR and the first emission period EP1 may be shorter than each of the second to $n^{th}$ emission periods EP2, EP3, EP4, EP5, . . . , EPn. For example, the address period ADDR and the first emission period EP1 may be about 5 horizontal periods, and each of the second to $n^{th}$ emission periods EP2, EP3, EP4, EP5, . . . , EPn may be about 12 horizontal periods, but the embodiment of this specification is not limited thereto. Further, the active period ACT may include 25 emission periods, but the number of emission periods EP1, EP2, EP3, EP4, EP5, . . . , EPn of the active period ACT is not limited thereto.

The PWM data voltage and the first/second/third PWM data voltages may be sequentially inputted to the sub-pixels RP, GP, and BP of the display panel 100 for each row line during the address period ADDR. For example, the PWM data voltage and the first/second/third PWM data voltages may be sequentially inputted to the sub-pixels RP, GP, and BP in the order from the sub-pixels RP, GP, and BP disposed on a first row line to the sub-pixels RP, GP, and BP disposed on an $n^{th}$ row line that is a last row line.

The sub-pixels RP, GP, and BP of the display panel 100 may sequentially emit light for each row line in each of the emission periods EP1, EP2, EP3, EP4, EP5, . . . , EPn. For example, the sub-pixels RP, GP, and BP may sequentially emit light in the order from the sub-pixels RP, GP, and BP disposed on the first row line to the sub-pixels RP, GP, and BP disposed on the last row line.

The address period ADDR may overlap at least one of the emission periods EP1, EP2, EP3, EP4, . . . , EPn. For example, as shown in FIG. 9, the address period ADDR may overlap the first to third emission periods EP1, EP2, and EP3. In case that the sub-pixels RP, GP, and BP disposed on a $p^{th}$ (p being a positive integer) row line receive the PWM data voltage and the first/second/third PWM data voltages, the sub-pixels RP, GP, and BP disposed on a $q^{th}$ (q being a positive integer smaller than p) row line may emit light.

Further, each of the emission periods EP1, EP2, EP3, EP4, . . . , EPn may overlap emission periods adjacent thereto. For example, the second emission period EP2 may overlap the first emission period EP1 and the third emission period EP3. The sub-pixels RP, GP, and BP disposed on the $p^{th}$ row line may emit light in the second emission period EP2, whereas the sub-pixels RP, GP, and BP disposed on the $q^{th}$ row line may emit light in the first emission period EP1.

Figure 10:
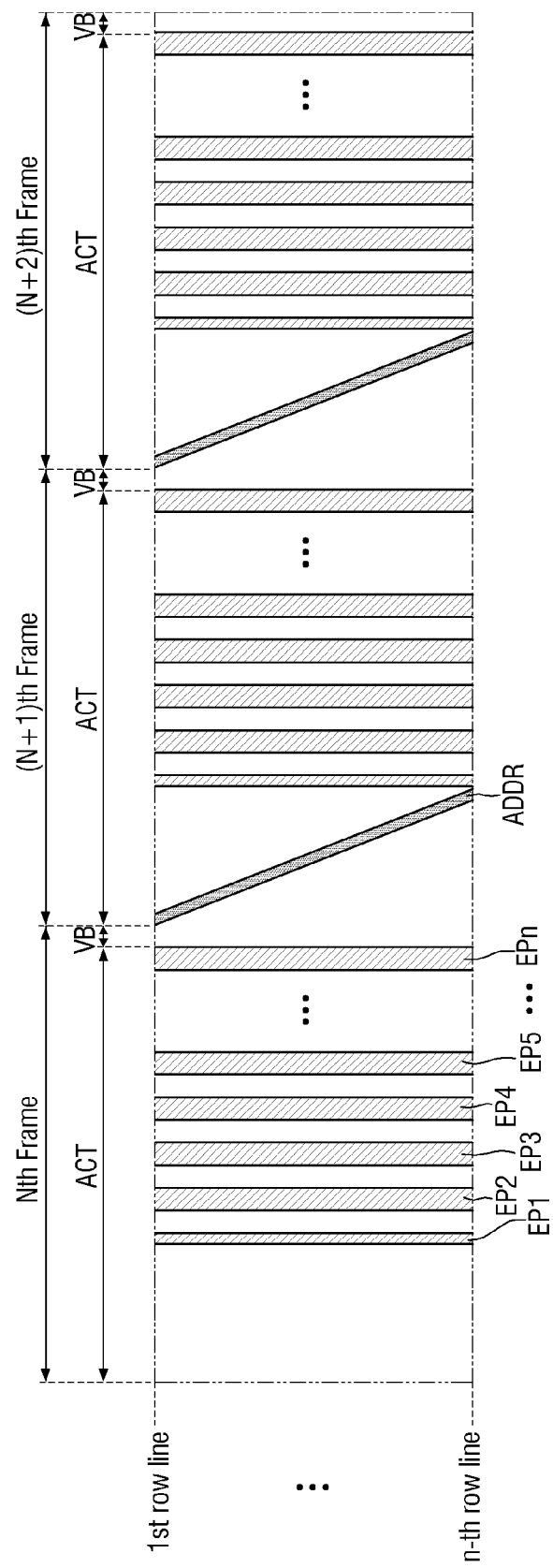
FIG. 10 schematically illustrates another example of the operation of the display device during the $N^{th}$ to $(N+2)^{th}$ frame periods.

FIG. 10 illustrates another example of the operation of the display device during the $N^{th}$ to $(N+2)^{th}$ frame periods.

The embodiment of FIG. 10 is different from the embodiment of FIG. 9 in that the sub-pixels RP, GP, and BP of the display panel 100 simultaneously emit light in each of the emission periods EP1, EP2, EP3, EP4, EP5, . . . , EPn.

Referring to FIG. 10, the address period ADDR may not overlap the emission periods EP1, EP2, EP3, EP4, . . . , EPn. The first emission period EP1 may occur after the address period ADDR is completely ended.

The emission periods EP1, EP2, EP3, EP4, . . . , EPn may not overlap each other. In each of the emission periods EP1, EP2, EP3, EP4, EP5, . . . , EPn, the sub-pixels RP, GP, and BP disposed in all row lines may simultaneously emit light.

Figure 11:
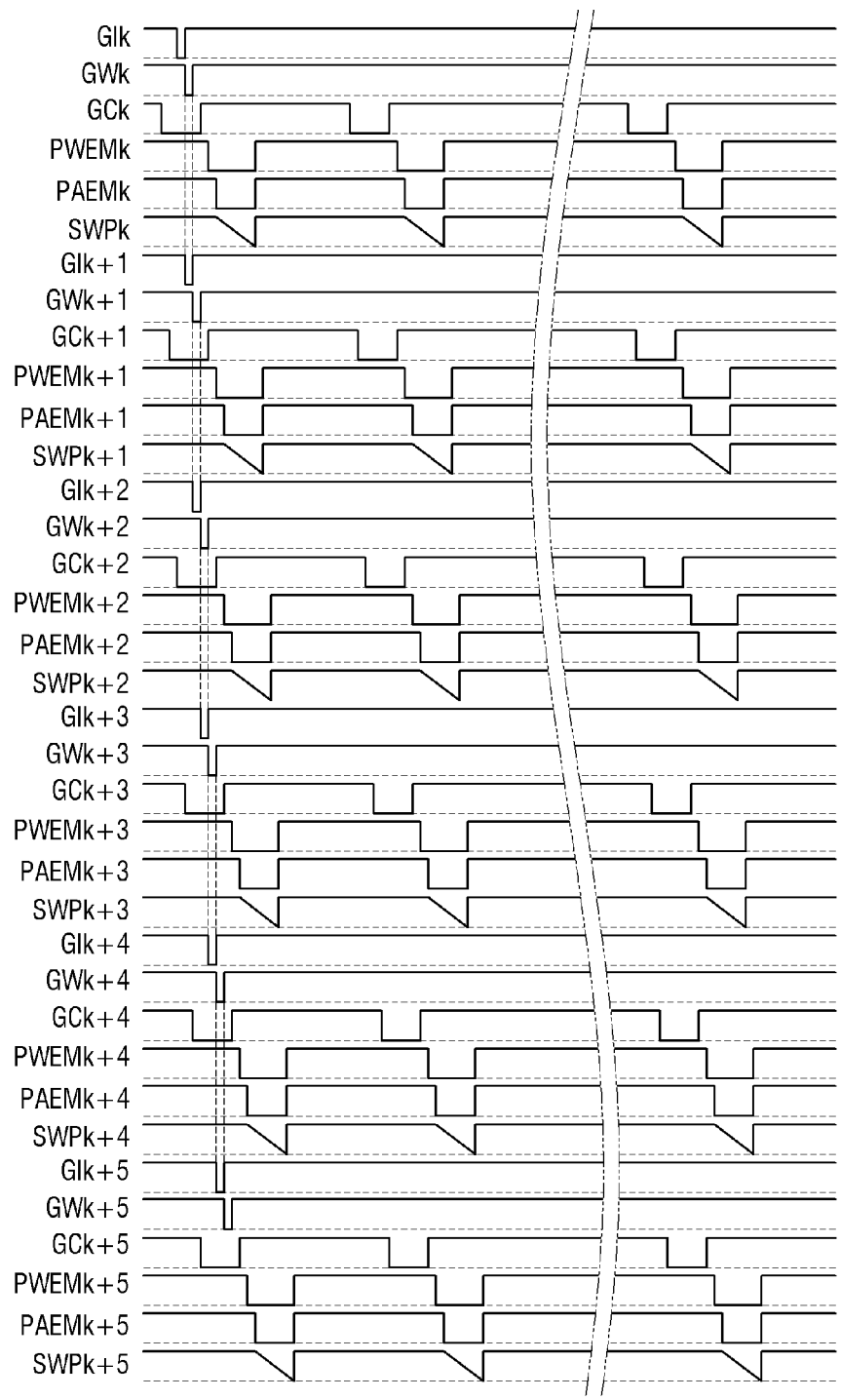
FIG. 11 is a schematic waveform diagram illustrating scan initialization signals, scan write signals, scan control signals, PWM emission signals, PAM emission signals, and sweep signals applied to sub-pixels disposed on $k^{th}$ to $(k+5)^{th}$ row lines in the $N^{th}$ frame period according to an embodiment.

FIG. 11 is a schematic waveform diagram illustrating scan initialization signals, scan write signals, scan control signals, PWM emission signals, PAM emission signals, and sweep signals applied to sub-pixels disposed on $k^{th}$ to $(k+5)^{th}$ row lines in the $N^{th}$ frame period according to an embodiment.

Referring to FIG. 11, the sub-pixels RP, GP, and BP disposed on the $k^{th}$ row line indicate the sub-pixels RP, GP, and BP connected to the $k^{th}$ scan initialization line GILk, the $k^{th}$ scan write line GWLk, the $k^{th}$ scan control line GCLk, the $k^{th}$ PWM emission line PWELk, the $k^{th}$ PAM emission line PAELk, and the $k^{th}$ sweep signal line SWPLk. The $k^{th}$ scan initialization signal GIk indicates the signal applied to the $k^{th}$ scan initialization line GILk, and the $k^{th}$ scan write signal GWk indicates the signal applied to the $k^{th}$ scan write line GWLk. A $k^{th}$ scan control signal GCk indicates the signal applied to the $k^{th}$ scan control line GCLk, and a $k^{th}$ PWM emission signal PWEMk indicates the signal applied to the $k^{th}$ PWM emission line PWELk. A $k^{th}$ PAM emission signal PAEMk indicates the signal applied to the $k^{th}$ PAM emission line PAELk, and a k sweep signal SWPk indicates the signal applied to the $k^{th}$ sweep signal line SWPLk.

Scan initialization signals GIk to GIk+5, scan write signals GWk to GWk+5, scan control signals GCk to GCk+5, PWM emission signals PWEMk to PAEMk+5, PAM emission signals PAEMk to PAEMk+5, and sweep signals SWPk to SWPk+5 may be sequentially shifted by a horizontal period (1H). The $k^{th}$ scan write signal GWk may be the signal obtained by shifting the $k^{th}$ scan initialization signal GIk by a horizontal period, and a $(k+1)^{th}$ scan write signal GWk+1 may be the signal obtained by shifting a $(k+1)^{th}$ scan initialization signal GIk+1 by a horizontal period. Since the $(k+1)^{th}$ scan initialization signal GIk+1 is the signal obtained by shifting the $k^{th}$ scan initialization signal GIk by a horizontal period, the $k^{th}$ scan write signal GWk and the $(k+1)^{th}$ scan initialization signal GIk+1 may be substantially the same.

Figure 12:
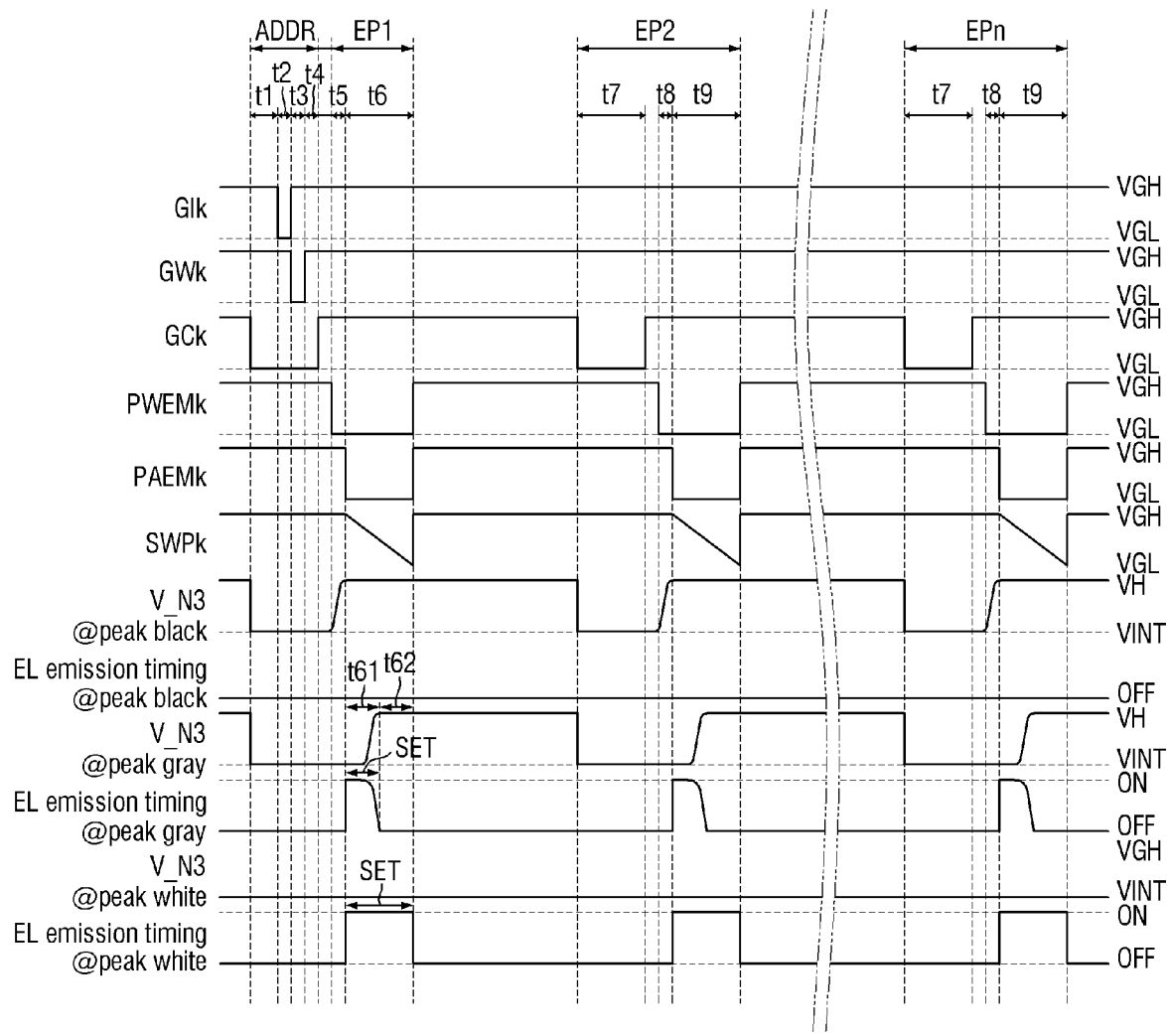
FIG. 12 is a schematic waveform diagram illustrating the $k^{th}$ scan initialization signal, the $k^{th}$ scan write signal, the $k^{th}$ scan control signal, the $k^{th}$ PWM emission signal, the $k^{th}$ PAM emission signal, and the k sweep signal applied to each of sub-pixels disposed in the $k^{th}$ row line, the voltage of the third node, and the period in which a driving current is applied to a light emitting element in the $N^{th}$ frame period according to an embodiment.

FIG. 12 is a schematic waveform diagram illustrating the $k^{th}$ scan initialization signal, the $k^{th}$ scan write signal, the $k^{th}$ scan control signal, the $k^{th}$ PWM emission signal, the $k^{th}$ PAM emission signal, and the k sweep signal applied to each of sub-pixels disposed in the $k^{th}$ row line, the voltage of the third node V_N3, and the period in which a driving current is applied to a light emitting element, in the $N^{th}$ frame period, according to an embodiment.

Referring to FIG. 12, the $k^{th}$ scan initialization signal GIk is the signal for controlling turn-on and turn-off of the third transistor T3 and the tenth transistor T10 of each of the sub-pixels RP, GP, and BP. The $k^{th}$ scan write signal GWk is the signal for controlling turn-on and turn-off of the second, fourth, ninth, and eleventh transistors T2, T4, T9, and T11 of each of the sub-pixels RP, GP, and BP. The $k^{th}$ scan control signal GCk is the signal for controlling turn-on and turn-off of the seventh, thirteenth, sixteenth, and eighteenth transistors T7, T13, T16, and T18 of each of the sub-pixels RP, GP, and BP. The $k^{th}$ PWM emission signal PWEMk is the signal for controlling turn-on and turn-off of the fifth, sixth, twelfth, and fourteenth transistors T5, T6, T12, and T14. The $k^{th}$ PAM emission signal PAEMk is the signal for controlling turn-on and turn-off of the seventeenth transistor T17. The $k^{th}$ scan initialization signal, the $k^{th}$ scan write signal, the $k^{th}$ scan control signal, the $k^{th}$ PWM emission signal, the $k^{th}$ PAM emission signal, and the $k^{th}$ sweep signal may be generated at a cycle of a frame period.

The address period ADDR includes first to fourth periods t1 to t4. The first period t1 and the fourth period t4 are a first initialization period for initializing the first electrode of the light emitting element EL and the voltage of the third node N3. The second period t2 is a second initialization period for initializing the gate electrode of the first transistor T1 and the gate electrode of the eighth transistor T8. The third period t3 is a period for sampling a PWM data voltage Vdata of the $j^{th}$ PWM data line DLj and the threshold voltage Vth1 of the first transistor T1 at the gate electrode of the first transistor T1 and sampling a first PAM data voltage Rdata of the first PAM data line RDL and a threshold voltage Vth8 of the eighth transistor T8 at the gate electrode of the eighth transistor T8.

The first emission period EP1 includes a fifth period t5 and a sixth period t6. The first emission period EP1 is a period for controlling the turn-on period of the fifteenth transistor T15 depending on the control current Ic and supplying the driving current Ids to the light emitting element EL.

Each of the second to $n^{th}$ emission periods EP2 to EPn includes seventh to ninth periods t7 to t9. The seventh period t7 is a third initialization period for initializing the third node N3, the eighth period t8 is substantially the same as the fifth period t5, and the ninth period t9 is substantially the same as the sixth period t6.

Among the first to $n^{th}$ emission periods EP1 to EPn, emission periods adjacent to each other may be spaced apart from each other by about several to several tens of horizontal periods.

The k$^{th}$ scan initialization signal GIk may have the gate-on voltage VGL during the second period t2, and may have the gate-off voltage VGH during the remaining periods. For example, the k$^{th}$ scan initialization signal GIk may have a scan initialization pulse generated by the gate-on voltage VGL during the second period t2. The gate-off voltage VGH may be the voltage having a level higher than that of the gate-on voltage VGL.

The k$^{th}$ scan write signal GWk may have the gate-on voltage VGL during the third period t3, and may have the gate-off voltage VGH during the remaining periods. For example, the k$^{th}$ scan write signal GWk may have a scan write pulse generated by the gate-on voltage VGL during the third period t3.

The k$^{th}$ scan control signal GCk may have the gate-on voltage VGL during the first to fourth periods t1 to t4 and the seventh period t7, and may have the gate-off voltage VGH during the remaining periods. For example, the k$^{th}$ scan control signal GCk may have a scan control pulse generated by the gate-on voltage VGL during the first to fourth periods t1 to t4 and the seventh period t7.

The k$^{th}$ sweep signal SWPk may have a triangular wave sweep pulse during the sixth period t6 and the ninth period t9, and may have the gate-off voltage VGH during the remaining periods. For example, the sweep pulse of the k$^{th}$ sweep signal SWPk may have a triangular wave pulse that linearly decreases from the gate-off voltage VGH to the gate-on voltage VGL in each of the sixth period t6 and the ninth period t9, and immediately increases from the gate-on voltage VGL to the gate-off voltage VGH at the end of the sixth period t6 and at the end of the ninth period t9.

The k$^{th}$ PWM emission signal PWEMk may have the gate-on voltage VGL during the fifth and sixth periods t5 and t6 and the eighth and ninth periods t8 and t9, and may have the gate-off voltage VGH during the remaining periods. For example, the k$^{th}$ PWM emission signal PWEMk may include PWM pulses generated by the gate-on voltage VGL during the fifth and sixth periods t5 and t6 and the eighth and ninth periods t8 and t9.

The k$^{th}$ PAM emission signal PAEMk may have the gate-on voltage VGL during the sixth period t6 and the ninth period t9, and may have the gate-off voltage VGH during the remaining periods. For example, the k$^{th}$ PAM emission signal PAEMk may include PAM pulses generated by the gate-on voltage VGL during the sixth period t6 and the ninth period t9. The PWM pulse width of the k$^{th}$ PWM emission signal PWEMk may be greater than the sweep pulse width of the k$^{th}$ sweep signal SWPk.

Figure 13:
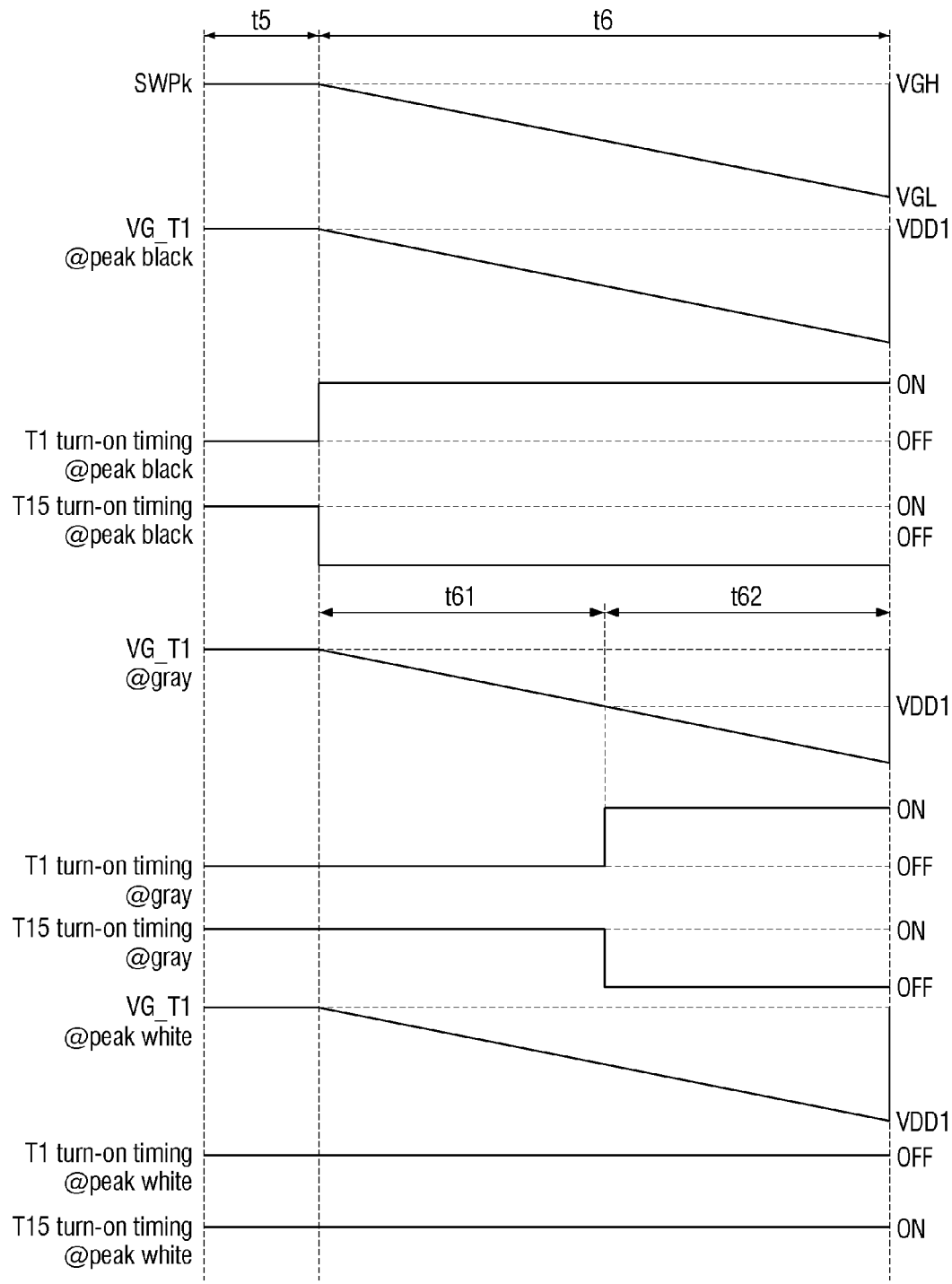
FIG. 13 is a schematic timing diagram illustrating the $k^{th}$ sweep signal, the voltage of the gate electrode of the first transistor, the turn-on timing of the first transistor, and the turn-on timing of the fifteenth transistor during the fifth period and the sixth period according to an embodiment.

FIG. 13 is a schematic timing diagram illustrating the k$^{th}$ sweep signal, the voltage of the gate electrode of the first transistor, the turn-on timing of the first transistor, and the turn-on timing of the fifteenth transistor during the fifth period and the sixth period according to an embodiment. FIGS. 14 to 17 are schematic diagrams of equivalent circuits illustrating the operation of the first sub-pixel during the first period, the second period, the third period, and the sixth period of FIG. 12.

Hereinafter, the operation of the first sub-pixel RP according to an embodiment during the first to ninth periods t1 to t9 will be described in detail with reference to FIGS. 13 to 17.

Figure 14:
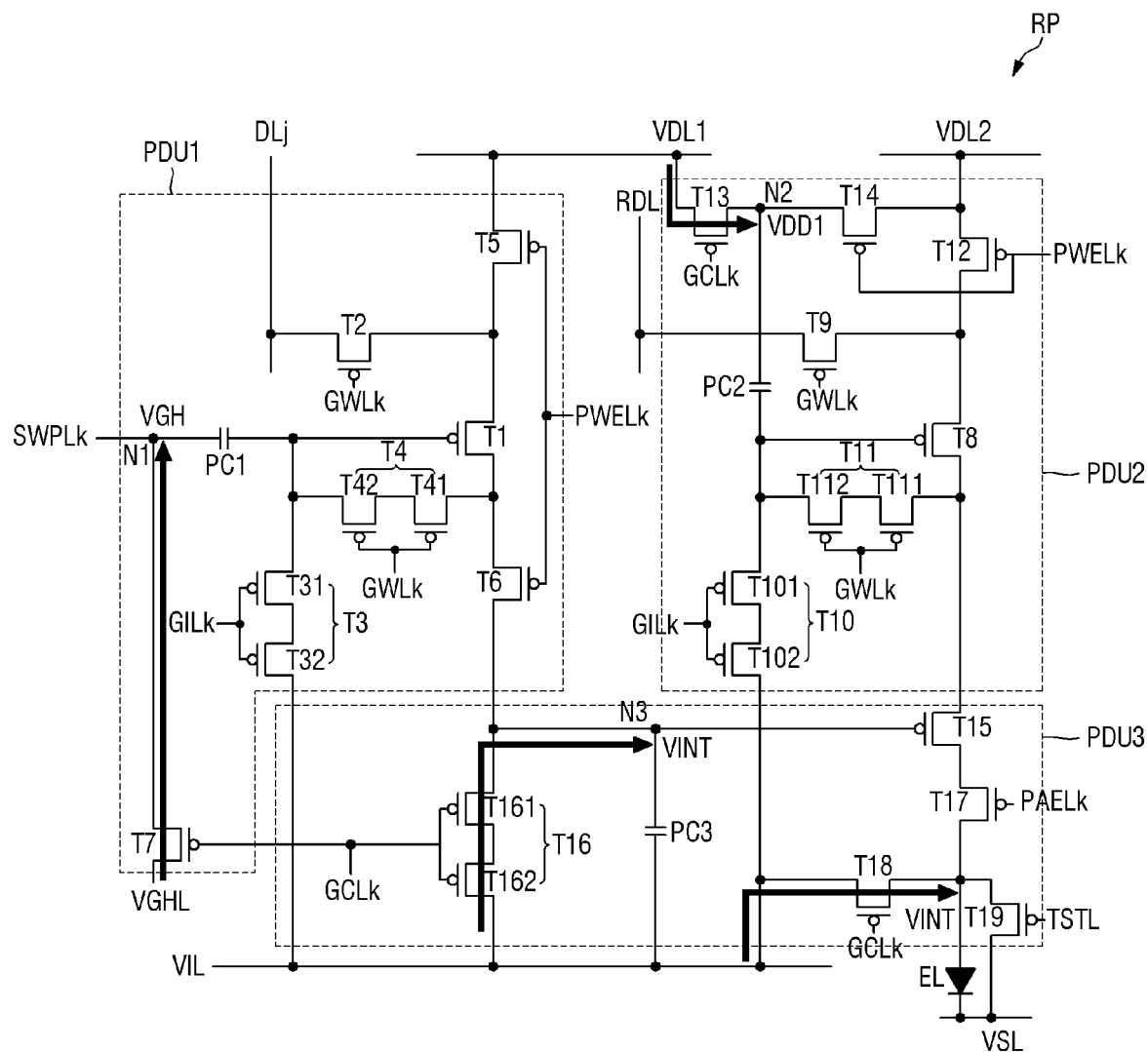
FIGS. 14 to 17 are schematic diagrams of an equivalent circuits of a sub-pixel illustrating the operation of the first sub-pixel during the first period, the second period, the third period, and the sixth period of FIG. 12.

First, as shown in FIG. 14, during the first period t1, the seventh transistor T7, the thirteenth transistor T13, the sixteenth transistor T16, and the eighteenth transistor T18 are turned on by the k$^{th}$ scan control signal GCk of the gate-on voltage VGL.

Due to the turn-on of the seventh transistor T7, the gate-off voltage VGH of the gate-off voltage line VGHL is applied to the first node N1. Due to the turn-on of the thirteenth transistor T13, the first power voltage VDD1 of the first power line VDL1 is applied to the second node N2.

Due to the turn-on of the sixteenth transistor T16, the third node N3 is initialized to the initialization voltage VINT of the initialization voltage line VIL, and the fifteenth transistor T15 is turned on by the initialization voltage VINT of the third node N3. Due to the turn-on of the eighteenth transistor T18, the first electrode of the light emitting element EL is initialized to the initialization voltage VINT of the initialization voltage line VIL.

Figure 15:
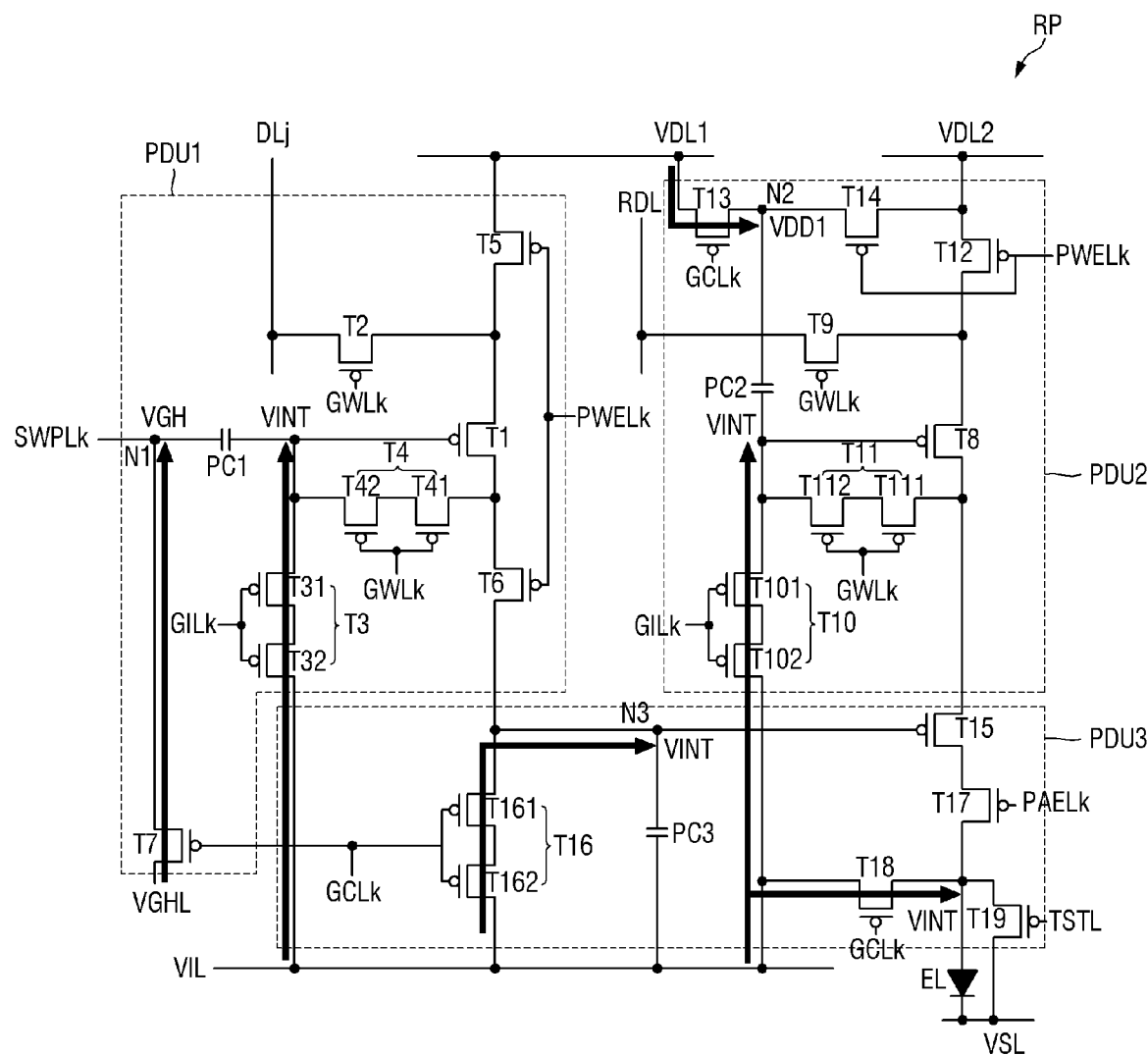

Second, as shown in FIG. 15, during the second period t2, the seventh transistor T7, the thirteenth transistor T13, the sixteenth transistor T16, and the eighteenth transistor T18 are turned on by the k$^{th}$ scan control signal GCk of the gate-on voltage VGL. Further, during the second period t2, the third transistor T3 and the tenth transistor T10 are turned on by the k$^{th}$ scan initialization signal GIk of the gate-on voltage VGL.

The seventh transistor T7, the thirteenth transistor T13, the fifteenth transistor T15, the sixteenth transistor T16, and the eighteenth transistor T18 are substantially the same as those described in the first period t1.

Due to the turn-on of the third transistor T3, the gate electrode of the first transistor T1 is initialized to the initialization voltage VINT of the initialization voltage line VIL. Further, due to the turn-on of the tenth transistor T10, the gate electrode of the eighth transistor T8 is initialized to the initialization voltage VINT of the initialization voltage line VIL.

Since the gate-off voltage VGH of the gate-off voltage line VGHL is applied to the first node N1, it is possible to prevent variation in the gate-off voltage VGH of the k$^{th}$ sweep signal SWPk due to the reflection of voltage variation of the gate electrode of the first transistor T1 in the k$^{th}$ sweep signal line SWPLk by a first pixel capacitor PC1.

Figure 16:
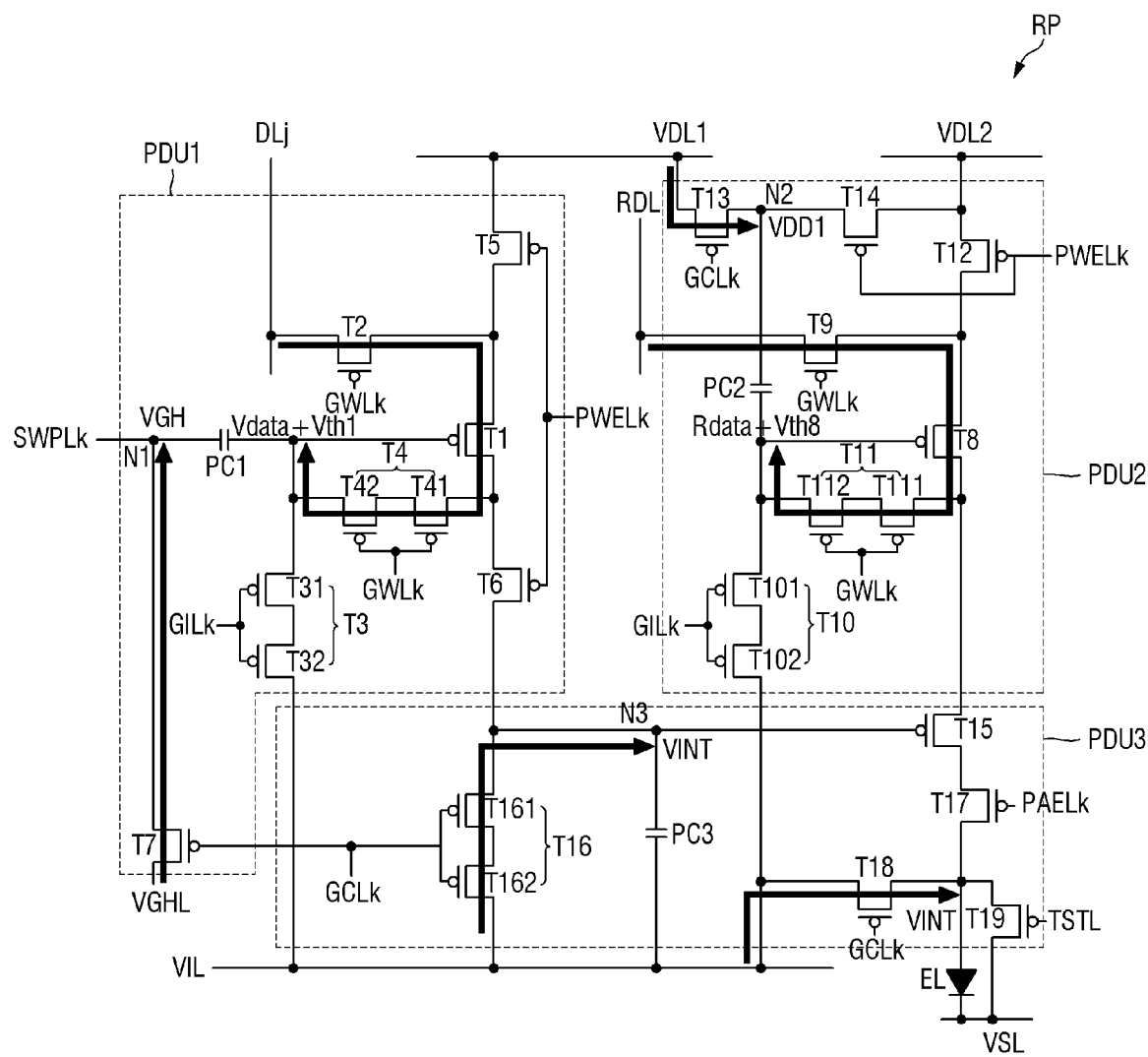

Third, as shown in FIG. 16, during the third period t3, the seventh transistor T7, the thirteenth transistor T13, the sixteenth transistor T16, and the eighteenth transistor T18 are turned-on by the k$^{th}$ scan control signal GCk of the gate-on voltage VGL. Further, during the third period t3, the second transistor T2, the fourth transistor T4, the ninth transistor T9, and the eleventh transistor T11 are turned on by the k$^{th}$ scan write signal GWk of the gate-on voltage VGL.

The seventh transistor T7, the thirteenth transistor T13, the fifteenth transistor T15, the sixteenth transistor T16, and the eighteenth transistor T18 may be substantially the same as those described in the first period t1.

Due to the turn-on of the second transistor T2, the PWM data voltage Vdata of the j$^{th}$ PWM data line DLj is applied to the first electrode of the first transistor T1. Due to the turn-on of the fourth transistor T4, the gate electrode and the second electrode of the first transistor T1 are connected to each other, so that the first transistor T1 operates as a diode.

Since the voltage (Vgs=Vint−Vdata) between the gate electrode and the first electrode of the first transistor T1 is greater than the threshold voltage Vth1, the first transistor T1 is turned on to form a current path until the voltage Vgs between the gate electrode and the first electrode reaches the threshold voltage Vth1. Accordingly, the voltage of the gate electrode of the first transistor T1 may increase from "Vint" to "Vdata+Vth1." Since the first transistor T1 is formed as the P-type MOSFET, the threshold voltage Vth1 of the first transistor T1 may be less than 0 V.

Further, since the gate-off voltage VGH of the gate-off voltage line VGHL is applied to the first node N1, it is possible to prevent variation in the gate-off voltage VGH of the k$^{th}$ sweep signal SWPk due to the reflection of the voltage variation of the gate electrode of the first transistor T1 in the k$^{th}$ sweep signal line SWPLk by the first pixel capacitor PC1.

Due to the turn-on of the ninth transistor T9, a first PAM data voltage Rdata of the first PAM data line RDL is applied to the first electrode of the eighth transistor T8. Due to the turn-on of the ninth transistor T9, the gate electrode and the second electrode of the eighth transistor T8 are connected to each other, so that the eighth transistor T8 operates as a diode.

Since the voltage (Vgs=Vint-Rdata) between the gate electrode and the first electrode of the eighth transistor T8 is greater than the threshold voltage Vth8, the eighth transistor T8 forms a current path until the voltage Vgs between the gate electrode and the first electrode reaches the threshold voltage Vth8. Accordingly, the voltage of the gate electrode of the eighth transistor T8 may increase from "Vint" to "Rdata+Vth8."

Fourth, during the fourth period t4, the seventh transistor T7, the thirteenth transistor T13, the sixteenth transistor T16, and the eighteenth transistor T18 are turned on by the k$^{th}$ scan control signal GCk of the gate-on voltage VGL.

The seventh transistor T7, the thirteenth transistor T13, the sixteenth transistor T16, and the eighteenth transistor T18 are substantially the same as those described in the first period t1.

Figure 17:
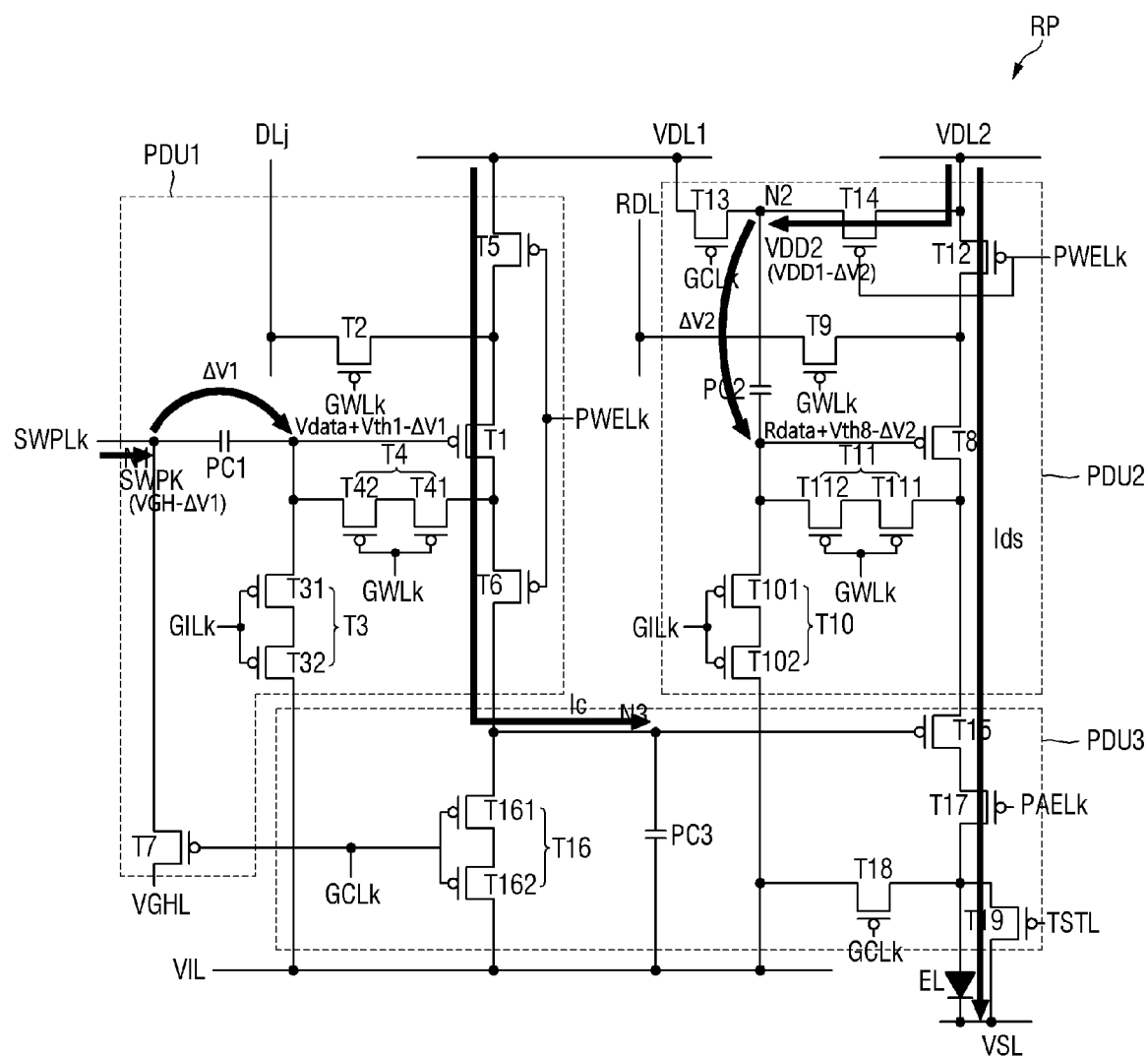

Fifth, as shown in FIG. 17, during the fifth period t5, the fifth transistor T5, the sixth transistor T6, the twelfth transistor T12, and the fourteenth transistor T14 are turned on by the k$^{th}$ PWM emission signal PWEMk of the gate-on voltage VGL.

Due to the turn-on of the fifth transistor T5, the first power voltage VDD1 is applied to the first electrode of the first transistor T1. Further, due to the turn-on of the sixth transistor T6, the second electrode of the first transistor T1 is connected to the third node N3.

During the fifth period t5, the control current Ic flowing in response to the voltage (Vdata+Vth1) of the gate electrode of the first transistor T1 may not depend on the threshold voltage Vth1 of the first transistor T1 as shown in Equation 1.

$$Ids = k'' \times (Vgs-Vth1)^2 = k'' \times (Vdata+Vth1-VDD1-Vth1)^2 = k'' \times (Vdata-VDD1)^2 \quad \text{[Equation 1]}$$

In Equation 1, k" indicates the proportional coefficient determined by the structure and physical characteristics of the first transistor T1, Vth1 indicates the threshold voltage of the first transistor T1, VDD1 indicates the first power voltage, and Vdata indicates the PWM data voltage.

Further, due to the turn-on of the twelfth transistor T12, the first electrode of the eighth transistor T8 may be connected to the second power line VDL2.

Further, due to the turn-on of the fourteenth transistor T14, the second power voltage VDD2 of the second power line VDL2 is applied to the second node N2. In case that the second power voltage VDD2 of the second power supply line VDL2 varies due to a voltage drop or the like, a voltage difference ΔV2 between the first power voltage VDD1 and the second power voltage VDD2 may be reflected in the gate electrode of the eighth transistor T8 by a second pixel capacitor PC2.

Due to the turn-on of the fourteenth transistor T14, the driving current Ids flowing in response to the voltage (Rdata+Vth8) of the gate electrode of the eighth transistor T8 may be supplied to the fifteenth transistor T15. The driving current Ids may not depend on the threshold voltage Vth8 of the eighth transistor T8 as shown in Equation 2.

$$Ids = k' \times (Vgs-Vth8)^2 = k' \times (Rdata+Vth8-\Delta V2-VDD2-Vth8)^2 = k' \times (Rdata-\Delta V2-VDD2)^2 \quad \text{[Equation 2]}$$

In Equation 2, k' indicates the proportional coefficient determined by the structure and physical characteristics of the eighth transistor T8, Vth8 indicates the threshold voltage of the eighth transistor T8, VDD2 indicates the second power voltage, and Rdata indicates the first PAM data voltage.

Sixth, as shown in FIG. 17, during the sixth period t6, the fifth transistor T5, the sixth transistor T6, the twelfth transistor T12, and the fourteenth transistor T14 are turned on by the k$^{th}$ PWM emission signal PWEMk of the gate-on voltage VGL.

During the sixth period t6, the seventeenth transistor T17 is turned on by the k$^{th}$ PAM emission signal PAEMk of the gate-on voltage VGL. During the sixth period t6, the k$^{th}$ sweep signal SWPk linearly decreases from the gate-off voltage VGH to the gate-on voltage VGL.

The fifth transistor T5, the sixth transistor T6, the twelfth transistor T12, and the fourteenth transistor T14 are substantially the same as those described in the fifth period t5.

Due to the turn-on of the seventeenth transistor T17, the first electrode of the light emitting element EL may be connected to the second electrode of the fifteenth transistor T15.

During the sixth period t6, the k$^{th}$ sweep signal SWPk linearly decreases from the gate-off voltage VGH to the gate-on voltage VGL, and voltage variation ΔV1 of the k$^{th}$ sweep signal SWPk is reflected in the gate electrode of the first transistor T1 by the first pixel capacitor PC1, so that the voltage of the gate electrode of the first transistor T1 may be Vdata+Vth1−ΔV1. For example, as the voltage of the k$^{th}$ sweep signal SWPk decreases during the sixth period t6, the voltage of the gate electrode of the first transistor T1 may linearly decrease.

The period in which the control current Ic is applied to the third node N3 may vary depending on the magnitude of the PWM data voltage Vdata applied to the first transistor T1. Since the voltage of the third node N3 varies depending on the magnitude of the PWM data voltage Vdata applied to the first transistor T1, the turn-on period of the fifteenth transistor T15 may be controlled. Therefore, it is possible to control a period SEP in which the driving current Ids is applied to the light emitting element EL during the sixth period t6 by controlling the turn-on period of the fifteenth transistor T15.

Further, as shown in FIG. 13, in case that the PWM data voltage Vdata of the gate electrode of the first transistor T1 is the PWM data voltage of a gray level, the voltage VG_T1 of the gate electrode of the first transistor T1 may have a level higher than that of the first power voltage during a first sub-period t61 due to the decrease in the voltage of the k$^{th}$ sweep signal SWPk, and may have a level lower than that of the first power voltage during a second sub-period t62. Therefore, the first transistor T1 may be turned on during the second sub-period t62 of the sixth period t6. Since the control current Ic of the first transistor T1 flows to the third node N3 during the second sub-period t62, the voltage of the third node N3 may have a high level VH during the second sub-period t62. Therefore, the fifteenth transistor T15 may be turned off during the second sub-period t62. Hence, the driving current Ids is applied to the light emitting element EL during the first sub-period t61 and is not applied to the light emitting element EL during the second sub-period t62. For example, the light emitting element EL may emit light during the first sub-period t61 that is part of the sixth period t6. As the first sub-pixel RP expresses a gray level close to a peak black gray level, the emission period SET of the light emitting element EL may be shortened. Further, as the first sub-pixel RP expresses a gray level close to a peak white gray level, the emission period SET of the light emitting element EL may be increased.

Further, as shown in FIG. 13, in case that the PWM data voltage Vdata of the gate electrode of the first transistor T1 is the PWM data voltage of the peak white gray level, the voltage VG_T of the gate electrode of the first transistor T1 may be higher than the first power voltage VDD1 during the sixth period t6 despite the decrease in the voltage of the $k^{th}$ sweep signal SWPk. Accordingly, the first transistor T1 may be turned off throughout the sixth period t6. Since the control current Ic of the first transistor T1 does not flow to the third node N3 throughout the sixth period t6, the voltage of the third node N3 may be maintained at the initialization voltage VINT. Therefore, the fifteenth transistor T15 may be turned on throughout the sixth period t6. Therefore, the driving current Ids may be applied to the light emitting element EL throughout the sixth period t6, and the light emitting element EL may emit light throughout the sixth period t6.

Further, as the $k^{th}$ sweep signal SWPk rises from the gate-on voltage VGL to the gate-off voltage VGH at the end of the sixth period t6, the voltage VG_T1 of the gate electrode of the first transistor T1 may increase to a level that is substantially the same as that in the fifth period t5 at the end of the sixth period t6.

As described above, the emission period of the light emitting element EL may be adjusted by adjusting the PWM data voltage applied to the gate electrode of the first transistor T1. Therefore, the gray level to be expressed by the first sub-pixel RP may be adjusted by adjusting the period in which the driving current Ids is applied to the light emitting element EL while maintaining the driving current Ids applied to the light emitting element EL at a constant level rather than by adjusting the magnitude of the driving current Ids applied to the light emitting element EL.

In case that the digital video data converted to the PWM data voltages is about 8 bits, the digital video data of the peak black gray level may be about 0, and the digital video data of the peak white gray level may be about 255. Further, the digital video data of a black gray level region may be about 0 to about 63, the digital video data of a gray level region may be about 64 to about 191, and the digital video data of a white gray level region may be about 192 to about 255.

Further, the seventh period t7, the eighth period t8, and the ninth period t9 of each of the second to $n^{th}$ emission periods EP2 to EPn are substantially the same as the first period t1, the fifth period t5, and the sixth period t6 that are described above, respectively. For example, in each of the second to $n^{th}$ emission periods EP2 to EPn, after the third node N3 is initialized, the period in which the driving current Ids generated in response to the first PAM data voltage Rdata written in the gate electrode of the eighth transistor T8 is applied to the light emitting element EL may be adjusted based on the PWM data voltage Vdata written in the gate electrode of the first transistor T1 during the address period ADDR.

Further, since the test signal of the test signal line TSTL is applied at the gate-off voltage VGH during the active period ACT of the $N^{th}$ frame period, the nineteenth transistor T19 may be turned off during the active period ACT of the $N^{th}$ frame period.

Since the second sub-pixel GP and the third sub-pixel BP may operate substantially in the same manner as the first sub-pixel RP as described with reference to FIGS. 9 to 17, the description of the operations of the second sub-pixel GP and the third sub-pixel BP will be omitted.

Figure 18:
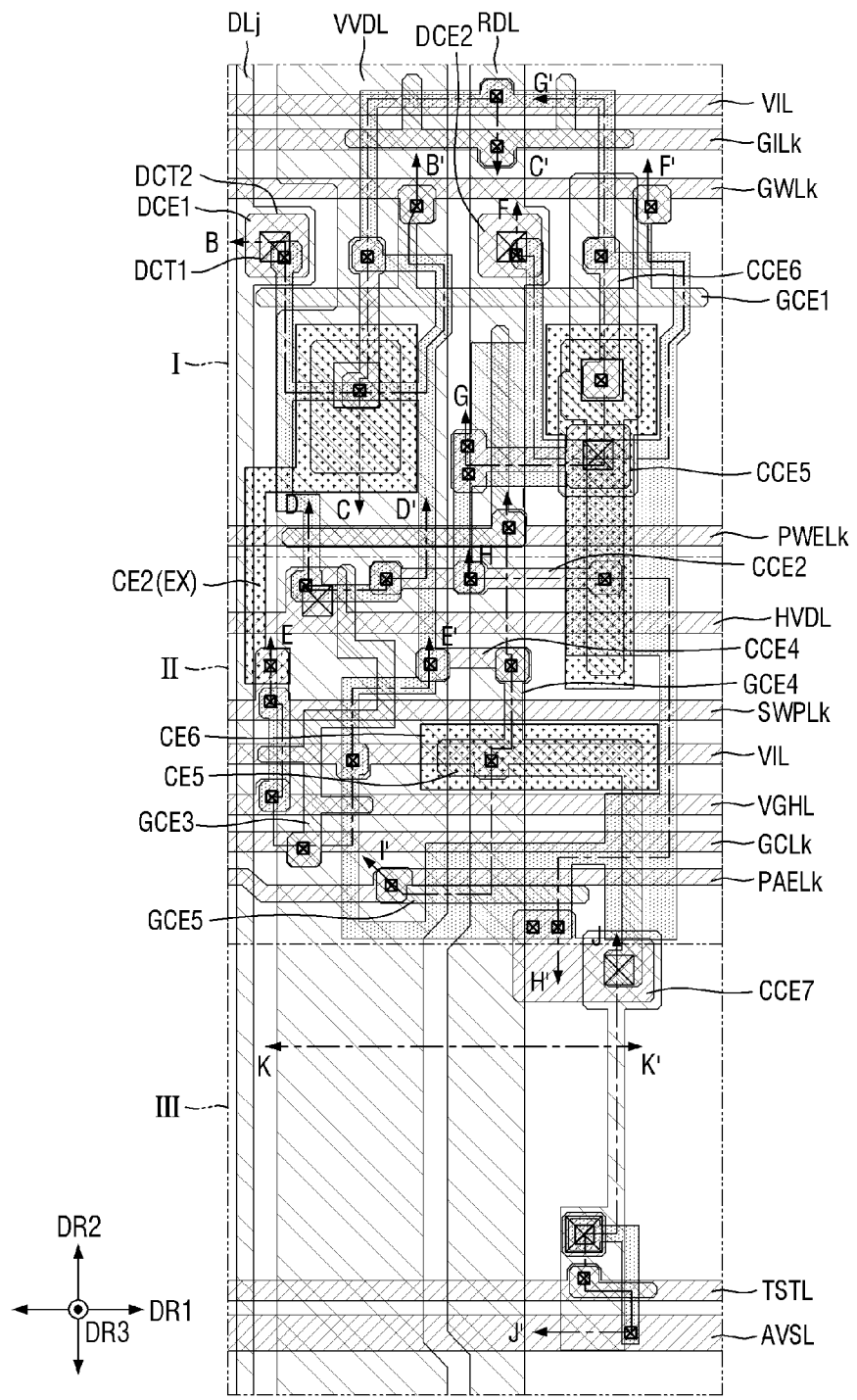
FIG. 18 is a schematic layout diagram illustrating an active layer, a first conductive layer, a second conductive layer, a third conductive layer, and a fourth conductive layer of a first sub-pixel according to an embodiment.
Figure 19:
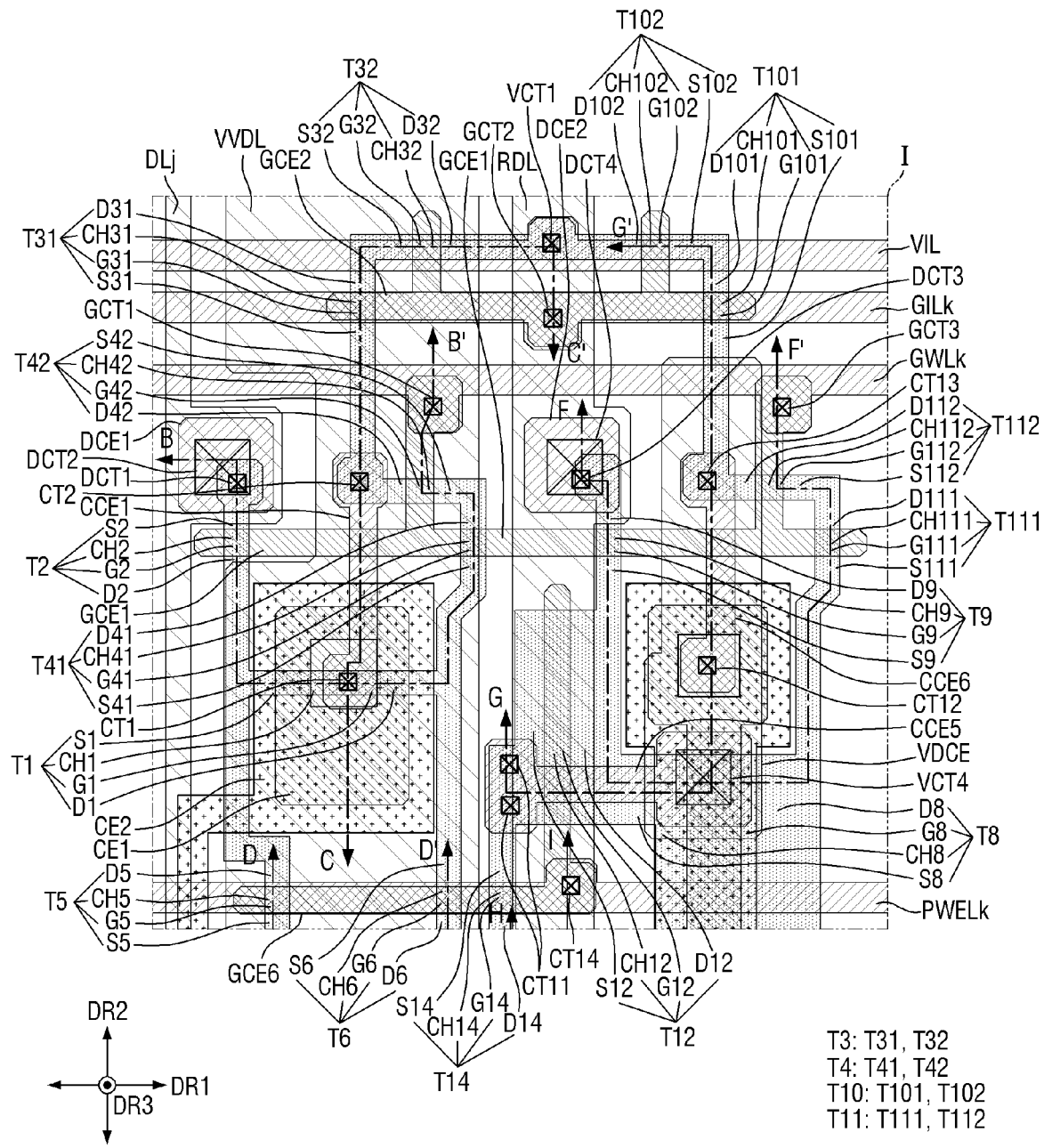
FIG. 19 is a schematic enlarged layout view illustrating area I of FIG. 18 in detail.
Figure 20:
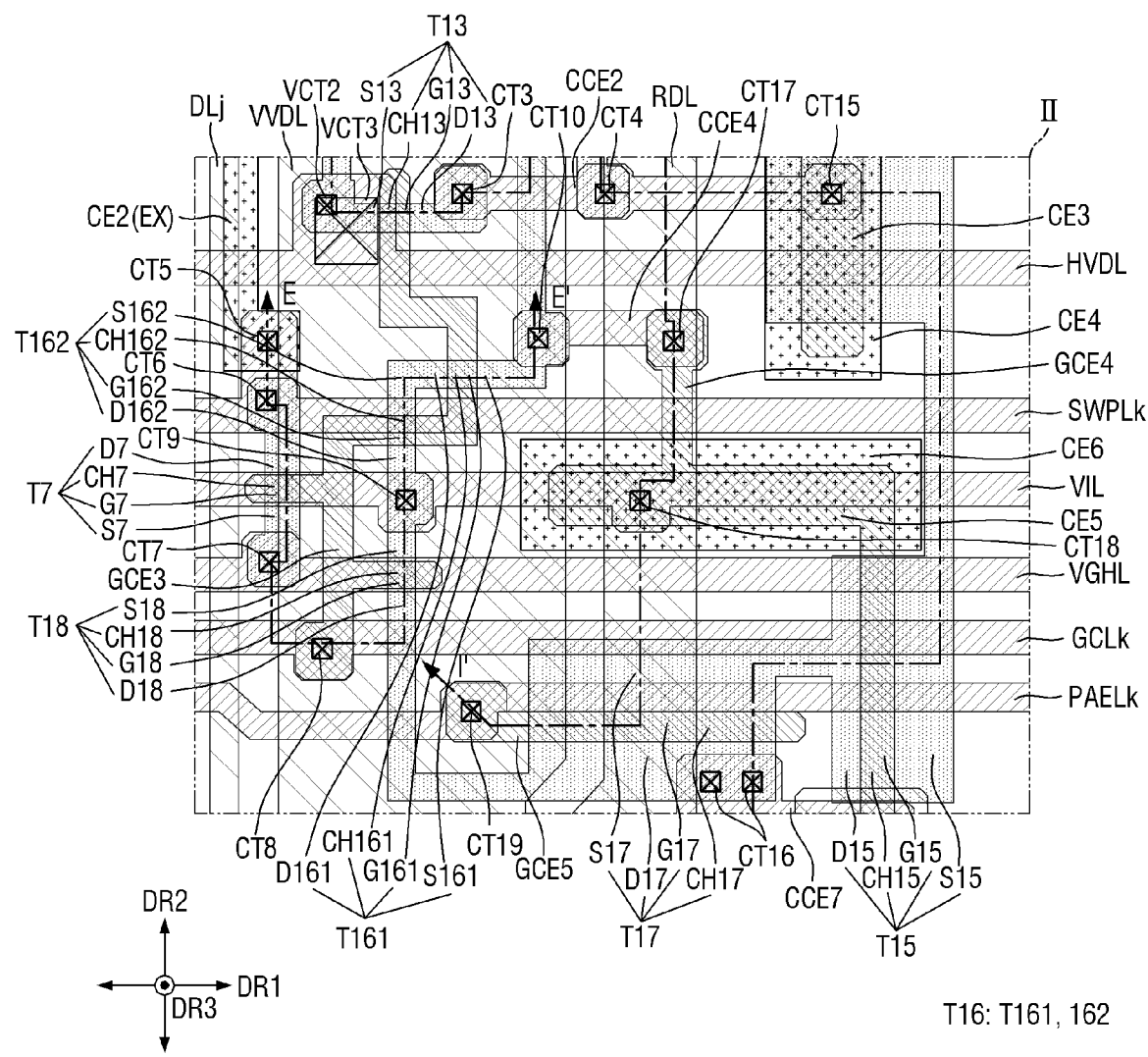
FIG. 20 is a schematic enlarged layout view illustrating area II of FIG. 18 in detail.
Figure 21:
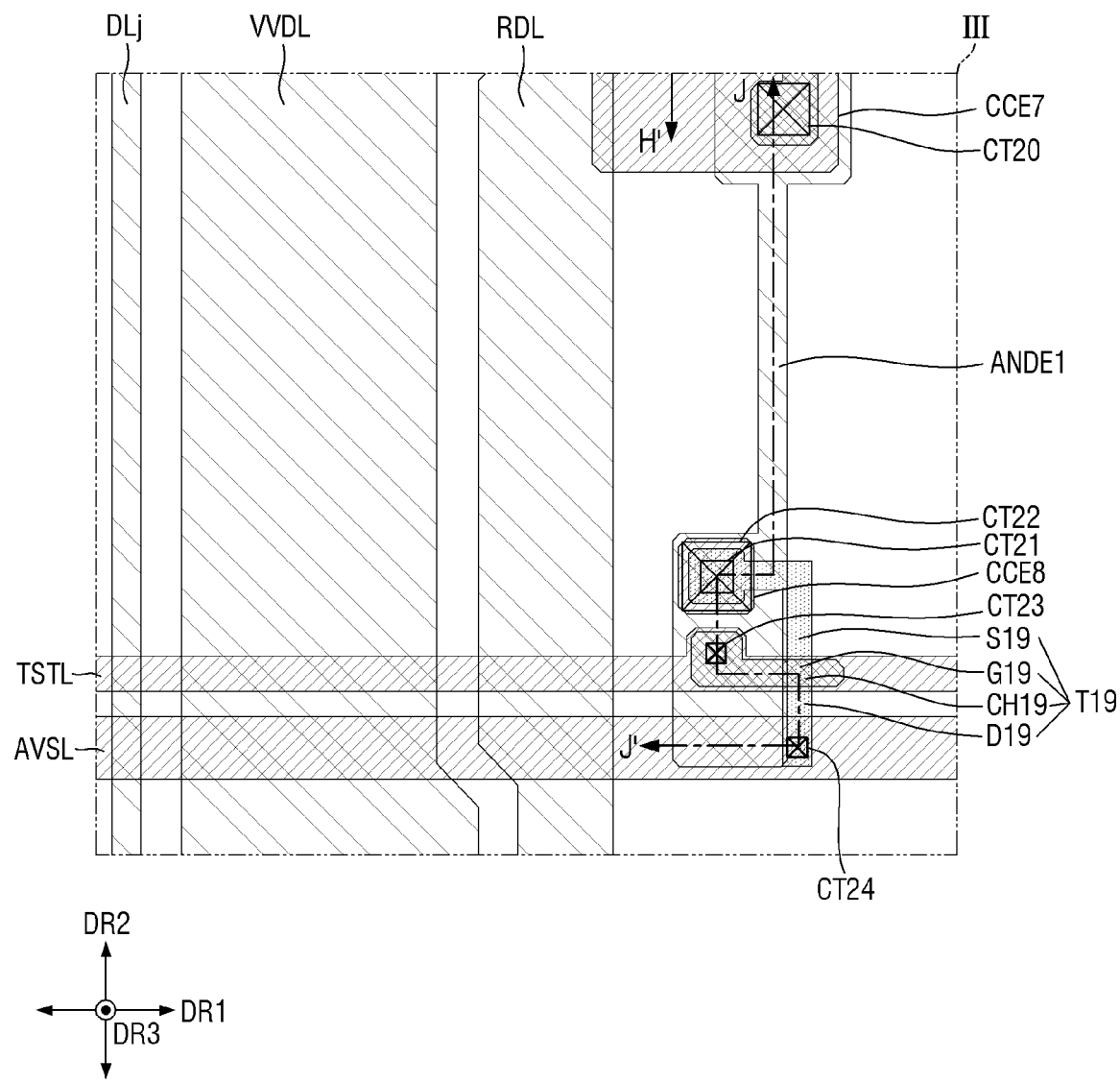
FIG. 21 is a schematic enlarged layout view illustrating area III of FIG. 18 in detail.

FIG. 18 is a schematic layout diagram illustrating an active layer, a first conductive layer, a second conductive layer, a third conductive layer, and a fourth conductive layer of a first sub-pixel according to an embodiment. FIG. 19 is a schematic enlarged layout view illustrating area I of FIG. 18 in detail. FIG. 20 is a schematic enlarged layout view illustrating area II of FIG. 18 in detail. FIG. 21 is a schematic enlarged layout view illustrating area III of FIG. 18 in detail.

Referring to FIGS. 18 to 21, the initialization voltage lines VIL, the $k^{th}$ scan initialization line GILk, the $k^{th}$ scan write line GWLk, the $k^{th}$ PWM emission line PWELk, a first horizontal power line VDL1, the gate-off voltage line VGHL, the $k^{th}$ sweep signal line SWPLk, the $k^{th}$ scan control line GCLk, the $k^{th}$ PAM emission line PAELk, the test signal line TSTL, and a third power auxiliary line AVSL may extend in the first direction DR1. The initialization voltage lines VIL, the $k^{th}$ scan initialization line GILk, the $k^{th}$ scan write line GWLk, the $k^{th}$ PWM emission line PWELk, the first horizontal power line VDL1, the gate-off voltage line VGHL, the $k^{th}$ sweep signal line SWPLk, the $k^{th}$ scan control line GCLk, the $k^{th}$ PAM emission line PAELk, the test signal line TSTL, and the third power auxiliary line AVSL may be spaced apart from each other in the second direction DR2.

The $j^{th}$ data line DLj, a first vertical power line VVDL, and the first PAM data line RDL may extend in the second direction DR2. Further, the second PAM data line GDL and the third PAM data line BDL illustrated in FIG. 5 may extend in the second direction DR2. The $j^{th}$ data line DLj, the first vertical power line VVDL, the first PAM data line RDL, the second PAM data line GDL, and the third PAM data line BDL may be spaced apart from each other in the first direction DR1.

The first sub-pixel RP includes the first to nineteenth transistors T1 to T19, first to sixth capacitor electrodes CE1 to CE6, first to fifth gate connection electrodes GCE1 to GCE5, first and second data connection electrodes DCE1 and DCE2, first to eighth connection electrodes CCE1 to CCE8, a first anode connection electrode ANDE1, and the light emitting element EL.

The first transistor T1 includes a first channel CH1, a first gate electrode G1, a first source electrode S1, and a first drain electrode D1. The first channel CH1 may extend in the first direction DR1. The first channel CH1 may overlap the first gate electrode G1 in a third direction DR3. The first gate electrode G1 may be connected to the first connection electrode CCE1 through a first contact hole CT1. The first gate electrode G1 may be integral with (or integrally formed with) the first capacitor electrode CE1. The first gate electrode G1 may overlap the second capacitor electrode CE2 in the third direction DR3. The first source electrode S1 may be disposed on a side of the first channel CH1, and the first drain electrode D1 may be disposed on another side of the first channel CH1. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may not overlap the first gate electrode G1 in the third direction DR3. The first source electrode S1 and the first drain electrode D1 may overlap the second capacitor electrode CE2 in the third direction DR3.

The second transistor T2 includes a second channel CH2, a second gate electrode G2, a second source electrode S2, and the second drain electrode D2. The second channel CH2 may overlap the second gate electrode G2 in the third direction DR3. The second gate electrode G2 may be integral with the first gate connection electrode GCE1. The second source electrode S2 may be disposed on a side of the second channel CH2, and the second drain electrode D2 may be disposed on another side of the second channel CH2. The second source electrode S2 may be connected to the first data connection electrode DCE1 through a first data contact hole DCT1. The second drain electrode D2 may be connected to the first source electrode S1. The second source electrode S2 and the second drain electrode D2 may not overlap the second gate electrode G2 in the third direction DR3. The second drain electrode D2 may extend in the second direction DR2. The second drain electrode D2 may be connected to the first source electrode S1.

The first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integral with the second gate connection electrode GCE2. The first sub-source electrode S31 may be disposed on a side of the first sub-channel CH31, and the first sub-drain electrode D31 may be disposed on another side of the first sub-channel CH31. The first sub-source electrode S31 may be connected to a fourth sub-drain electrode D42, and the first sub-drain electrode D31 may be connected to a second sub-source electrode S32. The first sub-source electrode S31 and the first sub-drain electrode D31 may not overlap the first sub-gate electrode G31. The first sub-source electrode S31 may overlap the $k^{th}$ scan write line GWLk in the third direction DR3. The first sub-drain electrode D31 may overlap the initialization voltage line VIL in the third direction DR3.

The second sub-transistor T32 of the third transistor T3 includes a second sub-channel CH32, a second sub-gate electrode G32, the second sub-source electrode S32, and a second sub-drain electrode D32. The second sub-channel CH32 may overlap the second sub-gate electrode G32 in the third direction DR3. The second sub-gate electrode G32 may be integral with the second gate connection electrode GCE2. The second sub-source electrode S32 may be disposed on a side of the second sub-channel CH32, and the second sub-drain electrode D32 may be disposed on another side of the second sub-channel CH32. The second sub-source electrode S32 may be connected to the first sub-drain electrode D31, and the second sub-drain electrode D32 may be connected to the initialization voltage line VIL through a first power contact hole VCT1. The second sub-source electrode S32 and the second sub-drain electrode D32 may not overlap the second sub-gate electrode G32. The second sub-source electrode S32 and the second sub-drain electrode D32 may overlap the initialization voltage line VIL in the third direction DR3.

The third sub-transistor T41 of the fourth transistor T4 includes a third sub-channel CH41, a third sub-gate electrode G41, the third sub-source electrode S41, and a third sub-drain electrode D41. The third sub-channel CH41 may overlap the third sub-gate electrode G41 in the third direction DR3. The third sub-gate electrode G41 may be integral with the first gate connection electrode GCE1. The third sub-source electrode S41 may be disposed on a side of the third sub-channel CH41, and the third sub-drain electrode D31 may be disposed on another side of the third sub-channel CH41. The third sub-source electrode S41 may be connected to the first drain electrode D1, and the third sub-drain electrode D41 may be connected to a fourth sub-source electrode S42. The third sub-source electrode S41 and the third sub-drain electrode D41 may not overlap the third sub-gate electrode G41.

The fourth sub-transistor T42 of the fourth transistor T4 includes a fourth sub-channel CH42, a fourth sub-gate electrode G42, the fourth sub-source electrode S42, and the fourth sub-drain electrode D42. The fourth sub-channel CH42 may overlap the fourth sub-gate electrode G42 in the third direction DR3. The fourth sub-gate electrode G42 may be integral with the second gate connection electrode GCE2. The fourth sub-source electrode S42 may be disposed on a side of the fourth sub-channel CH42, and the fourth sub-drain electrode D42 may be disposed on another side of the fourth sub-channel CH42. The fourth sub-source electrode S42 may be connected to the third sub-drain electrode D32, and the fourth sub-drain electrode D42 may be connected to the first sub-source electrode S31. The fourth sub-source electrode S42 and the fourth sub-drain electrode D42 may not overlap the fourth sub-gate electrode G42.

The fifth transistor T5 includes a fifth channel CH5, a fifth gate electrode G5, a fifth source electrode S5, and the fifth drain electrode D5. The fifth channel CH5 may overlap the fifth gate electrode G5 in the third direction DR3. The fifth gate electrode G5 may be integral with the third gate connection electrode GCE3. The fifth source electrode S5 may be disposed on a side of the fifth channel CH5, and the fifth drain electrode D5 may be disposed on another side of the fifth channel CH5. The fifth source electrode S5 may be connected to a first horizontal power line HVDL through a second power contact hole VCT2. The fifth drain electrode D5 may be connected to the first source electrode S1. The fifth source electrode S5 and the fifth drain electrode D5 may not overlap the fifth gate electrode G5 in the third direction DR3. The fifth drain electrode D5 may overlap an extension portion E of the second capacitor electrode CE2 in the third direction DR3.

The sixth transistor T6 includes a sixth channel CH6, a sixth gate electrode G6, a sixth source electrode S6, and a sixth drain electrode D6. The sixth channel CH6 may overlap the sixth gate electrode G6 in the third direction DR3. The sixth gate electrode G6 may be integral with the third gate connection electrode GCE3. The sixth source electrode S6 may be disposed on a side of the sixth channel CH6, and the sixth drain electrode D6 may be disposed on another side of the sixth channel CH6. The sixth source electrode S6 may be connected to the first drain electrode D1. The sixth drain electrode D6 may be connected to the fourth connection electrode CCE4 through a tenth contact hole CT10. The sixth source electrode S6 and the sixth drain electrode D6 may not overlap the sixth gate electrode G6 in the third direction DR3. The sixth drain electrode D6 may overlap the second connection electrode CCE2 and the first horizontal power line HVDL in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integral with the third gate connection electrode GCE3. The seventh gate electrode G7 may overlap the initialization voltage line VIL in the third direction DR3. The seventh source electrode S7 may be disposed on a side of the seventh channel CH7, and the seventh drain electrode D7 may be disposed on another side of the seventh channel CH7. The seventh source electrode S7 may be connected to the gate-off voltage line VGHL through a seventh contact hole CT7. The seventh drain electrode D7 may be connected to the k$^{th}$ sweep signal line SWPLk through a sixth contact hole CT6. The seventh source electrode S7 and the seventh drain electrode D7 may not overlap the seventh gate electrode G7 in the third direction DR3.

The eighth transistor T8 includes an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may extend in the second direction DR2. The eighth gate electrode G8 may be integral with the third capacitor electrode CE3. The eighth source electrode S8 may be disposed on a side of the eighth channel CH8, and the eighth drain electrode D8 may be disposed on another side of the eighth channel CH8. The eighth source electrode S8 may be connected to a ninth drain electrode D9 and a twelfth drain electrode D12. The eighth drain electrode D8 may be connected to a seventh sub-source electrode S111. The eighth source electrode S8 and the eighth drain electrode D8 may not overlap the eighth gate electrode G8 in the third direction DR3.

The ninth transistor T9 includes a ninth channel CH9, a ninth gate electrode G9, a ninth source electrode S9, and the ninth drain electrode D9. The ninth channel CH9 may overlap the ninth gate electrode G9 in the third direction DR3. The ninth gate electrode G9 may extend in the second direction DR2. The ninth gate electrode G9 may be integral with the first gate connection electrode GCE1. The ninth source electrode S9 may be disposed on a side of the ninth channel CH9, and the ninth drain electrode D9 may be disposed on another side of the ninth channel CH9. The ninth source electrode S9 may be connected to the second data connection electrode DCE2 through a third data contact hole DCT3. The ninth drain electrode D9 may be connected to the eighth source electrode D8. The ninth source electrode S9 and the ninth drain electrode D9 may not overlap the ninth gate electrode G9 in the third direction DR3.

The fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integral with the second gate connection electrode GCE2. The fifth sub-source electrode S101 may be disposed on a side of the fifth sub-channel CH101, and the fifth sub-drain electrode D101 may be disposed on another side of the fifth sub-channel CH101. The fifth sub-source electrode S101 may be connected to an eighth sub-drain electrode D112, and the fifth sub-drain electrode D101 may be connected to a sixth sub-source electrode S102. The fifth sub-source electrode S101 and the fifth sub-drain electrode D101 may not overlap the fifth sub-gate electrode G101. The fifth sub-source electrode S101 may overlap the k$^{th}$ scan write line GWLk in the third direction DR3. The fifth sub-drain electrode S102 may overlap the initialization voltage line VIL in the third direction DR3.

The sixth sub-transistor T102 of the tenth transistor T10 includes a sixth sub-channel CH102, a sixth sub-gate electrode G102, the sixth sub-source electrode S102, and a sixth sub-drain electrode D102. The sixth sub-channel CH102 may overlap the sixth sub-gate electrode G102 in the third direction DR3. The sixth sub-gate electrode G102 may be integral with the second gate connection electrode GCE2. The sixth sub-source electrode S102 may be disposed on a side of the sixth sub-channel CH102, and the sixth sub-drain electrode D102 may be disposed on another side of the sixth sub-channel CH102. The sixth sub-source electrode S102 may be connected to the fifth sub-drain electrode D101, and the sixth sub-drain electrode D102 may be connected to the initialization voltage line VIL through the first power contact hole VCT1. The sixth sub-source electrode S102 and the sixth sub-drain electrode D102 may not overlap the sixth sub-gate electrode G102. The sixth sub-source electrode S102 and the sixth sub-drain electrode D102 may overlap the initialization voltage line VIL in the third direction DR3.

The seventh sub-transistor T111 of the eleventh transistor T11 includes a seventh sub-channel CH111, a seventh sub-gate electrode G111, the seventh sub-source electrode S111, and a seventh sub-drain electrode D111. The seventh sub-channel CH111 may overlap the seventh sub-gate electrode G111 in the third direction DR3. The seventh sub-gate electrode G111 may be integral with the first gate connection electrode GCE1. The seventh sub-source electrode S111 may be disposed on a side of the seventh sub-channel CH111, and the seventh sub-drain electrode D111 may be disposed on another side of the seventh sub-channel CH111. The seventh sub-source electrode S111 may be connected to the eighth drain electrode D8, and the seventh sub-drain electrode D111 may be connected to an eighth sub-source electrode S112. The seventh sub-source electrode S111 and the seventh sub-drain electrode D111 may not overlap the seventh sub-gate electrode G111.

The eighth sub-transistor T112 of the eleventh transistor T11 includes an eighth sub-channel CH112, an eighth sub-gate electrode G112, the eighth sub-source electrode S112, and the eighth sub-drain electrode D112. The eighth sub-channel CH112 may overlap the eighth sub-gate electrode G112 in the third direction DR3. The eighth sub-gate electrode G112 may be integral with the second gate connection electrode GCE2. The eighth sub-source electrode S112 may be disposed on a side of the eighth sub-channel CH112, and the eighth sub-drain electrode D112 may be disposed on another side of the eighth sub-channel CH112. The eighth sub-source electrode S112 may be connected to the seventh sub-drain electrode D111, and the eighth sub-drain electrode D112 may be connected to the fifth sub-source electrode S101. The eighth sub-source electrode S112 and the eighth sub-drain electrode D112 may not overlap the eighth sub-gate electrode G112.

The twelfth transistor T12 includes a twelfth channel CH12, a twelfth gate electrode G12, a twelfth source electrode S12, and the twelfth drain electrode D12. The twelfth channel CH12 may overlap the twelfth gate electrode G12 in the third direction DR3. The twelfth gate electrode G12 may be integral with the third gate connection electrode GCE3. The twelfth source electrode S12 may be disposed on a side of the twelfth channel CH12, and the twelfth drain electrode D12 may be disposed on another side of the twelfth channel CH12. The twelfth source electrode S12 may be connected to the fifth connection electrode CCE5 through eleventh contact holes CT11. The twelfth source electrode S12 and the twelfth drain electrode D12 may not overlap the twelfth gate electrode G12 in the third direction DR3.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integral with the third gate connection electrode GCE3. The thirteenth source electrode S13 may be disposed on a side of the thirteenth channel CH13, and the thirteenth drain electrode D13 may be disposed on another side of the thirteenth channel CH13. The thirteenth source electrode S13 may be connected to the first horizontal power line HVDL through the second power contact hole VCT2. The thirteenth drain electrode D13 may be connected to the second connection electrode CCE2 through a third contact hole CT3. The thirteenth source electrode S13 and the thirteenth drain electrode D13 may not overlap the thirteenth gate electrode G13 in the third direction DR3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integral with the third gate connection electrode GCE3. The fourteenth source electrode S14 may be disposed on a side of the fourteenth channel CH14, and the fourteenth drain electrode D14 may be disposed on another side of the fourteenth channel CH14. The fourteenth source electrode S14 may be connected to the fifth connection electrode CCE5 through the eleventh contact holes CT11. The fourteenth drain electrode D14 may be connected to the second connection electrode CCE2 through a fourth contact hole CT4. The fourteenth source electrode S14 and the fourteenth drain electrode D14 may not overlap the fourteenth gate electrode G14 in the third direction DR3.

The fifteenth transistor T15 includes a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integral with the fifth capacitor electrode CE5. The fifteenth source electrode S15 may be disposed on a side of the fifteenth channel CH15, and the fifteenth drain electrode D15 may be disposed on another side of the fifteenth channel CH15. The fifteenth source electrode S15 may be connected to the ninth drain electrode D9. The fifteenth drain electrode D15 may be connected to a seventeenth source electrode S17. The fifteenth source electrode S15 and the fifteenth drain electrode D15 may not overlap the fifteenth gate electrode G15 in the third direction DR3.

The ninth sub-transistor T161 of the sixteenth transistor T16 includes a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integral with the third gate connection electrode GCE3. The ninth sub-source electrode S161 may be disposed on a side of the ninth sub-channel CH161, and the ninth sub-drain electrode D161 may be disposed on another side of the ninth sub-channel CH161. The ninth sub-source electrode S161 may be connected to the fourth connection electrode CCE4 through the tenth contact hole CT10, and the ninth sub-drain electrode D161 may be connected to a tenth sub-source electrode S162. The ninth sub-source electrode S161 and the ninth sub-drain electrode D161 may not overlap the ninth sub-gate electrode G161.

The tenth sub-transistor T162 of the sixteenth transistor T16 includes a tenth sub-channel CH162, a tenth sub-gate electrode G162, the tenth sub-source electrode S162, and a tenth sub-drain electrode D162. The tenth sub-channel CH162 may overlap the tenth sub-gate electrode G162 in the third direction DR3. The tenth sub-gate electrode G162 may be integral with the third gate connection electrode GCE3. The tenth sub-source electrode S162 may be disposed on a side of the tenth sub-channel CH162, and the tenth sub-drain electrode D162 may be disposed on another side of the tenth sub-channel CH162. The tenth sub-source electrode S162 may be connected to the ninth sub-drain electrode D161, and the tenth sub-drain electrode D162 may be connected to the initialization voltage line VIL through a ninth contact hole CT9. The tenth sub-source electrode S162 and the tenth sub-drain electrode D162 may not overlap the tenth sub-gate electrode G162.

The seventeenth transistor T17 includes a seventeenth channel CH17, a seventeenth gate electrode G17, the seventeenth source electrode S17, and a seventeenth drain electrode D17. The seventeenth channel CH17 may overlap the seventeenth gate electrode G17 in the third direction DR3. The seventeenth gate electrode G17 may be integral with the fifth gate connection electrode GCE5. The seventeenth source electrode S17 may be disposed on a side of the seventeenth channel CH17, and the seventeenth drain electrode D17 may be disposed on another side of the seventeenth channel CH17. The seventeenth source electrode S17 may be connected to the fifteenth drain electrode D15. The seventeenth drain electrode D17 may be connected to the seventh connection electrode CCE7 through sixteenth contact holes CT16. The seventeenth source electrode S17 and the seventeenth drain electrode D17 may not overlap the seventeenth gate electrode G17 in the third direction DR3.

The eighteenth transistor T18 includes an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integral with the third gate connection electrode GCE3. The eighteenth source electrode S18 may be disposed on a side of the eighteenth channel CH18, and the eighteenth drain electrode D18 may be disposed on another side of the eighteenth channel CH18. The eighteenth source electrode S18 may be connected to the initialization voltage line VIL through the ninth contact hole CT9. The eighteenth drain electrode D18 may be connected to the seventh connection electrode CCE7 through the sixteenth contact holes CT16. The eighteenth source electrode S18 and the eighteenth drain electrode D18 may not overlap the eighteenth gate electrode G18 in the third direction DR3.

The nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be connected to the test signal line TSTL through a twenty-third contact hole CT23. The nineteenth source electrode S19 may be disposed on a side of the nineteenth channel CH19, and the nineteenth drain electrode D19 may be disposed on another side of the nineteenth channel CH19. The nineteenth source electrode S19 may be connected to the eighth connection electrode CCE8 through a twenty-first contact hole CT21. The nineteenth drain electrode D19 may be connected to the third power auxiliary line AVSL through a twenty-fourth contact hole CT24. The nineteenth source electrode S19 and the nineteenth drain electrode D19 may not overlap the nineteenth gate electrode G19 in the third direction DR3.

The first capacitor electrode CE1 may be integral with the first gate electrode G1. The second capacitor electrode CE2 may overlap the first capacitor electrode CE1 in the third direction DR3. The first capacitor electrode CE1 may be an electrode of the first capacitor PC1, and the second capacitor electrode CE2 may be another electrode of the first capacitor PC1.

The second capacitor electrode CE2 includes a hole exposing the first gate electrode G1, and the first connection electrode CCE1 may be connected to the first gate electrode G1 through the first contact hole CT1 in the hole.

The second capacitor electrode CE2 may include the extension portion EX extending in the second direction DR2. The extension portion EX of the second capacitor electrode CE2 may intersect the $k^{th}$ PWM emission line PWELk and the first horizontal voltage line HVDL. The extension portion EX of the second capacitor CE2 may be connected to the $k^{th}$ sweep signal line SWPLk through a fifth contact hole CT5.

The third capacitor electrode CE3 may be integral with the eighth gate electrode G8. The fourth capacitor electrode CE4 may overlap the third capacitor electrode CE3 in the third direction DR3. The third capacitor electrode CE3 may be an electrode of the second capacitor PC2, and the fourth capacitor electrode CE4 may be another electrode of the second capacitor PC2.

The fourth capacitor electrode CE4 includes a hole exposing the eighth gate electrode G8, and a sixth connection electrode CCE6 may be connected to the eighth gate electrode G8 through a twelfth contact hole CT12 in the hole.

The fifth capacitor electrode CE5 may be integral with the fourth gate connection electrode GCE4 and the fifteenth gate electrode G15. The sixth capacitor electrode CE6 may overlap the fifth capacitor electrode CE5 in the third direction DR3. The fifth capacitor electrode CE5 may be an electrode of the third capacitor PC3, and the sixth capacitor electrode CE6 may be another electrode of the third capacitor PC3. The sixth capacitor electrode CE6 may be connected to the initialization voltage line VIL through an eighteenth contact hole CT18.

The first gate connection electrode GCE1 may be connected to the $k^{th}$ scan write line GWLk through a first gate contact hole GCT1 and a third gate contact hole GCT3. The second gate connection electrode GCE2 may be connected to the $k^{th}$ scan initialization line GILk through a second gate contact hole GCT2. The third gate connection electrode GCE3 may be connected to the $k^{th}$ PWM emission line PWELk through a fourteenth contact hole CT14. The fourth gate connection electrode GCE4 may be connected to the $k^{th}$ scan control line GCLk through an eighth contact hole CT8. The fourth gate connection electrode GCE4 may be connected to the fourth connection electrode CCE4 through a seventeenth contact hole CT17. The fifth gate connection electrode GCE5 may be connected to the $k^{th}$ PAM emission line PAELk through a nineteenth contact hole CT19.

The first data connection electrode DCE1 may be connected to the second source electrode S2 through the first data contact hole DCT1, and may be connected to the $j^{th}$ data line DLj through a second data contact hole DCT2. The second data connection electrode DCE2 may be connected to the ninth source electrode S9 through the third data contact hole DCT3, and may be connected to the first PAM data line RDL through a fourth data contact hole DCT4.

The first connection electrode CCE1 may extend in the second direction DR2. The first connection electrode CCE1 may be connected to the first gate electrode G1 through the first contact hole CT1, and may be connected to the first sub-source electrode S31 and the fourth sub-drain electrode D42 through a second contact hole CT2.

The second connection electrode CCE2 may extend in the first direction DR1. The second connection electrode CCE2 may be connected to the twelfth drain electrode D12 through the third contact hole CT3, may be connected to the fourteenth drain electrode D14 through the fourth contact hole CT4, and may be connected to the fourth capacitor electrode CE4 through a fifteenth contact hole CT15.

The fourth connection electrode CCE4 may extend in the first direction DR1. The fourth connection electrode CCE4 may be connected to the sixth drain electrode D6 and the ninth sub-source electrode S161 through the tenth contact hole CT10, and may be connected to the fourth gate electrode GCE4 through the seventeenth contact hole CT17.

The fifth connection electrode CCE5 may extend in the first direction DR1. The fifth connection electrode CCE5 may be connected to the twelfth source electrode S12 and the fourteenth source electrode S14 through the eleventh contact holes CT11, and may be connected to the fourth capacitor electrode CE4 through a fourth power contact hole VCT4.

The sixth connection electrode CCE6 may extend in the second direction DR2. The sixth connection electrode CCE6 may be connected to the third capacitor electrode CE3 through the twelfth contact hole CT12, and may be connected to the fifth sub-source electrode S101 and the eighth sub-drain electrode D112 through a thirteenth contact hole CT13.

The seventh connection electrode CCE7 may be connected to the seventeenth drain electrode D17 and the eighteenth drain electrode D18 through the sixteenth contact holes CT16. The seventh connection electrode CCE7 may be connected to the first anode connection electrode ANDE1 through a twentieth contact hole CT20.

The eighth connection electrode CCE8 may be connected to the nineteenth source electrode S19 through the twenty-first contact hole CT21, and may be connected to the first anode connection electrode ANDE1 through a twenty-second contact hole CT22.

The first anode connection electrode ANDE1 may extend in the second direction DR2. The first anode connection electrode ANDE1 may be connected to the seventh connection electrode CCE7 through the twentieth contact hole CT20, and may be connected to the eighth connection electrode CCE8 through the twenty-second contact hole CT22.

A second power connection electrode VDCE may extend in the second direction DR2. The second power connection electrode VDCE may be connected to the fifth connection electrode CCE5 through a fourth power contact hole VCT4.

Figure 22:
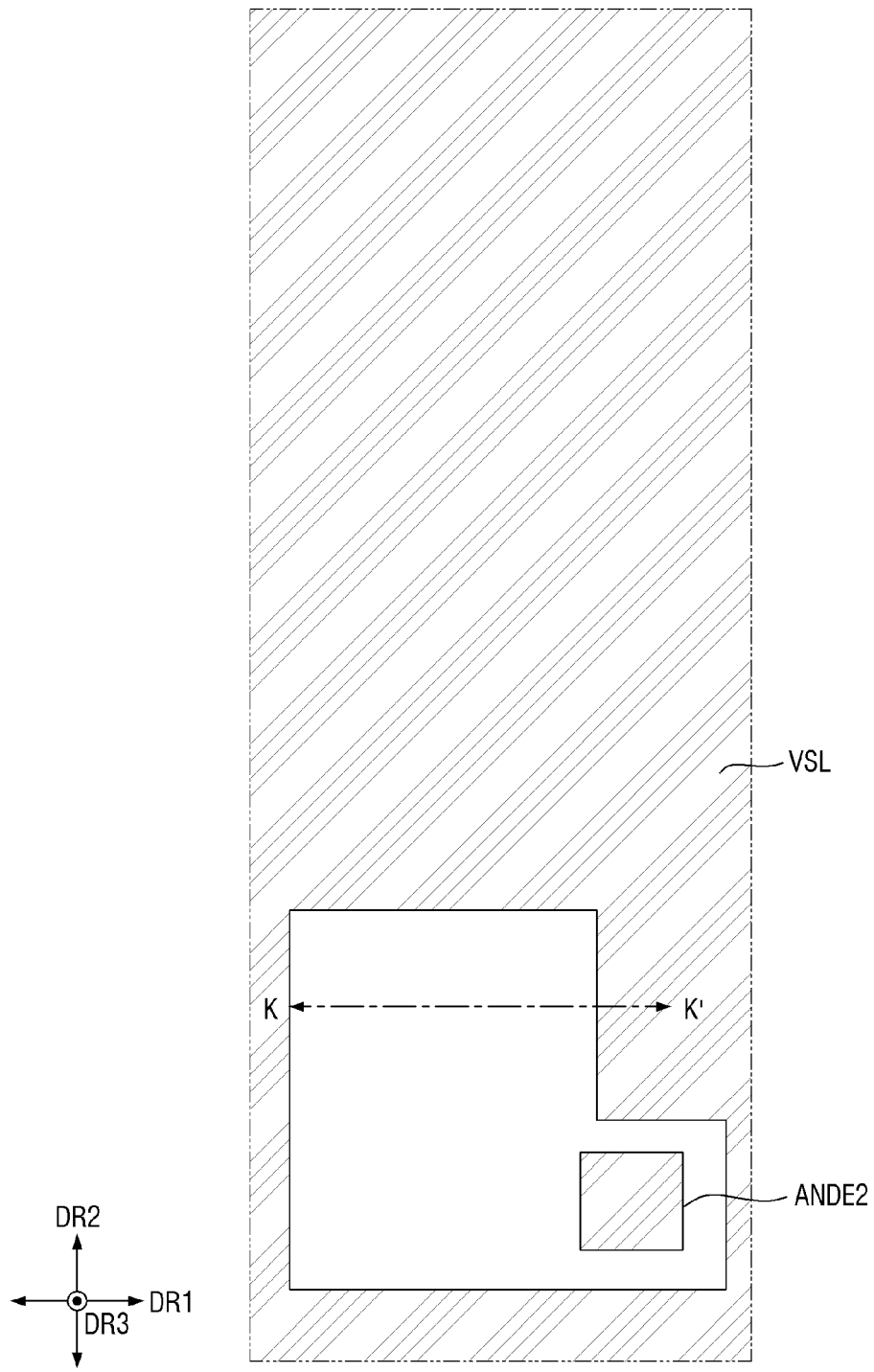
FIG. 22 is a schematic layout diagram illustrating an example of the fifth conductive layer of the first sub-pixel shown in FIG. 18.
Figure 23:
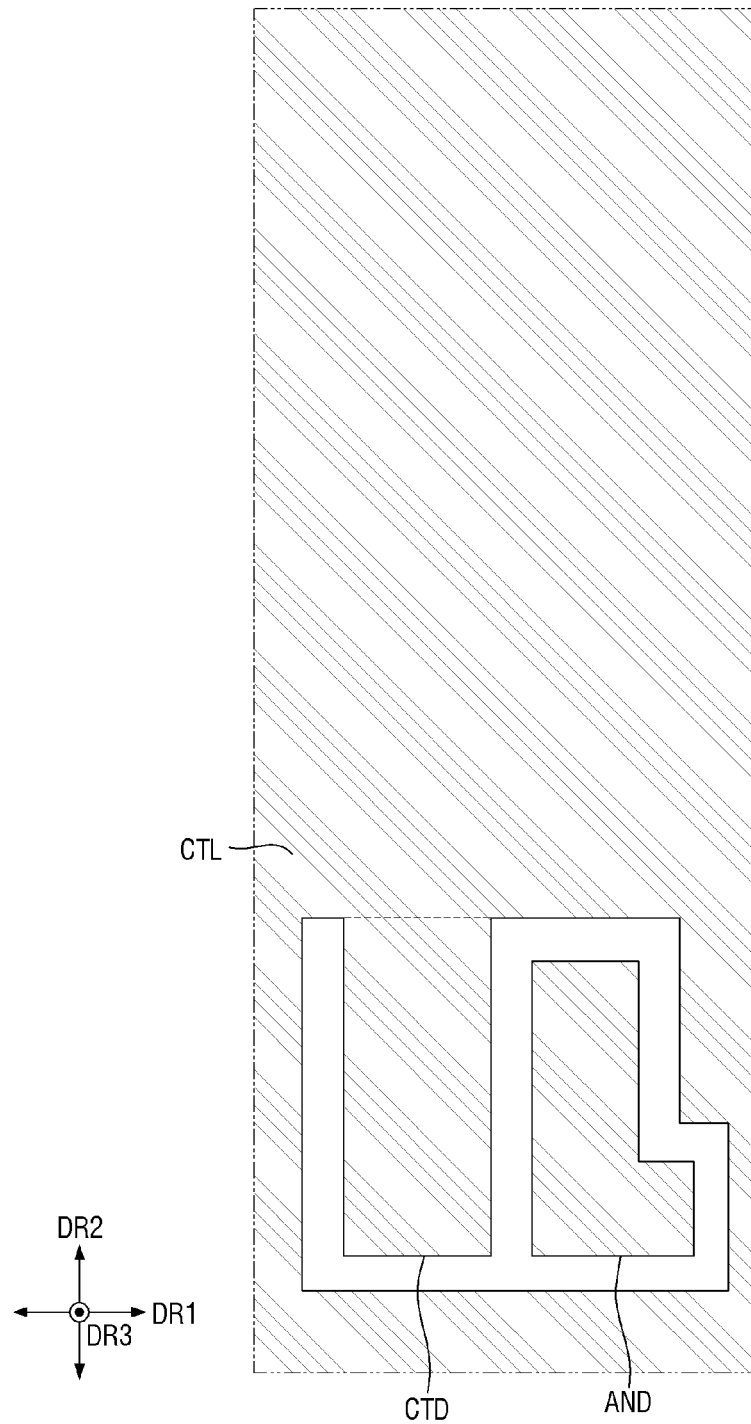
FIG. 23 is a schematic layout diagram illustrating an example of the sixth conductive layer of the first sub-pixel shown in FIG. 18.
Figure 24:
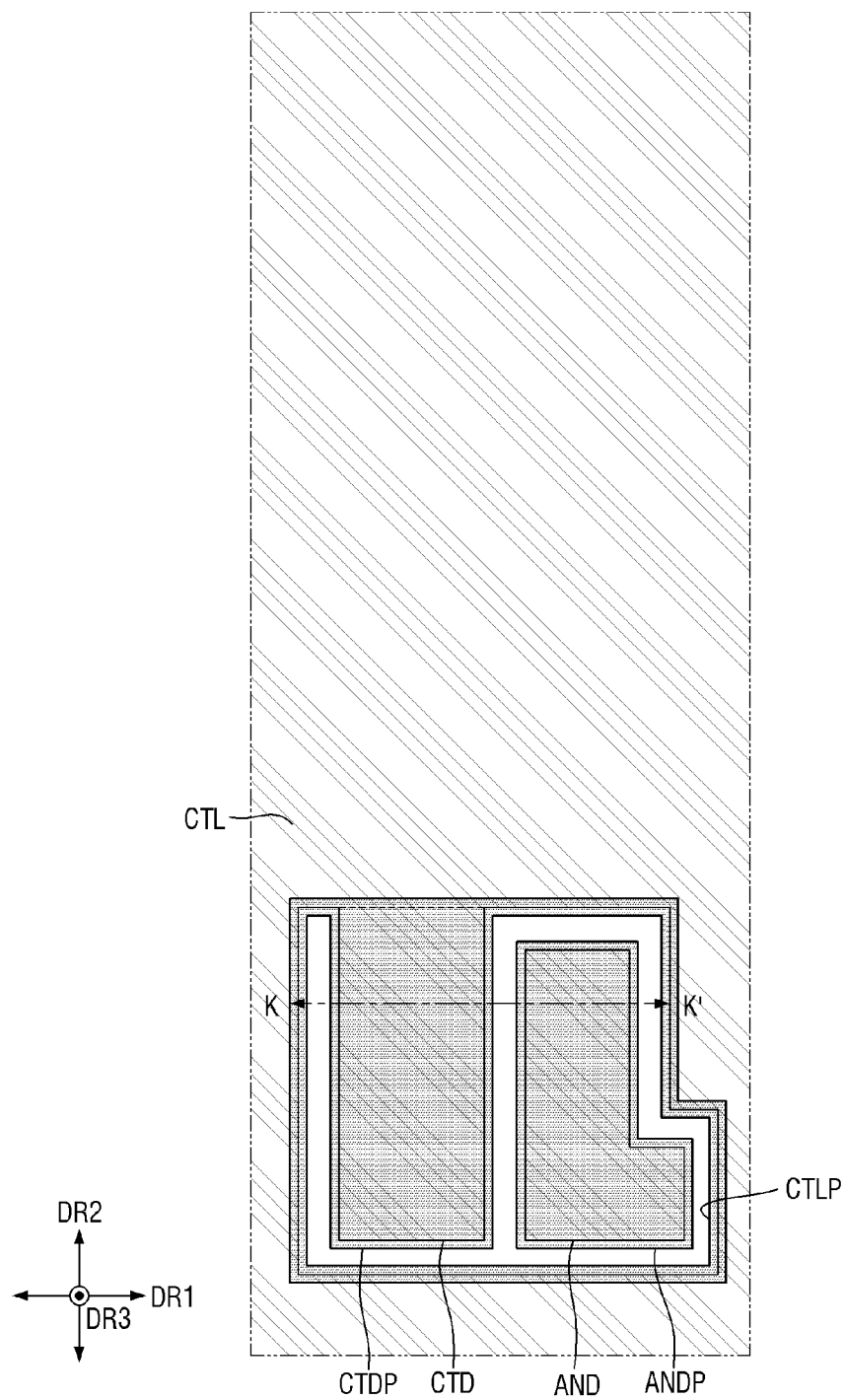
FIG. 24 is a schematic layout diagram illustrating an example of the seventh conductive layer of the first sub-pixel shown in FIG. 18.

FIG. 22 is a schematic layout diagram illustrating an example of the fifth conductive layer of the first sub-pixel shown in FIG. 18. FIG. 23 is a schematic layout diagram illustrating an example of the sixth conductive layer of the first sub-pixel shown in FIG. 18. FIG. 24 is a schematic layout diagram illustrating an example of the seventh conductive layer of the first sub-pixel shown in FIG. 18.

Referring to FIG. 22, the fifth conductive layer disposed on an organic layer covering the fourth conductive layer may include the third power supply line VSL.

The third power line VSL may correspond to the entire display area DA except a portion in which the light emitting element LE of each of the sub-pixels RP, GP, and BP is disposed.

Further, the fifth conductive layer may further include a second anode connection electrode ANDE2 overlapping the first anode connection electrode ANDE1.

Referring to FIG. 23, the sixth conductive layer disposed on another organic layer covering the fifth conductive layer may include the anode electrode AND corresponding to each of the sub-pixels RP, GP, and BP, the cathode electrode CTD corresponding to each of the sub-pixels RP, GP, and BP, and a cathode line CTL connected to the cathode electrode CTD.

For example, the display panel 100 according to an embodiment may include anode electrodes AND respectively corresponding to the sub-pixels RP, GP, and BP, cathode electrodes CTD respectively corresponding to the sub-pixels RP, GP, and BP, and respectively spaced apart from the anode electrodes AND, and the cathode line CTL connected to the cathode electrodes CTD.

The cathode line CTL may be connected to the third power line VSL to which the third power voltage VSS (see FIG. 5) is applied. For example, the cathode line CTL may be connected to the third power line VSL through a contact hole (not shown) disposed in the non-display area NDA and penetrating the organic layer under the sixth conductive layer. However, this is only an example, and the cathode line CTL may include arrangement and connection for satisfying a condition in which the third power voltage VSS is applied.

For example, the cathode line CTL may be disposed in the entire display area DA except the anode electrode AND and the cathode electrode CTD disposed in part of each of the sub-pixels RP, GP, and BP. In each of the sub-pixels RP, GP, and BP, the cathode electrode CTD may be formed as part of the cathode line CTL protruding in the second direction DR2 to be arranged side by side with (or alongside) the anode electrode AND in the first direction DR1.

The anode electrode AND is spaced apart from the cathode line CTL and the cathode electrode CTD.

Further, in the first direction DR1, the cathode electrode CTD may be spaced apart from the cathode line CTL.

Referring to FIG. 24, the seventh conductive layer disposed on at least part of the sixth conductive layer may include anode pads ANDP respectively covering the anode electrodes AND, cathode pads CTDP respectively covering the cathode electrodes CTD, and a cathode line pad CTLP covering at least part of the cathode line CTL. The anode pads ANDP may have a width greater than that of the anode electrodes AND to cover the top surfaces and the side surfaces of the anode electrodes AND.

The cathode pads CTDP may have a width greater than that of the cathode electrodes CTD to cover the top surfaces and the side surfaces of the cathode electrodes CTD.

The cathode line pad CTLP may cover the edges of the cathode line CTL respectively facing the anode electrodes AND and the cathode electrodes CTD. For example, the cathode line pad CTLP may cover the top surfaces and the side surface of the edges of the cathode line CTL.

In each of the sub-pixels RP, GP, and BP, the cathode line pad CTLP is spaced apart from the anode pad ANDP. Accordingly, it is possible to prevent short circuit failure between the anode electrode AND and the cathode line CTL by the cathode line pad CTLP.

In each of the sub-pixels RP, GP, and BP, the cathode line pad CTLP corresponds to the boundary between each of the anode electrode AND and the cathode electrode CTD and the cathode line CTL. For example, the cathode line pad CTLP covers the edges of the cathode line CTL corresponding to the boundary between each of the anode electrode AND and the cathode electrode CTD and the cathode line CTL.

Accordingly, in each of the sub-pixels RP, GP, and BP, the cathode line pad CTLP may form a closed loop shape together with at least part of the edge of the cathode pad CTDP.

For example, the inner edge of the cathode line pad CTLP corresponding to the boundary between each of the anode electrode AND and the cathode electrode CTD and the cathode line CTL may be connected to part of the edge of the cathode pad CTDP to form a closed loop shape.

Figure 25:
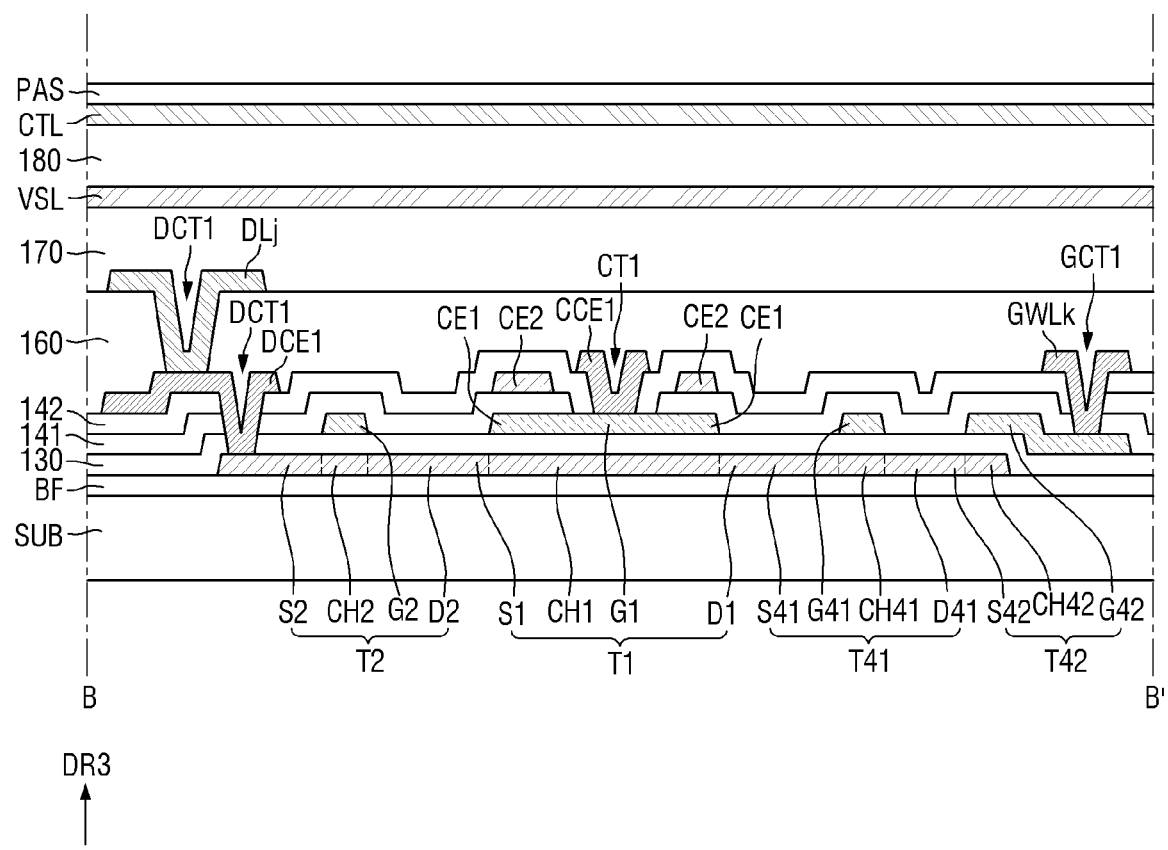
FIG. 25 is a schematic cross-sectional view illustrating an example of a display panel taken along line B-B' of FIG. 18.
Figure 26:
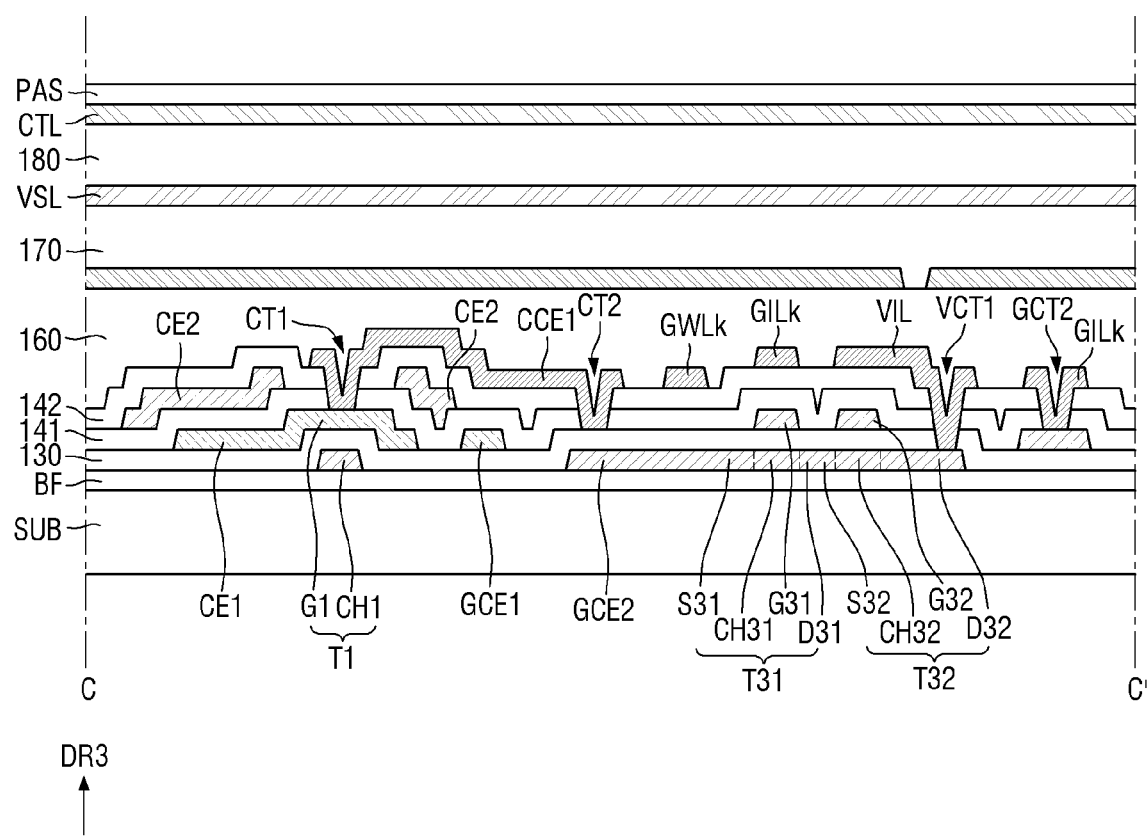
FIG. 26 is a schematic cross-sectional view illustrating an example of a display panel taken along line C-C' of FIG. 18.
Figure 27:
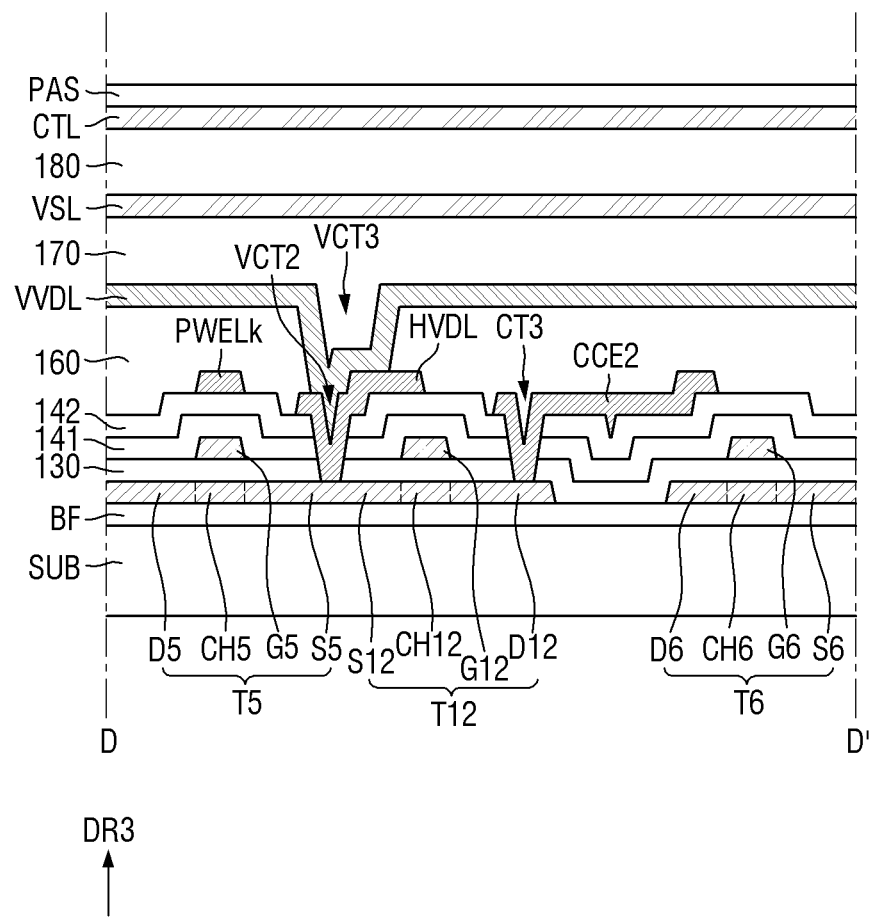
FIG. 27 is a schematic cross-sectional view illustrating an example of a display panel taken along line D-D' of FIG. 18.
Figure 28:
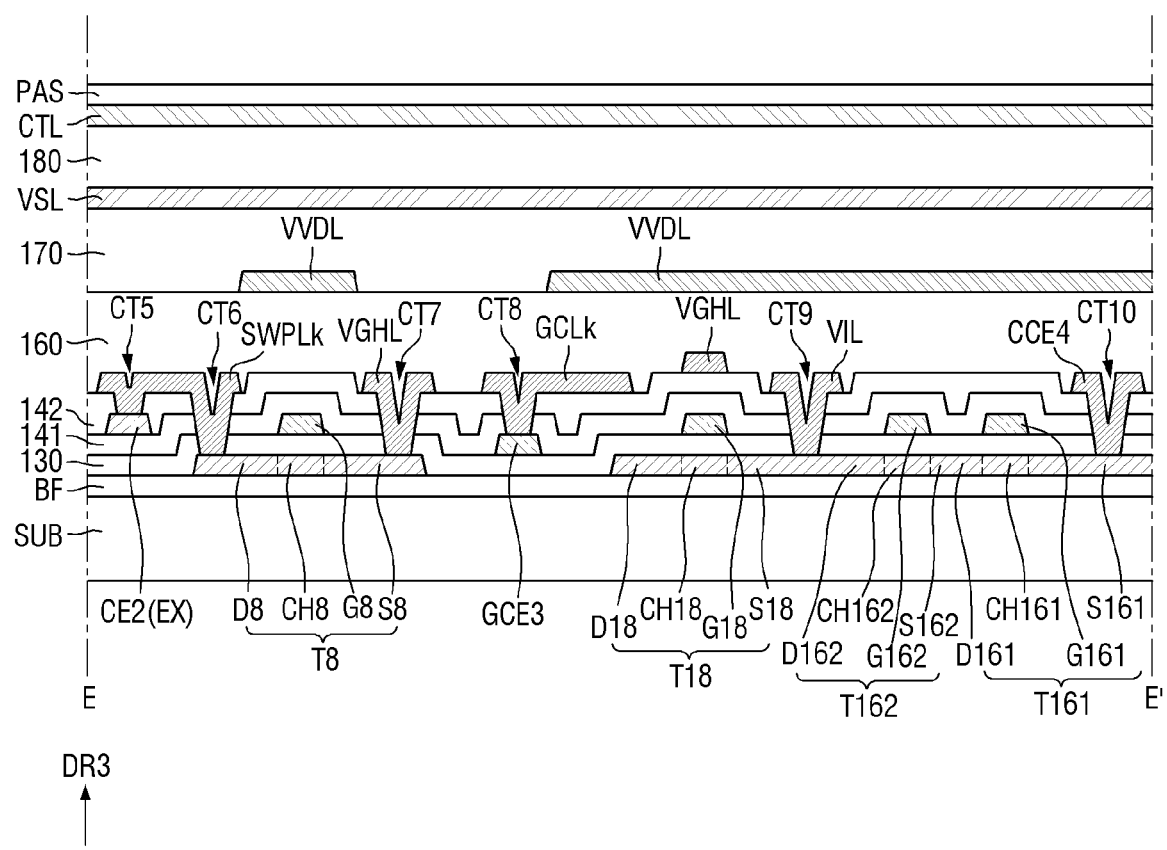
FIG. 28 is a schematic cross-sectional view illustrating an example of a display panel taken along line E-E' of FIG. 18.
Figure 29:
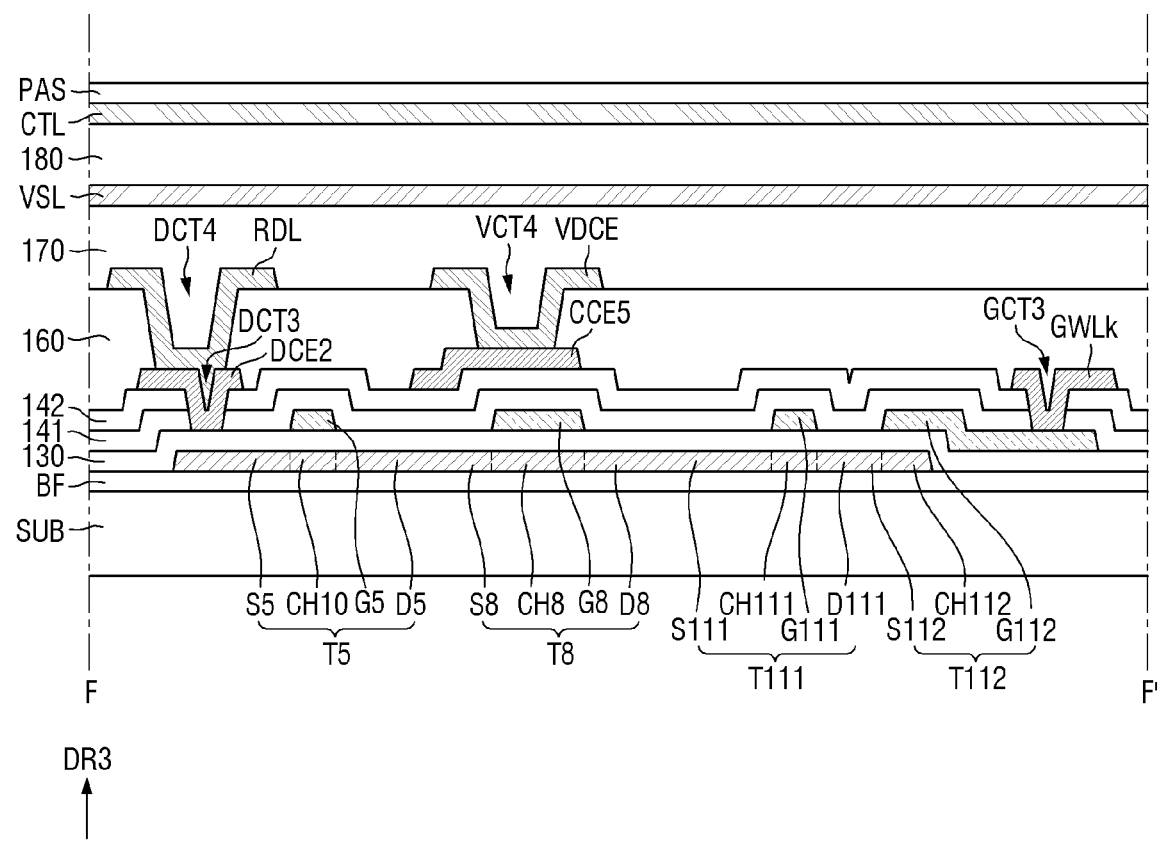
FIG. 29 is a schematic cross-sectional view illustrating an example of a display panel taken along line F-F' of FIG. 18.
Figure 30:
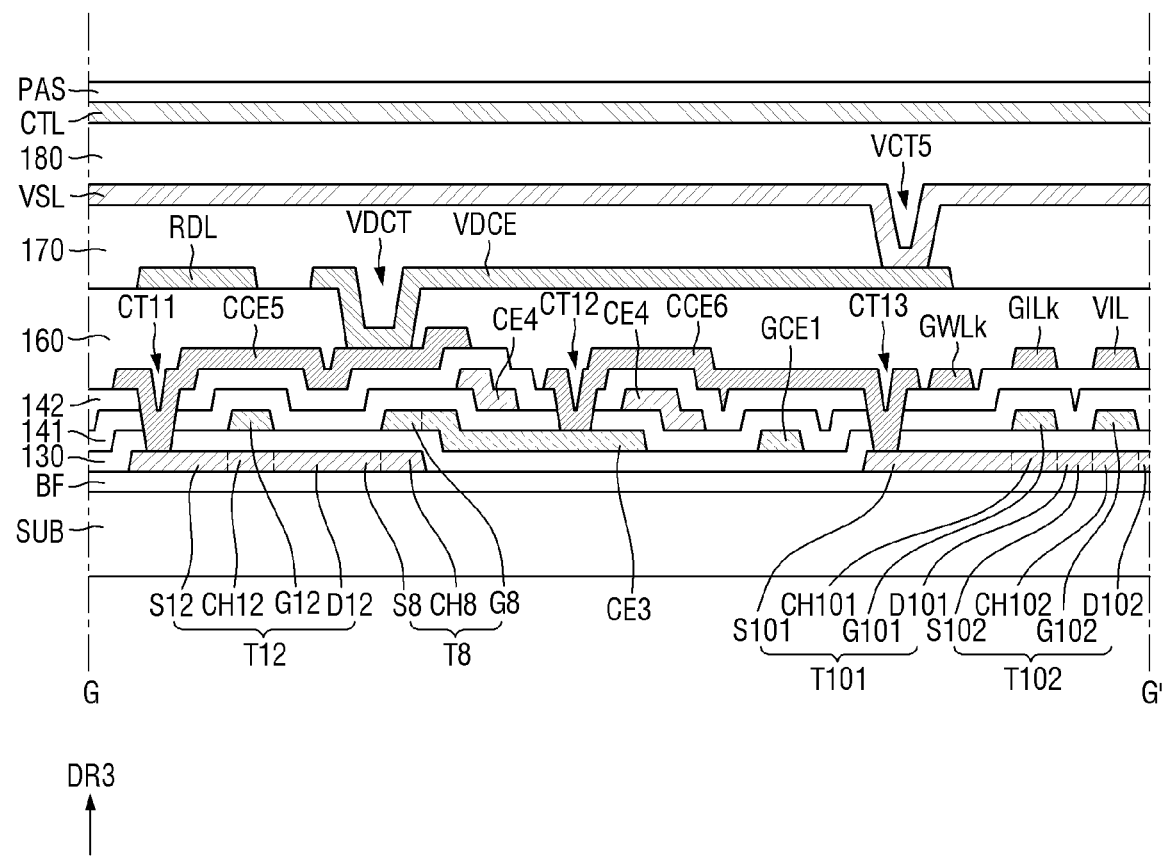
FIG. 30 is a schematic cross-sectional view illustrating an example of a display panel taken along line G-G' of FIG. 18.
Figure 31:
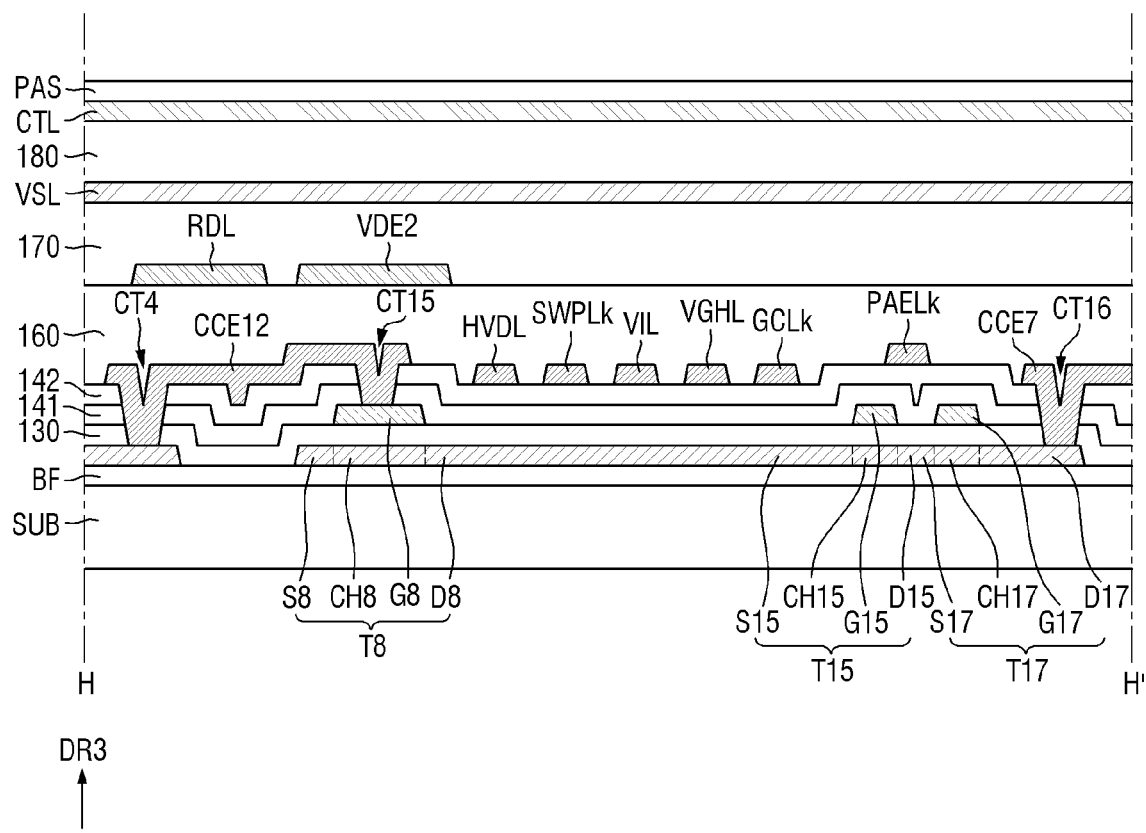
FIG. 31 is a schematic cross-sectional view illustrating an example of a display panel taken along line H-H' of FIG. 18.
Figure 32:
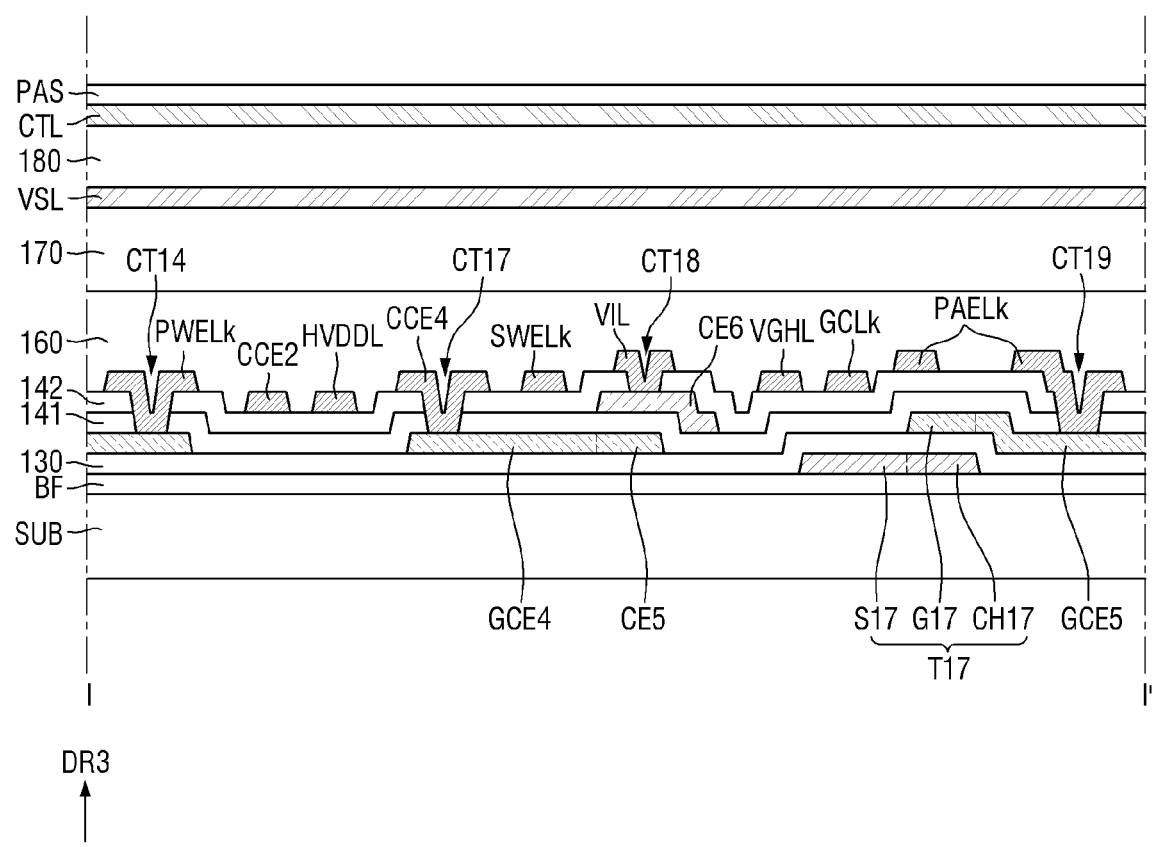
FIG. 32 is a schematic cross-sectional view illustrating an example of a display panel taken along line I-I' of FIG. 18.
Figure 33:
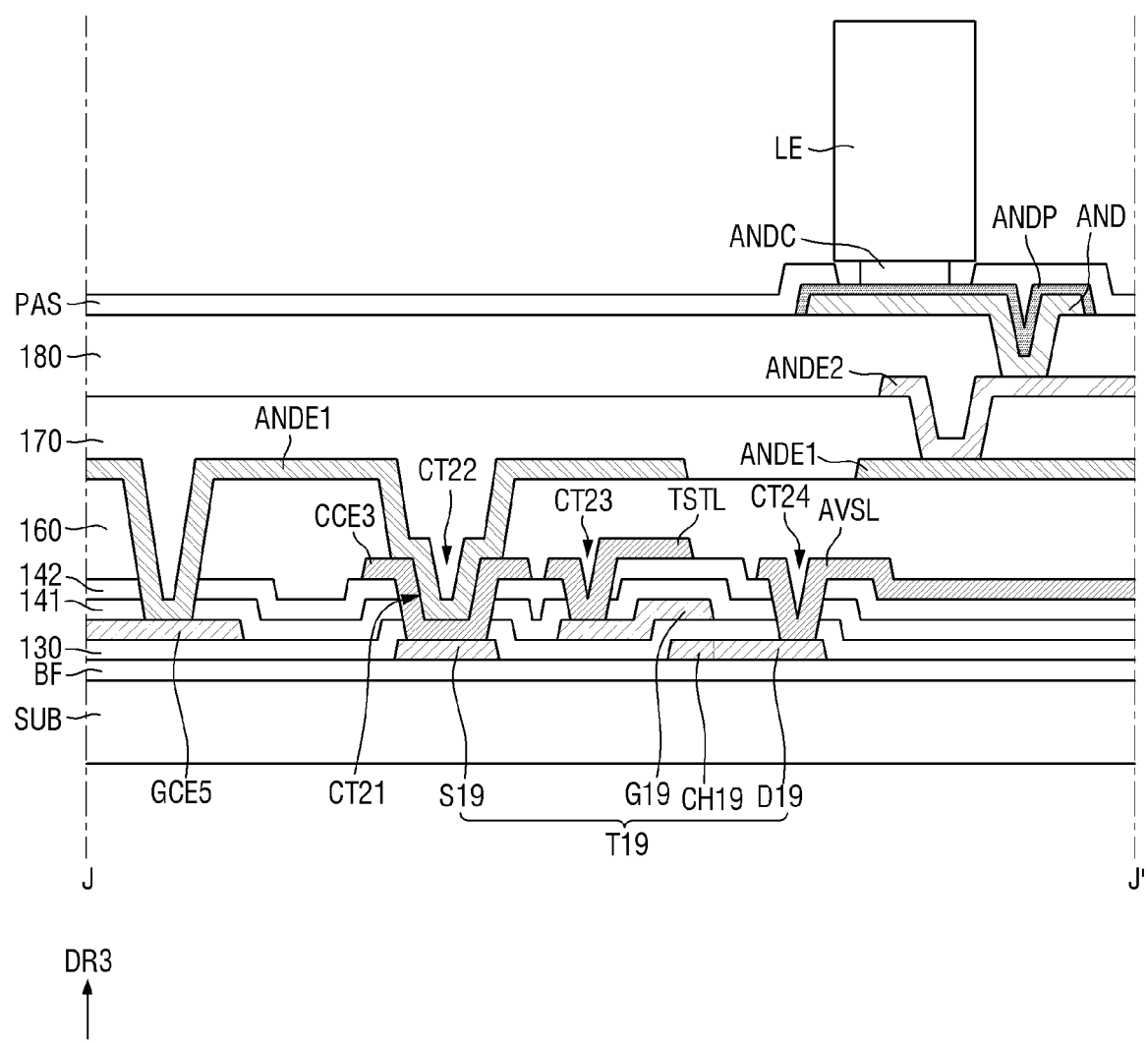
FIG. 33 is a schematic cross-sectional view illustrating an example of a display panel taken along line J-J' of FIG. 18.
Figure 34:
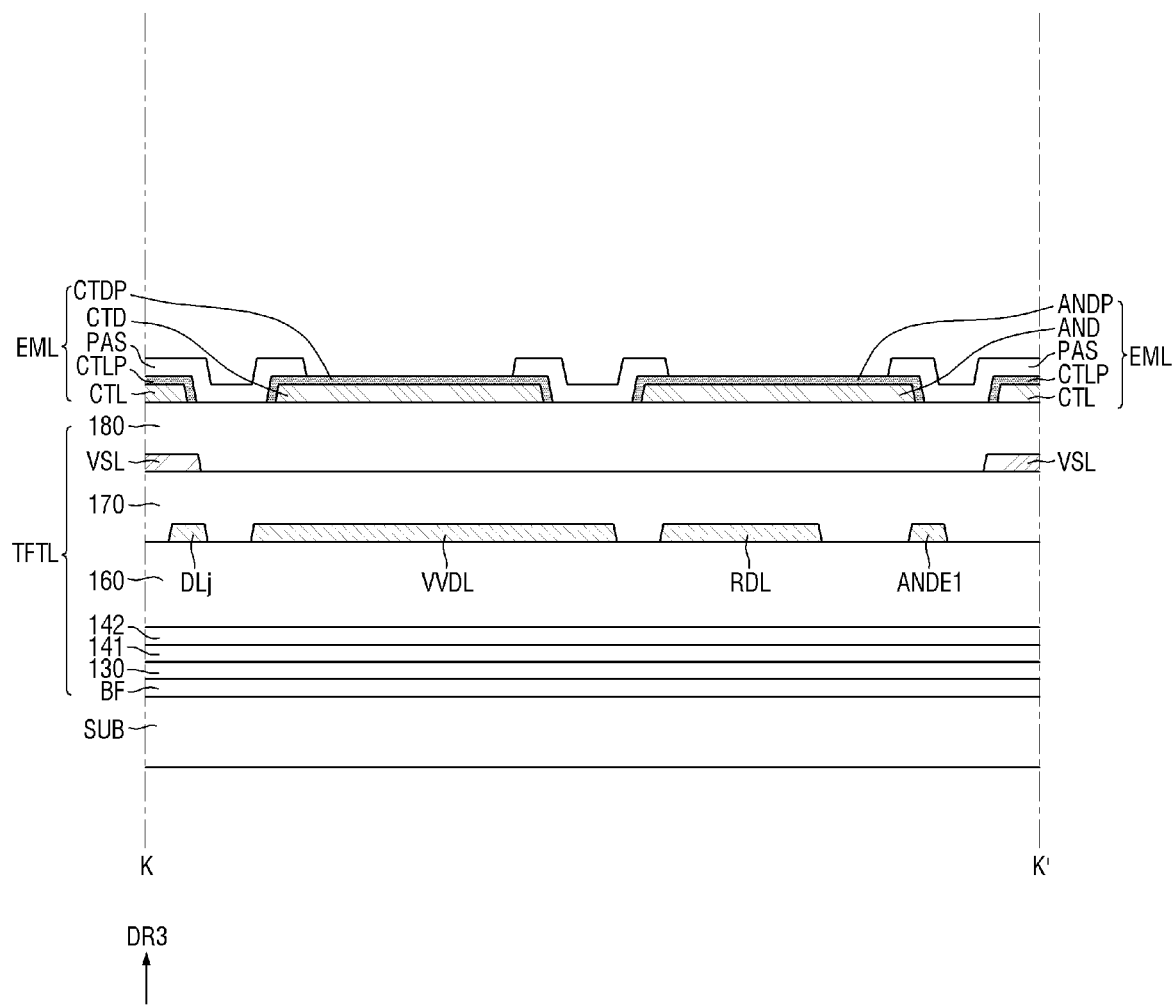
FIGS. 34 and 35 are schematic cross-sectional views illustrating an example of a display panel taken along line K-K' of FIGS. 18, 22 and 24.
Figure 35:
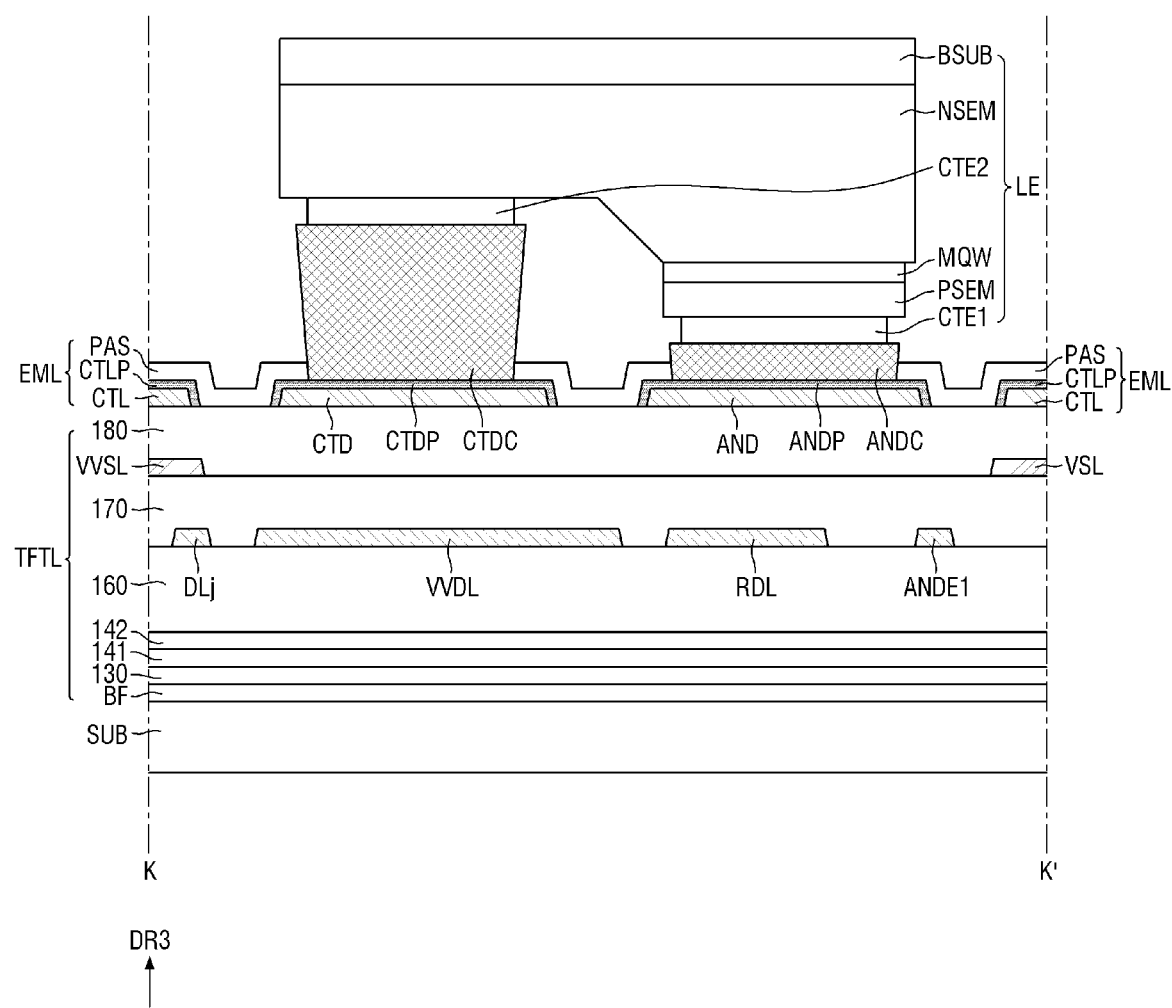

FIG. 25 is a schematic cross-sectional view illustrating an example of a display panel taken along line B-B' of FIG. 18.
FIG. 26 is a schematic cross-sectional view illustrating an example of a display panel taken along line C-C' of FIG. 18.
FIG. 27 is a schematic cross-sectional view illustrating an example of a display panel taken along line D-D' of FIG. 18.
FIG. 28 is a schematic cross-sectional view illustrating an example of a display panel taken along line E-E' of FIG. 18.
FIG. 29 is a schematic cross-sectional view illustrating an example of a display panel taken along line F-F' of FIG. 18.
FIG. 30 is a schematic cross-sectional view illustrating an example of a display panel taken along line G-G' of FIG. 18.
FIG. 31 is a schematic cross-sectional view illustrating an example of a display panel taken along line H-H' of FIG. 18.
FIG. 32 is a schematic cross-sectional view illustrating an example of a display panel taken along line I-I' of FIG. 18.
FIG. 33 is a schematic cross-sectional view illustrating an example of a display panel taken along line J-J' of FIG. 18.
FIGS. 34 and 35 are schematic cross-sectional views illustrating an example of a display panel taken along line K-K' of FIGS. 18, 22 and 24.

Referring to FIGS. 25 to 35, a buffer layer BF may be disposed on the substrate SUB.

The substrate SUB may be formed of an insulating material such as polymer resin and glass.

For example, the substrate SUB may be formed of polymer resin such as polyimide. The substrate SUB may be a flexible substrate which can be bent, folded or rolled.

The buffer layer BF is an insulating layer for protecting transistors of the thin film transistor layer TFTL and the light emitting element LE of the light emitting element layer EML from moisture permeating through the substrate SUB which is susceptible to moisture permeation.

The buffer layer BF may be formed as inorganic layers that are alternately stacked each other. For example, the buffer layer BF may be formed as multiple layers in which one or more inorganic layers of a silicon nitride layer, a silicon oxynitride layer, a silicon oxide layer, a titanium oxide layer and an aluminum oxide layer are alternately stacked each other.

An active layer may be disposed on the buffer layer BF. The active layer includes the first to nineteenth channels CH1 to CH19, the first to nineteenth source electrodes S1 to S19, and the first to nineteenth drains D1 to D19 of the first to nineteenth transistors T1 to T19.

The active layer may include polycrystalline silicon, monocrystalline silicon, low-temperature polycrystalline silicon, amorphous silicon, or an oxide semiconductor.

The first to nineteenth channels CH1 to CH19 may overlap the first to nineteenth gate electrodes G1 to G19 in the third direction DR3, respectively. The first to nineteenth source electrodes S1 to S19 and the first to nineteenth drain electrodes D1 to D19 may not overlap the first to nineteenth gate electrodes G1 to G19 in the third direction DR3. The first to nineteenth source electrodes S1 to S19 and the first to nineteenth drain electrodes D1 to D19 may be conductive regions obtained by doping a silicon semiconductor or an oxide semiconductor with ions or impurities.

A gate insulating layer 130 may be disposed on the active layer. The gate insulating layer 130 may be formed as an inorganic layer, for example, a silicon nitride layer, a silicon oxynitride layer, a silicon oxide layer, a titanium oxide layer, or an aluminum oxide layer. The gate insulating layer 130 may be referred to as a first insulating layer.

The first conductive layer may be disposed on the gate insulating layer 130. The first conductive layer includes the first to nineteenth gate electrodes G1 to G19 of the first to nineteenth transistors T1 to T19, the first capacitor electrode CE1, the third capacitor electrode CE3, the fifth capacitor electrode CE5, and the first to fifth gate connection electrodes GCE1 to GCE5. The first to nineteenth gate electrodes G1 to G19, the first capacitor electrode CE1, the third capacitor electrode CE3, the fifth capacitor electrode CE5, and the first to fifth gate connection electrodes GCE1 to GCE5 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the first conductive layer. The first interlayer insulating layer 141 may be formed as an inorganic layer, for example, a silicon nitride layer, a silicon oxynitride layer, a silicon oxide layer, a titanium oxide layer, or an aluminum oxide layer. The first interlayer insulating layer 141 may be referred to as a second insulating layer.

The second conductive layer may be disposed on the first interlayer insulating layer 141. The second conductive layer may include the second capacitor electrode CE2, the fourth capacitor electrode CE4, and the sixth capacitor electrode CE6. The second conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Since the first interlayer insulating layer 141 has a dielectric constant (e.g. a predetermined or selectable dielectric constant), the first capacitor PC1 may be formed by the first capacitor electrode CE1, the second capacitor electrode CE2, and the first interlayer insulating layer 141 disposed therebetween. Further, the second capacitor PC2 may be formed by the third capacitor electrode CE3, the fourth capacitor electrode CE4, and the first interlayer insulating layer 141 disposed therebetween. The third capacitor PC3 may be formed by the fifth capacitor electrode CE5, the sixth capacitor electrode CE6, and the first interlayer insulating layer 141 disposed therebetween.

The second interlayer insulating layer 142 may be disposed on the second conductive layer. The second interlayer insulating layer 142 may be formed as an inorganic layer, for example, a silicon nitride layer, a silicon oxynitride layer, a silicon oxide layer, a titanium oxide layer, or an aluminum oxide layer. The second interlayer insulating layer 142 may be referred to as a third insulating layer.

The third conductive layer may be disposed on the second interlayer insulating layer 142. The third conductive layer may further include the initialization voltage lines VIL, the $k^{th}$ scan initialization line GILk, the $k^{th}$ scan write line GWLk, the $k^{th}$ PWM emission line PWELk, the first horizontal power line HVDL, the gate-off voltage line VGHL, the $k^{th}$ sweep signal line SWPLk, the $k^{th}$ scan control line GCLk, the $k^{th}$ PAM emission line PAELk, the test signal line TSTL, and the third power auxiliary line AVSL.

Further, the third conductive layer may include the first and second data connection electrodes DCE1 and DCE2 and the first to eighth connection electrodes CCE1 to CCE8.

The third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $k^{th}$ scan write line GWLk may be connected to the first gate electrode GCE1 through the first gate contact hole GCT1 and the third gate contact hole GCT3 penetrating the first interlayer insulating layer 141 and the second interlayer insulating layer 142. The $k^{th}$ scan initialization line GILk may be connected to the second gate connection electrode GCE2 through the second gate contact hole GCT2 penetrating the first interlayer insulating layer 141 and the second interlayer insulating layer 142. The $k^{th}$ PWM emission line PWELk may be connected to the third gate connection electrode GCE3 through the fourteenth contact hole CT14 penetrating the first interlayer insulating layer 141 and the second interlayer insulating layer 142. The $k^{th}$ scan control line GCLk may be connected to the fourth gate connection electrode GCE4 through the eighth contact hole CT8 penetrating the first interlayer insulating layer 141 and the second interlayer insulating layer 142. The $k^{th}$ PAM emission line PAELk may be connected to the fifth gate connection electrode GCE5 through the nineteenth contact hole CT19 penetrating the first interlayer insulating layer 141 and the second interlayer insulating layer 142.

The initialization voltage line VIL may be connected to the second sub-drain electrode D32 and the sixth sub-drain electrode D102 through the first power contact hole VCT1 penetrating the gate insulating layer 130, the first interlayer insulating layer 141, and the second interlayer insulating layer 142. The initialization voltage line VIL may be connected to the tenth sub-drain electrode D162 and the eighteenth drain electrode D18 through the ninth contact hole CT9 penetrating the gate insulating layer 130, the first interlayer insulating layer 141, and the second interlayer insulating layer 142. The initialization voltage line VIL may be connected to the sixth capacitor electrode CE6 through the eighteenth contact hole CT18 penetrating the second interlayer insulating layer 142. The first horizontal power line HVDL may be connected to the fifth source electrode S5 and the thirteenth source electrode S13 through the second power contact hole VCT2 penetrating the gate insulating layer 130, the first interlayer insulating layer 141, and the second interlayer insulating layer 142. The gate-off voltage line VGHL may be connected to the seventh source electrode S7 through the seventh contact hole CT7 penetrating the gate insulating layer 130, the first interlayer insulating layer 141, and the second interlayer insulating layer 142. The test signal line TSTL may be connected to the nineteenth gate electrode G19 through the twenty-third contact hole CT23 penetrating the first interlayer insulating layer 141 and the second interlayer insulating layer 142. The third power line VSL may be connected to the nineteenth drain electrode D19 through the twenty-fourth contact hole CT24 penetrating the gate insulating layer 130, the first interlayer insulating layer 141, and the second interlayer insulating layer 142.

The first data connection electrode DCE1 may be connected to the second source electrode S2 through the first data contact hole DCT1 penetrating the gate insulating layer 130, the first interlayer insulating layer 141, and the second interlayer insulating layer 142. The second data connection electrode DCE2 may be connected to the ninth source electrode S9 through the third data contact hole DCT3 penetrating the gate insulating layer 130, the first interlayer insulating layer 141, and the second interlayer insulating layer 142.

The first connection electrode CCE1 may be connected to the first gate electrode G1 through the first contact hole CT1 penetrating the first interlayer insulating layer 141 and the second interlayer insulating layer 142, and may be connected to the first sub-source electrode S31 and the fourth sub-drain electrode D42 through the second contact hole CT2 penetrating the gate insulating layer 130, the first interlayer insulating layer 141, and the second interlayer insulating layer 142.

The second connection electrode CCE2 may be connected to the seventeenth drain electrode D17 through the third contact hole CT3 penetrating the gate insulating layer 130, the first interlayer insulating layer 141, and the second interlayer insulating layer 142, may be connected to the fourteenth drain electrode D14 through the fourth contact hole CT4 penetrating the gate insulating layer 130, the first interlayer insulating layer 141, and the second interlayer insulating layer 142, and may be connected to the fourth capacitor electrode CE4 through the fifteenth contact hole CT15 penetrating the second interlayer insulating layer 142.

The fourth connection electrode CCE4 may be connected to the sixth drain electrode D6 through the tenth contact hole CT10 penetrating the gate insulating layer 130, the first interlayer insulating layer 141, and the second interlayer insulating layer 142, and may be connected to the fourth gate connection electrode GCE4 through the seventeenth contact hole CT17 penetrating the first interlayer insulating layer 141 and the second interlayer insulating layer 142.

The fifth connection electrode CCE5 may be connected to the twelfth source electrode S12 and the fourteenth source electrode S14 through the eleventh contact holes CT11 penetrating the gate insulating layer 130, the first interlayer insulating layer 141, and the second interlayer insulating layer 142.

The sixth connection electrode CCE6 may be connected to the eighth gate electrode G8 through the twelfth contact hole CT12 penetrating the first interlayer insulating layer 141 and the second interlayer insulating layer 142, and may be connected to the fifth sub-source electrode S101 and the eighth sub-drain electrode D112 through the thirteenth contact hole CT13 penetrating the gate insulating layer 130, the first interlayer insulating layer 141, and the second interlayer insulating layer 142.

The seventh connection electrode CCE7 may be connected to the seventeenth drain electrode D17 and the eighteenth drain electrode D18 through the sixteenth contact holes CT16 penetrating the gate insulating layer 130, the first interlayer insulating layer 141, and the second interlayer insulating layer 142.

The eighth connection electrode CCE8 may be connected to the nineteenth source electrode S19 through the twenty-first contact hole CT21 penetrating the gate insulating layer 130, the first interlayer insulating layer 141, and the second interlayer insulating layer 142.

A first planarization layer 160 may be disposed on the third conductive layer. The first planarization layer 160 may be formed as an organic layer such as acryl resin, epoxy resin, phenolic resin, polyamide resin, polyimide resin and the like. The first planarization layer 160 may be referred to as a fourth insulating layer.

The fourth conductive layer may be disposed on the first planarization layer 160. The fourth conductive layer may include the $j^{th}$ data line DLj, the first vertical power line VVDL, and the first PAM data line RDL. Further, the fourth conductive layer may include a first anode connection electrode ANDE1 and a second power connection electrode VDCE. The fourth conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $j^{th}$ data line DLj may be connected to the first data connection electrode DCE1 through the second data contact hole DCT2 penetrating the first planarization layer 160. The first PAM data line RDL may be connected to the second data connection electrode DCE2 through the fourth data contact hole DCT4 penetrating the first planarization layer 160. The first vertical power line VVDL may be connected to the first horizontal power line HVDL through a third power contact hole VCT3 penetrating the first planarization layer 160. The third power contact hole VCT3 may overlap the second power contact hole VCT2 in the third direction DR3. The area of the third power contact hole VCT3 may be larger than the area of the second power contact hole VCT2.

The first anode connection electrode ANDE1 may be connected to the seventh connection electrode CCE7 through the twentieth contact hole CT20 penetrating the first planarization layer 160, and may be connected to the eighth connection electrode CCE8 through the twenty-second contact hole CT22 penetrating the first planarization layer 160. The second power connection electrode VDCE may be connected to the fifth connection electrode CCE5 through the fourth power contact hole VCT4 penetrating the first planarization layer 160.

A second planarization layer 170 may be disposed on the fourth conductive layer. The second planarization layer 170 may be formed as an organic layer such as acryl resin, epoxy resin, phenolic resin, polyamide resin, polyimide resin and the like. The second planarization layer 170 may be referred to as a fifth insulating layer.

The fifth conductive layer may be disposed on the second planarization layer 170. The fifth conductive layer may include the third power line VSL. The third power line VSL may be connected to the second power connection electrode VDCE through a fifth power contact hole VCT5 penetrating the second planarization layer 170. The fifth conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third planarization layer 180 may be disposed on the fifth conductive layer. The third planarization layer 180 may be formed as an organic layer such as acryl resin, epoxy resin, phenolic resin, polyamide resin, polyimide resin and the like. The third planarization layer 180 may be referred to as a sixth insulating layer.

As shown in FIG. 34, the sixth conductive layer may be disposed on the third planarization layer 180. The sixth conductive layer includes the anode electrode AND, the cathode electrode CTD, and the cathode line CTL.

Although not separately illustrated, the sixth conductive layer may further include a second sub power line and a third sub power line.

The sixth conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. For example, the sixth conductive layer may include a metal material having high reflectivity, such as a stacked structure (Ti/Al/Ti) of aluminum and titanium, a stacked structure (ITO/Al/ITO) of aluminum and ITO, and a stacked structure (ITO/APC/ITO) of an APC alloy and ITO. As another example, the sixth conductive layer may be formed as a double layer structure of Al/Ti.

The anode electrode AND corresponds to each of the sub-pixels RP, GP, and BP.

The cathode electrode CTD corresponds to each of the sub-pixels RP, GP, and BP and is spaced apart from the anode electrode AND.

The cathode line CTL is connected to the cathode electrode CTD of each of the sub-pixels RP, GP, and BP.

The seventh conductive layer may be disposed on at least part of the sixth conductive layer.

The seventh conductive layer may include the anode pad ANDP covering the anode electrode AND, the cathode pad CTDP covering the cathode electrode CTD, and the cathode line pad CTLP covering at least part of the cathode line CTL.

The seventh conductive layer may be made of a transparent conductive material (TCO) such as ITO or IZO.

In each of the sub-pixels RP, GP, and BP, the anode pad ANDP is disposed on the anode electrode AND and covers the top surface and the side surfaces of the anode electrode AND. The anode pad ANDP is disposed to completely cover the side surfaces of the anode electrode AND, so that the edges of the anode pad ANDP may contact the third planarization layer 180 disposed under the anode electrode AND.

Similarly, in each of the sub-pixels RP, GP, and BP, the cathode pad CTDP is disposed on the cathode electrode CTD and covers the top surface and the side surfaces of the cathode electrode CTD. The cathode pad CTDP is disposed to completely cover the side surfaces of the cathode electrode CTD, so that the edges of the cathode pad CTDP may contact the third planarization layer 180 disposed under the cathode electrode CTD.

The cathode line pad CTLP may cover the edges of the cathode line CTL respectively facing the anode electrode AND and the cathode electrode CTD.

The cathode line pad CTLP is disposed on the edge of the cathode line CTL, and covers the top surface and the side surface of the edge of the cathode line CTL. The cathode line pad CTLP is disposed to completely cover the side surface of the edge of the cathode line CTL, so that the edge of the cathode line pad CTLP may contact the third planarization layer 180 disposed under the cathode line CTL.

Accordingly, damage to the edges of the anode electrode AND, the cathode electrode CTD, and the cathode line CTL due to a patterning process for an inorganic material disposed on the seventh conductive layer may be prevented by the seventh conductive layer.

The passivation layer PAS may be disposed on the seventh conductive layer. The passivation layer PAS may be formed as a silicon nitride layer, a silicon oxynitride layer, a silicon oxide layer, a titanium oxide layer, or an aluminum oxide layer.

The passivation layer PAS may expose part of the central portion of the top surface of the anode pad ANDP and part of the central portion of the top surface of the cathode pad CTDP without covering them.

For example, the passivation layer PAS may cover the edges of the anode pad ANDP and the edges of the cathode pad CTDP, and may cover the cathode line CTL and the cathode line pad CTLP.

As shown in FIG. 35, the light emitting element LE may be disposed on the anode pad ANDP and the cathode pad CTDP that are not covered by the passivation layer PAS.

The anode pad ANDP may be connected to the first contact electrode CTE1 of the light emitting element LE through the anode contact electrode ANDC.

The cathode pad CTDP may be connected to the second contact electrode CTE2 of the light emitting element LE through the cathode contact electrode CTDC.

The anode contact electrode ANDC and the cathode contact electrode CTDC may be formed of a conductive adhesive material.

Since the light emitting element LE has been described above with reference to FIG. 4, redundant description thereof will be omitted.

As described above, in accordance with an embodiment, the top surface and the side surfaces of the anode electrode AND, the top surface and the side surfaces of the cathode electrode CTD, and the top surface and the side surface of the edge of the cathode electrode line CTL that are formed as the sixth conductive layer, are respectively completely covered with the anode pad ANDP, the cathode pad CTDP, and the cathode line pad CTLP that are formed as the seventh conductive layer, so that they may not be exposed to the patterning process. Accordingly, the generation of the undercut structure of the sixth conductive layer by the exposure to the patterning process may be prevented, which makes it possible to prevent the separation of the passivation layer PAS due to the undercut structure of the sixth conductive layer.

Specifically, in case that the sixth conductive layer includes a first layer of aluminum (Al), which is relatively susceptible to the patterning process, and a second layer of titanium (Ti) covering the first layer, the undercut structure may be generated between the first layer and the second layer in case that they are exposed to the patterning process.

Due to the undercut structure between the first layer and the second layer, a defect in which the side surfaces of the first layer are not completely covered with the passivation layer PAS may be easily caused at the time of arranging the passivation layer PAS covering the seventh conductive layer.

In particular, in case that the alignment error of the light emitting element LE occurs during the process of arranging the light emitting element LE in a state where the cathode line CTL is not covered with the passivation layer PAS, the first contact electrode CTE1 of the light emitting element LE contacts the cathode line CTL that is exposed without being covered with the passivation layer PAS, which may cause short circuit failure.

However, in accordance with an embodiment, the top surface and the side surfaces of the anode electrode AND, the top surface and the side surfaces of the cathode electrode CTD, and the top surface and the side surface of the edge of the cathode electrode line CTL are completely covered by the anode pad ANDP, the cathode pad CTDP and the cathode line pad CTLP, respectively. Therefore, during the seventh conductive layer patterning process for arranging the anode pad ANDP, the cathode pad CTDP, and the cathode line pad CTLP, the side surfaces of the edges of the anode electrode AND, the cathode electrode CTD, and the cathode electrode line CTL are not exposed to the patterning process, so that the deformation into the undercut structure may be prevented.

Accordingly, the separation of the passivation layer PAS due to the undercut structure may be prevented and, thus, the cathode line CTL may be completely covered with the passivation layer PAS, which makes it possible to prevent short circuit failure of the light emitting element LE.

FIGS. 34 and 35 illustrate that the anode pad ANDP, the cathode pad CTDP, and the cathode line pad CTLP extend on the edges of the anode electrode AND, the cathode electrode CTD, and the cathode line CTL to contact the third planarization layer 180, so that the side surfaces of the anode electrode AND, the side surfaces of the cathode electrode CTD, and the side surface of the edge of the cathode line CTL are completely covered.

However, this is only an example, and the side surfaces of the anode electrode AND, the side surfaces of the cathode electrode CTD, and the side surface of the edge of the cathode line CTL may be covered with the anode pad ANDP, the cathode pad CTDP and the cathode line pad CTLP, respectively, and the anode pad ANDP, the cathode pad CTDP, and the cathode line pad CTLP may be deformed in a range in which the cathode line pad CTLP is spaced apart from the anode pad ANDP.

Figure 36:
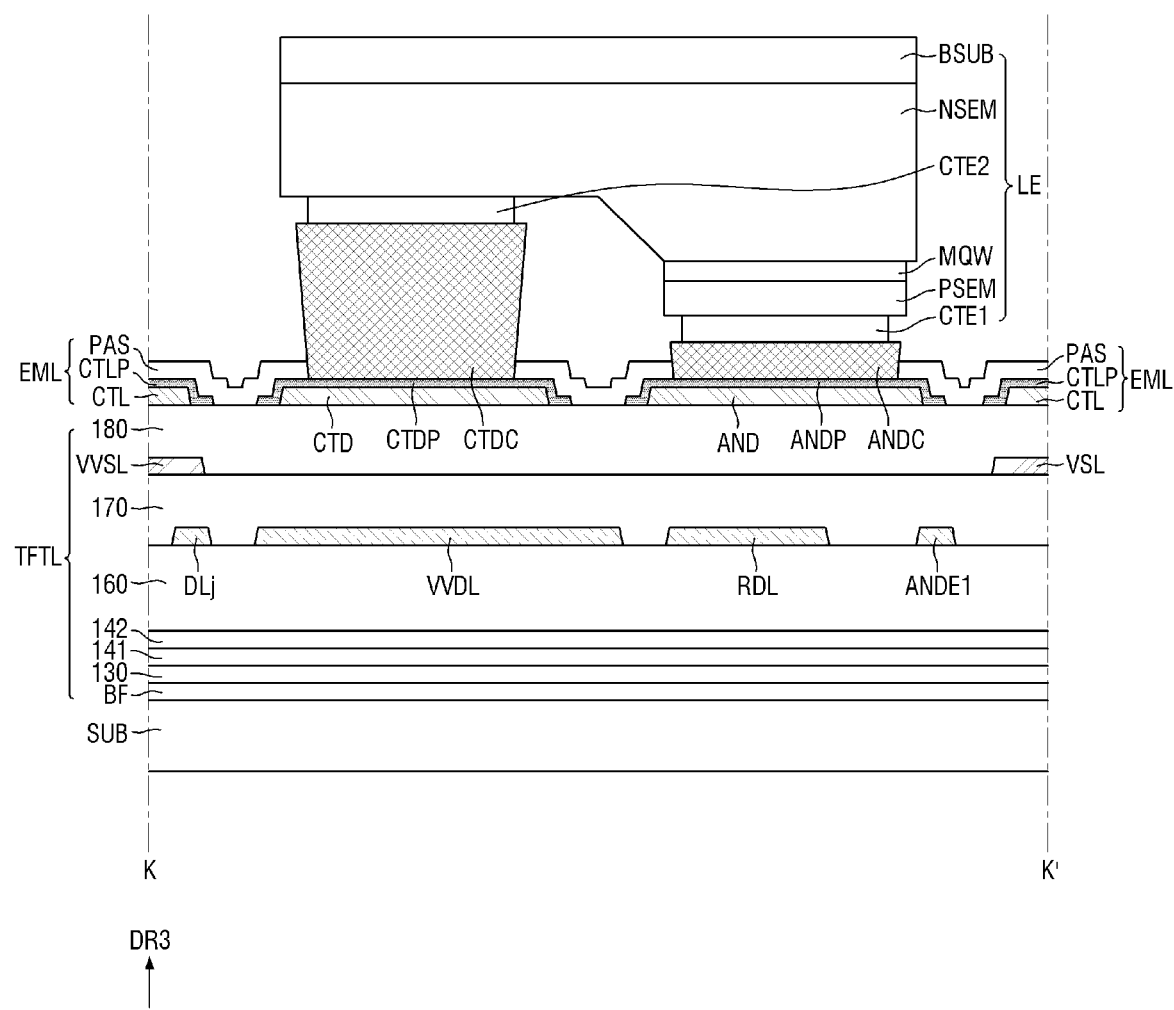
FIG. 36 is a schematic cross-sectional view illustrating another example of the display panel taken along line K-K' of FIGS. 18, 22, and 24.

FIG. 36 is a schematic cross-sectional view illustrating another example of the display panel taken along line K-K' of FIGS. 18, 22, and 24.

Referring to FIG. 36, each of the anode pad ANDP, the cathode pad CTDP, and the cathode line pad CTLP may extend onto the third planarization layer 180.

For example, the anode pad ANDP may further include a portion disposed on the third planarization layer 180 in addition to a portion covering the top surface of the anode electrode AND and portions covering the side surfaces of the anode electrode AND.

Similarly, the cathode pad CTDP may further include a portion disposed on the third planarization layer 180 in addition to a portion covering the top surface of the cathode electrode CTD and portions covering the side surfaces of the cathode electrode CTD.

Further, the cathode line pad CTLP may further include a portion disposed on the third planarization layer 180 in addition to a portion covering the top surface of the edge of the cathode line CTL and a portion covering the side surface of the edge of the cathode line CTL.

Accordingly, the anode pad ANDP, the cathode pad CTDP, and the cathode line pad CTLP are attached to the third planarization layer 180, so that the side surfaces of the anode electrode AND, the side surfaces of the cathode electrode CTD, and the side surface of the edge of the cathode line CTL may be more firmly covered with the anode pad ANDP, the cathode pad CTDP, and the cathode line pad CTLP, respectively, which makes it possible to further prevent the deformation into the undercut structure.

Examples of the cathode line pad CTLP will be described with reference to FIGS. 37 to 40.

Figure 37:
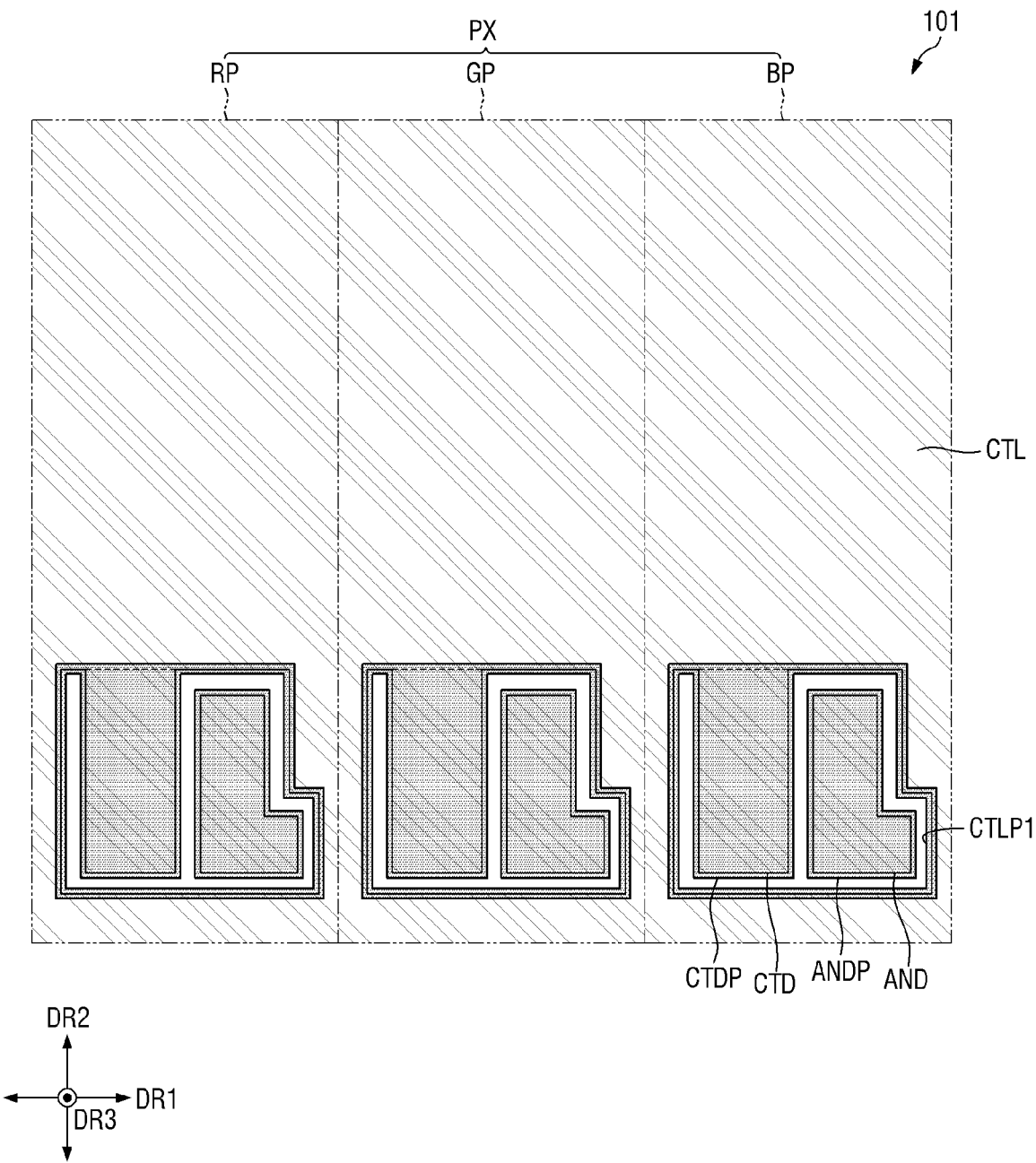
FIG. 37 is a schematic layout diagram illustrating sixth conductive layers and seventh conductive layers of sub-pixels arranged side by side in the first direction according to a first embodiment.

FIG. 37 is a schematic layout diagram illustrating sixth conductive layers and seventh conductive layers of sub-pixels arranged side by side in the first direction according to a first embodiment.

Referring to FIG. 37, a display panel 101 according to the first embodiment includes a cathode line pad CTLP1 corresponding to each of the sub-pixels RP, GP, and BP.

As described above with reference to FIGS. 1 and 5, the substrate SUB of the display panel 101 includes the display area DA where the sub-pixels RP, GP, and BP are arranged in the first direction DR1 and the second direction DR2.

As illustrated in FIGS. 2 and 37, pixels PX each including two or more sub-pixels RP, GP, and BP adjacent to each other in the first direction DR1 among the sub-pixels RP, GP, and BP may be provided.

As shown in FIG. 37, the anode electrodes AND and the cathode electrodes CTD of the sub-pixels adjacent to each other in the first direction DR1 among the sub-pixels RP, GP, and BP may be arranged side by side in the first direction DR1. Accordingly, the light emitting elements LE may be aligned more easily.

The cathode electrode CTD of each of the sub-pixels RP, GP, and BP may be provided in a pattern connected to the cathode line CTL. For example, the cathode electrode CTD may be formed as part of the cathode line CTL that protrudes side by side with the anode electrode AND in the first direction DR1.

The cathode line CTL and the cathode electrode CTD are spaced apart from the anode electrode AND.

As described above with reference to FIGS. 24, 34, 35 and 36, the cathode line pad CTLP1 according to a first embodiment corresponds to each of the sub-pixels RP, GP, and BP. Accordingly, the cathode line pads CTLP1 of the sub-pixels RP and GP (GP and BP) adjacent to each other in the first direction DR1 may be spaced apart from each other.

Figure 38:
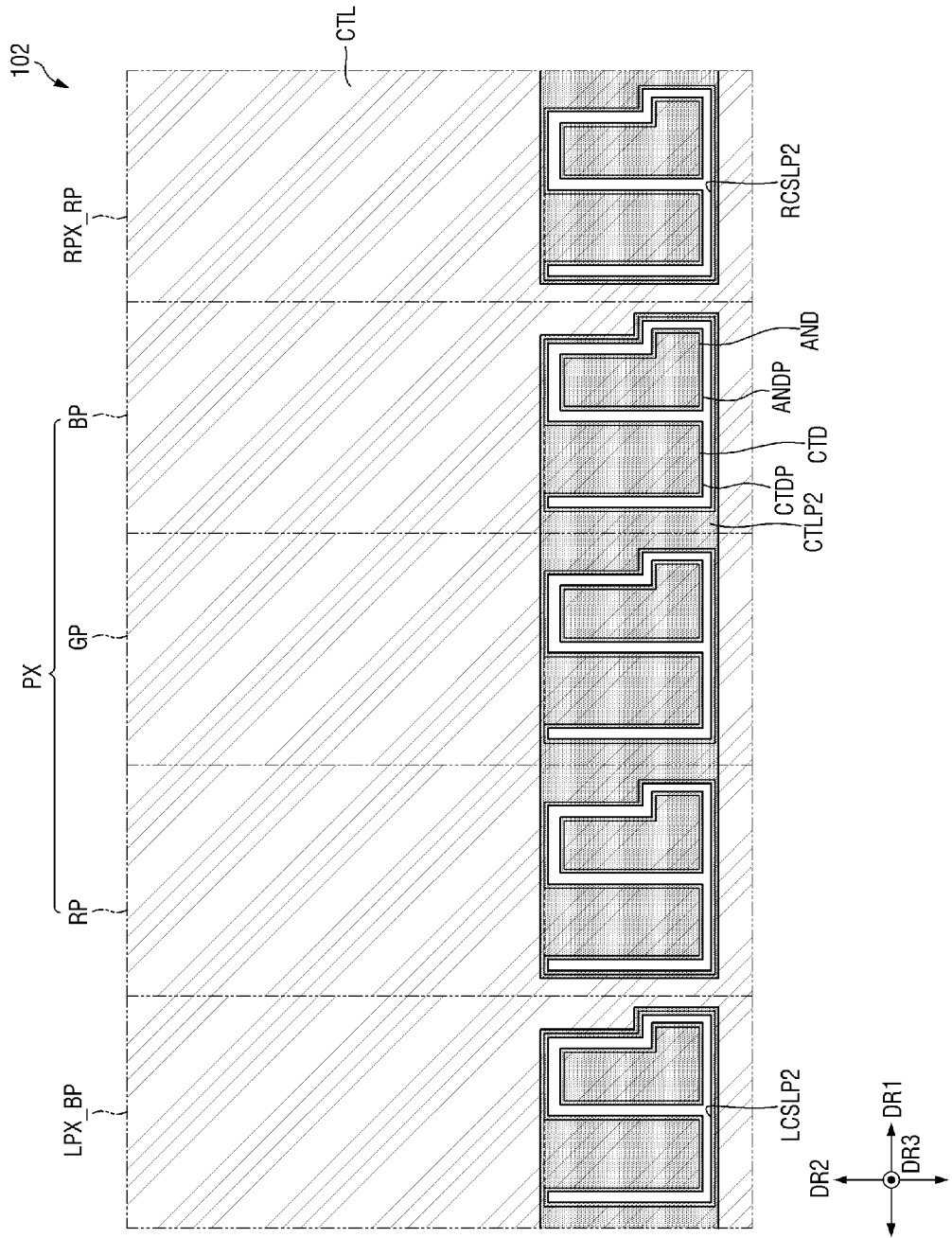
FIG. 38 is a schematic layout diagram illustrating sixth conductive layers and seventh conductive layers of sub-pixels arranged side by side in the first direction according to a second embodiment.

FIG. 38 is a schematic layout diagram illustrating sixth conductive layers and seventh conductive layers of sub-pixels arranged side by side in the first direction according to a second embodiment.

Referring to FIG. 38, a display panel 102 according to the second embodiment includes a cathode line pad CTLP2 corresponding to each of the pixels PX.

The cathode line pad CTLP2 according to the second embodiment is the same as the cathode line pad CTLP of the above-described embodiment except that it is further disposed at the boundary between two or more sub-pixels RP, GP, and BP corresponding to any one pixel PX and forming any one pixel PX, so that redundant description thereof will be omitted.

In accordance with the second embodiment, the cathode line pads CTLP2 of two or more sub-pixels RP, GP, and BP forming any one pixel PX are connected to each other in the first direction DR1.

Further, cathode line pads LCSLP2 and CTLP2 (RCSLP2 and CTLP2) of sub-pixels LPX_BP and RP (BP and RPX_RP) adjacent to each other in the first direction DR1 and corresponding to different pixels are spaced apart from each other.

For example, the third sub-pixel LPX_BP of another pixel adjacent to any one pixel PX on a side in the first direction DR1 is adjacent to the first sub-pixel RP of any one pixel PX in the first direction DR1. The cathode line pad LCSLP2 of the third sub-pixel LPX_BP of another pixel is spaced apart from the cathode line pad CTLP2 of the first sub-pixel RP of any one pixel PX.

Similarly, the first sub-pixel RPX_RP of still another pixel adjacent to any one pixel PX on another side in the first direction DR1 is adjacent to the third sub-pixel BP of any one pixel PX in the first direction DR1. The cathode line pad RCSLP2 of the first sub-pixel RPX_RP of still another pixel is spaced apart from the cathode line pad CTLP2 of the third sub-pixel BP of any one pixel PX.

Figure 39:
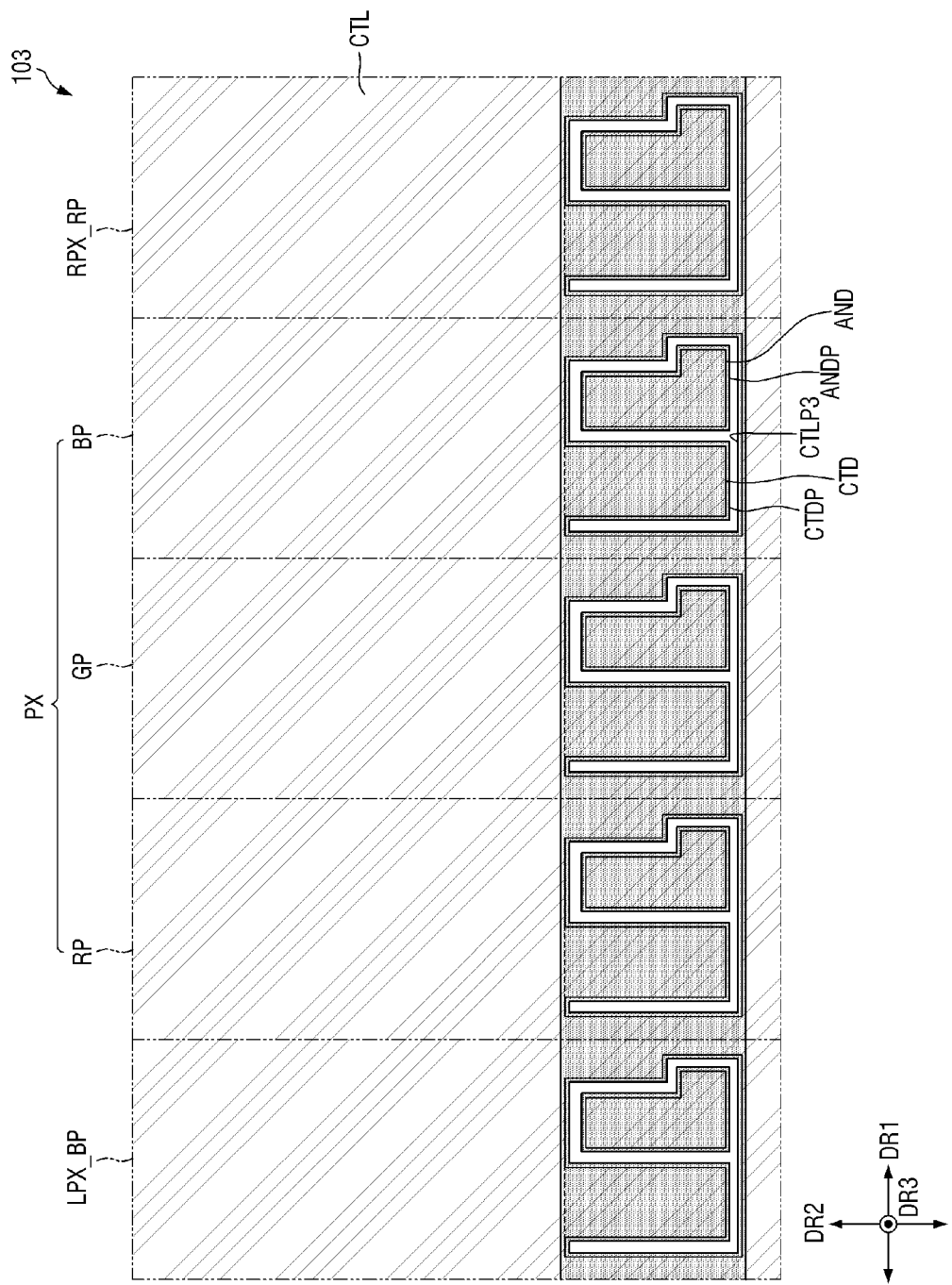
FIG. 39 is a schematic layout diagram illustrating sixth conductive layers and seventh conductive layers of sub-pixels arranged side by side in the first direction according to a third embodiment.

FIG. 39 is a schematic layout diagram illustrating sixth conductive layers and seventh conductive layers of sub-pixels arranged side by side in the first direction according to a third embodiment.

Referring to FIG. 39, a display panel 103 according to the third embodiment includes cathode line pads CTLP3 corresponding to sub-pixels adjacent to each other in a direction.

For example, the cathode line pads CTLP3 according to the third embodiment are the same as the cathode line pad CTLP of the above-described embodiment except that they are further disposed at the boundary between the sub-pixels LPX_BP and RP, RP and GP, GP and BP, and BP and RPX_RP adjacent to each other in the first direction DR1, so that redundant description thereof will be omitted.

In accordance with the third embodiment, the cathode line pads CTLP3 disposed between the sub-pixels LPX_BP and RP, RP and GP, GP and BP, and BP and RPX_BP adjacent to each other in the first direction DR1 are connected to each other in the first direction DR1.

Figure 40:
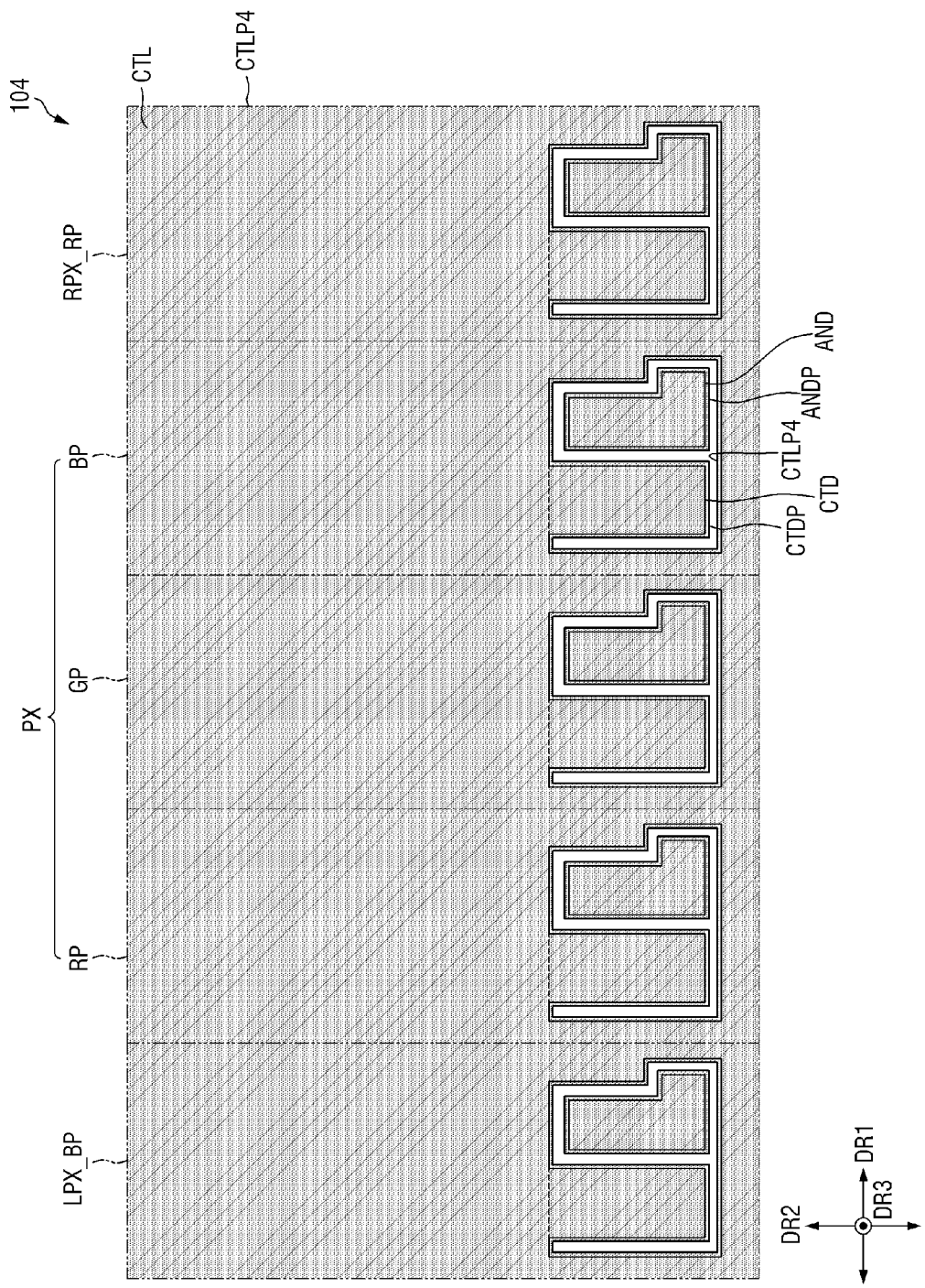
FIG. 40 is a schematic layout diagram illustrating sixth conductive layers and seventh conductive layers of sub-pixels arranged side by side in the first direction according to a fourth embodiment.

FIG. 40 is a schematic layout diagram illustrating sixth conductive layers and seventh conductive layers of sub-pixels arranged side by side in the first direction according to a fourth embodiment.

Referring to FIG. 40, a display panel 104 according to the fourth embodiment includes a cathode line pad CTLP4 covering the entire cathode line CTL.

For example, the cathode line pad CTLP4 according to the fourth embodiment is the same as the cathode line pad CTLP of the above-described embodiment except that it is disposed not only to cover the edges of the cathode line CTL, but also to completely cover the entire top surface of the cathode line CTL and the side surfaces of the edges of the cathode line CTL, so that redundant description thereof will be omitted.

The cathode line pads CTLP1, CTLP2, CTLP3, and CTLP4 shown in FIGS. 37 to 40 are only examples, and the planar shape of the cathode line pad CTLP may be variously changed in a range that satisfies the condition in which the side surface of the edge of the cathode line CTL is covered.

Figure 41:
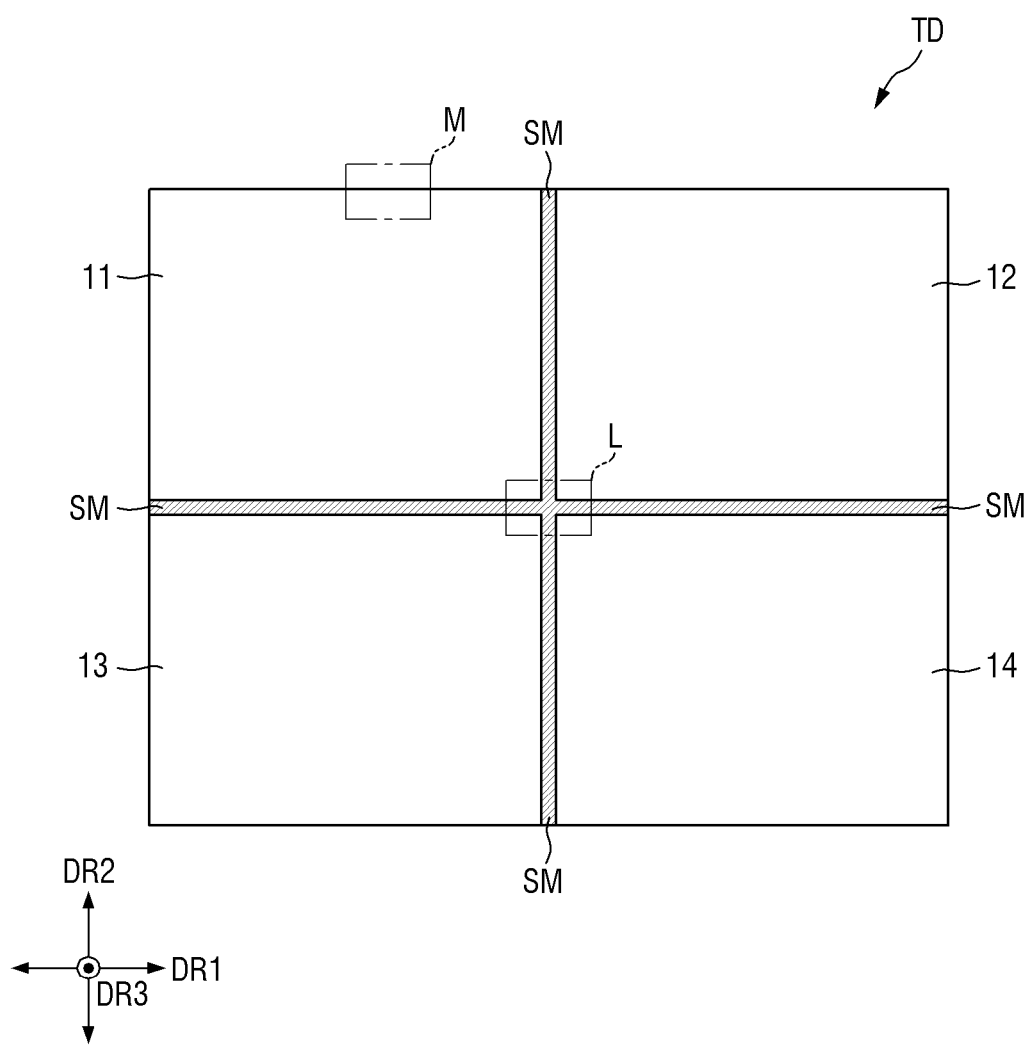
FIG. 41 is a schematic plan view illustrating a tiled display device including a plurality of display devices according to an embodiment.

FIG. 41 is a schematic plan view illustrating a tiled display device including display devices according to an embodiment.

Referring to FIG. 41, a tiled display device TD according to an embodiment may include display devices 11, 12, 13, and 14 arranged side by side in the first direction DR1 and the second direction DR2, and a seam SM disposed between the display devices 11, 12, 13, and 14.

For example, the tiled display device TD may include a first display device 11, a second display device 12, a third display device 13, and a fourth display device 14.

The display devices 11, 12, 13, and 14 may be arranged in a grid shape. The display devices 11, 12, 13, and 14 may be arranged in a matrix shape in M (M being a positive integer) rows and N (N being a positive integer) columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the display devices 11, 12, 13, and 14 in the tiled display device TD are not limited to those illustrated in FIG. 41. The number and arrangement of the display devices 11, 12, 13, and 14 in the tiled display device TD may be determined by the sizes of the display device 10 and the tiled display device TD and the shape of the tiled display device TD.

The display devices 11, 12, 13, and 14 may have a same size, but the disclosure is not limited thereto. For example, the display devices 11, 12, 13, and 14 may have different sizes.

Each of the display devices 11, 12, 13, and 14 may have a rectangular shape including long sides and short sides. The display devices 11, 12, 13, and 14 may be disposed such that the long sides or the short sides thereof are connected to each other. Some or all of the display devices 11, 12, 13, and 14 may be disposed at the edge of the tiled display device TD, and may form a side of the tiled display device TD. At least one of the display devices 11, 12, 13, and 14 may be disposed at at least one corner of the tiled display device TD, and may form two adjacent sides of the tiled display device TD. At least one of the display devices 11, 12, 13, and 14 may be surrounded by other display devices.

Each of the display devices 11, 12, 13, and 14 may be substantially the same as the display devices 10 of the embodiments described with reference to FIGS. 1 to 39. Therefore, a description of each of the display devices 11, 12, 13, and 14 will be omitted.

The seam SM may include a coupling member or an adhesive member. The display devices 11, 12, 13, and 14 may be connected to each other by the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 42:
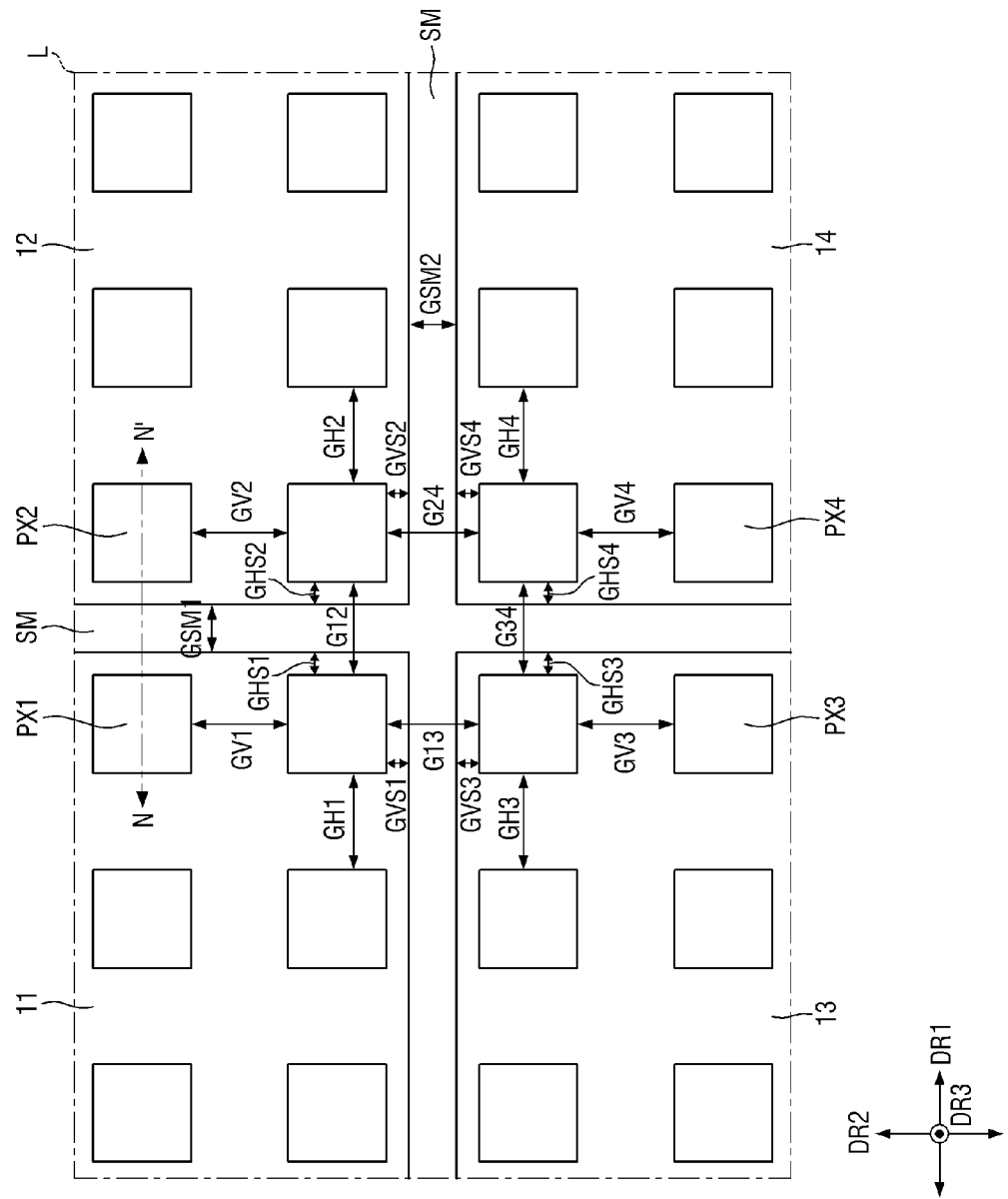
FIG. 42 is a schematic enlarged layout view illustrating area L of FIG. 41 in detail.

FIG. 42 is a schematic enlarged layout view illustrating area L of FIG. 41 in detail.

Referring to FIG. 42, the seam SM may have a shape of a cross or a plus sign in a plan view in a central region of the tiled display device TD in which the first display device 11, the second display device 12, the third display device 13, and the fourth display device 14 are adjacent to each other. The seam SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix form in the first direction DR1 and the second direction DR2 to display an image. The third display device 13 may include third pixels PX3 arranged in a matrix form in the first direction DR1 and the second direction DR2 to display an image. The fourth display device 14 may include fourth pixels PX4 arranged in a matrix form in the first direction DR1 and the second direction DR2 to display an image.

A minimum distance between the first pixels PX1 adjacent to each other in the first direction DR1 may be defined as a first horizontal separation distance GH1, and a minimum distance between the second pixels PX2 adjacent to each other in the first direction DR1 may be defined as a second horizontal separation distance GH2. The first horizontal separation distance GH1 and the second horizontal separation distance GH2 may be substantially the same.

The seam SM may be disposed between the first pixel PX1 and the second pixel PX2 adjacent to each other in the first direction DR1. A minimum distance G12 between the first pixel PX1 and the second pixel PX2 adjacent to each other in the first direction DR1 may be the sum of a minimum distance GHS1 between the first pixel PX1 and the seam SM in the first direction DR1, a minimum distance GHS2 between the second pixel PX2 and the seam SM in the first direction DR1, and a width GSM1 of the seam SM in the first direction DR1.

The minimum distance G12 between the first pixel PX1 and the second pixel PX2 adjacent to each other in the first direction DR1, the first horizontal separation distance GH1, and the second horizontal separation distance GH2 may be substantially the same. To this end, the minimum distance GHS1 between the first pixel PX1 and the seam SM in the first direction DR1 may be smaller than the first horizontal separation distance GH1, and the minimum distance GHS2 between the second pixel PX2 and the seam SM in the first direction DR1 may be smaller than the second horizontal separation distance GH2. The width GSM1 of the seam SM in the first direction DR1 may be smaller than the first horizontal separation distance GH1 or the second horizontal separation distance GH2.

A minimum distance between the third pixels PX3 adjacent to each other in the first direction DR1 may be defined as a third horizontal separation distance GH3, and a minimum distance between the fourth pixels PX4 adjacent to each other in the first direction DR1 may be defined as a fourth horizontal separation distance GH4. The third horizontal separation distance GH3 and the fourth horizontal separation distance GH4 may be substantially the same.

The seam SM may be disposed between the third pixel PX3 and the fourth pixel PX4 adjacent to each other in the first direction DR1. A minimum distance G34 between the third pixel PX3 and the fourth pixel PX4 adjacent to each other in the first direction DR1 may be the sum of a minimum distance GHS3 between the third pixel PX3 and the seam SM in the first direction DR1, a minimum distance GHS4 between the fourth pixel PX4 and the seam SM in the first direction DR1, and the width GSM1 of the seam SM in the first direction DR1.

The minimum distance G34 between the third pixel PX3 and the fourth pixel PX4 adjacent to each other in the first direction DR1, the third horizontal separation distance GH3, and the fourth horizontal separation distance GH4 may be substantially the same. To this end, the minimum distance GHS3 between the third pixel PX3 and the seam SM in the first direction DR1 may be smaller than the third horizontal separation distance GH3, and the minimum distance GHS4 between the fourth pixel PX4 and the seam SM in the first direction DR1 may be smaller than the fourth horizontal separation distance GH4. The width GSM1 of the seam SM in the first direction DR1 may be smaller than the third horizontal separation distance GH3 or the fourth horizontal separation distance GH4.

A minimum distance between the first pixels PX1 adjacent to each other in the second direction DR2 may be defined as a first vertical separation distance GV1, and a minimum distance between the third pixels PX3 adjacent to each other in the second direction DR2 may be defined as a third vertical separation distance GV3. The first vertical separation distance GV1 and the third vertical separation distance GV3 may be substantially the same.

The seam SM may be disposed between the first pixel PX1 and the third pixel PX3 adjacent to each other in the second direction DR2. A minimum distance G13 between the first pixel PX1 and the third pixel PX3 adjacent to each other in the second direction DR2 may be the sum of a minimum distance GVS1 between the first pixel PX1 and the seam SM in the second direction DR2, a minimum distance GVS3 between the third pixel PX3 and the seam SM in the second direction DR2, and a width GSM2 of the seam SM in the second direction DR2.

The minimum distance G13 between the first pixel PX1 and the third pixel PX3 adjacent to each other in the second direction DR2, the first vertical separation distance GV1, and the third vertical separation distance GV3 may be substantially the same. To this end, the minimum distance GVS1 between the first pixel PX1 and the seam SM in the second direction DR2 may be smaller than the first vertical separation distance GV1, and the minimum distance GVS3 between the third pixel PX3 and the seam SM in the second direction DR2 may be smaller than the third vertical separation distance GV3. The width GSM2 of the seam SM in the second direction DR2 may be smaller than the first vertical separation distance GV1 or the third vertical separation distance GV3.

A minimum distance between the second pixels PX2 adjacent to each other in the second direction DR2 may be defined as a second vertical separation distance GV2, and a minimum distance between the fourth pixels PX4 adjacent to each other in the second direction DR2 may be defined as a fourth vertical separation distance GV4. The second vertical separation distance GV2 and the fourth vertical separation distance GV4 may be substantially the same.

The seam SM may be disposed between the second pixel PX2 and the fourth pixel PX4 adjacent to each other in the second direction DR2. A minimum distance G24 between the second pixel PX2 and the fourth pixel PX4 adjacent to each other in the second direction DR2 may be the sum of a minimum distance GVS2 between the second pixel PX2 and the seam SM in the second direction DR2, a minimum distance GVS4 between the fourth pixel PX4 and the seam SM in the second direction DR2, and the width GSM2 of the seam SM in the second direction DR2.

The minimum distance G24 between the second pixel PX2 and the fourth pixel PX4 adjacent to each other in the second direction DR2, the second vertical separation distance GV2, and the fourth vertical separation distance GV4 may be substantially the same. To this end, the minimum distance GVS2 between the second pixel PX2 and the seam SM in the second direction DR2 may be smaller than the second vertical separation distance GV2, and the minimum distance GVS4 between the fourth pixel PX4 and the seam SM in the second direction DR2 may be smaller than the fourth vertical separation distance GV4. The width GSM2 of the seam SM in the second direction DR2 may be smaller than the second vertical separation distance GV2 or the fourth vertical separation distance GV4.

As shown in FIG. 42, in order to prevent the seam SM from being recognized between images displayed on the display devices 11, 12, 13, and 14, a minimum distance between pixels of adjacent display devices may be substantially the same as a minimum distance between pixels in each of the display devices.

Figure 43:
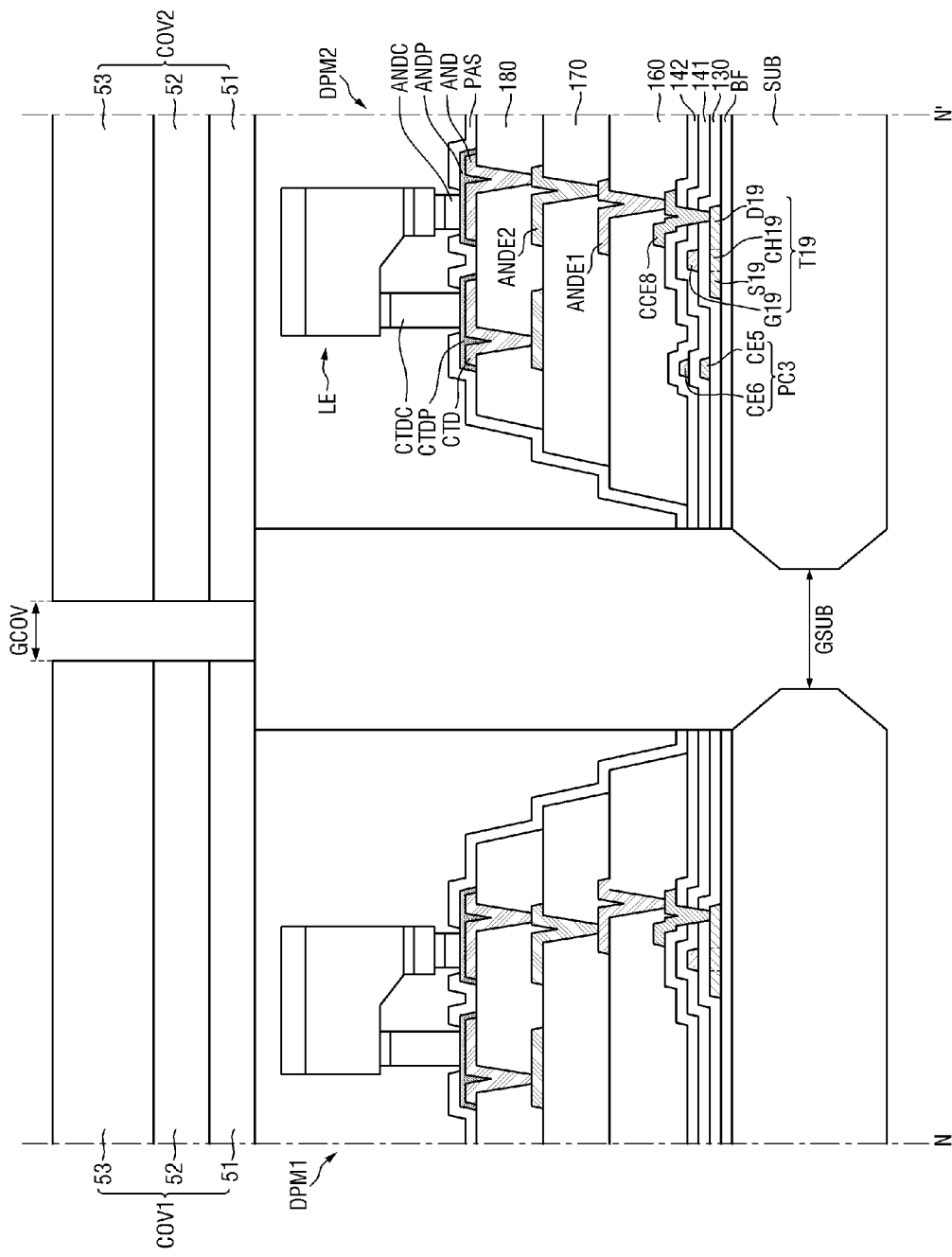
FIG. 43 is a schematic cross-sectional view illustrating an example of a tiled display device taken along line N-N' of FIG. 42.

FIG. 43 is a schematic cross-sectional view illustrating an example of a tiled display device taken along line N-N' of FIG. 42.

Referring to FIG. 43, the first display device 11 includes a first display module DPM1 and a first front cover COV1. The second display device 12 includes a second display module DPM2 and a second front cover COV2.

Each of the first display module DPM1 and the second display module DPM2 includes the substrate SUB, the thin film transistor layer TFTL, and the light emitting element layer EML. Since the thin film transistor layer TFTL and the light emitting element layer EML have already been described in detail with reference to FIGS. 1 to 40, redundant description thereof will be omitted.

The substrate SUB may include a first surface on which the thin film transistor layer TFTL is disposed, a second surface opposite to the first surface, and a first side surface disposed between the first surface and the second surface.

The first surface may be the front surface or the top surface of the substrate SUB, and the second surface may be the rear surface or the bottom surface of the substrate SUB.

Further, the substrate SUB may further include a chamfer surface that is disposed between the first surface and the first side surface and between the second surface and the first side surface and formed as an inclined surface.

The thin film transistor layer TFTL and the light emitting element layer EML may not be disposed on the chamfer surface. Since the width of the first side surface is reduced due to the chamfer surface, it is possible to reduce damage caused by collision of the substrate SUB of the first display device 11 and the substrate SUB of the second display device 12.

The chamfer surface may also be disposed between the first surface and each of the other side surfaces except the first side surface and between the second surface and each of the other side surfaces except the first side surface. For example, in case that the first display device 11 and the second display device 12 have a rectangular shape in a plan view as shown in FIG. 42, the substrate SUB may include a chamfer surface disposed between the first surface and each of a second side surface, a third side surface, and a fourth side surface, and between the second surface and each of the second side surface, the third side surface, and the fourth side surface.

The first front cover COV1 may overlap the chamfer surface of the substrate SUB. For example, the first front cover COV1 may protrude more than the substrate SUB in the first direction DR1 and the second direction DR2. Therefore, a gap GSUB between the substrate SUB of the first display device 11 and the substrate SUB of the second display device 12 may be greater than a gap GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to attach the light emitting element layer EML of the first display module DPM1 to the first front cover COV1.

The adhesive member 51 of the second front cover COV2 serves to attach a light emitting element layer EML of the second display module DPM2 to the second front cover COV2.

The adhesive member 51 may be a transparent adhesive member capable of transmitting light. For example, the adhesive member 51 may be an optically clear adhesive film or an optically clear resin.

The anti-glare layer 53 may be designed to diffusely reflect external light in order to prevent the visibility of an image from being deteriorated due to the external light being reflected as it is. Accordingly, the contrast ratio of an image displayed on the first display device 11 and the second display device 12 may increase due to the anti-glare layer 53.

The light transmittance control layer 52 may be designed to reduce the transmittance of the external light or light reflected from the first display module DPM1 and the second display module DPM2. Accordingly, the gap GSUB between the substrate SUB of the first display module DPM1 and the substrate SUB of the second display module DPM2 may be prevented from being visually recognized from the outside.

The anti-glare layer 53 may be implemented as a polarizing plate, and the light transmittance control layer 52 may be implemented as a phase delay layer, but the embodiment of the disclosure is not limited thereto.

Figure 44:
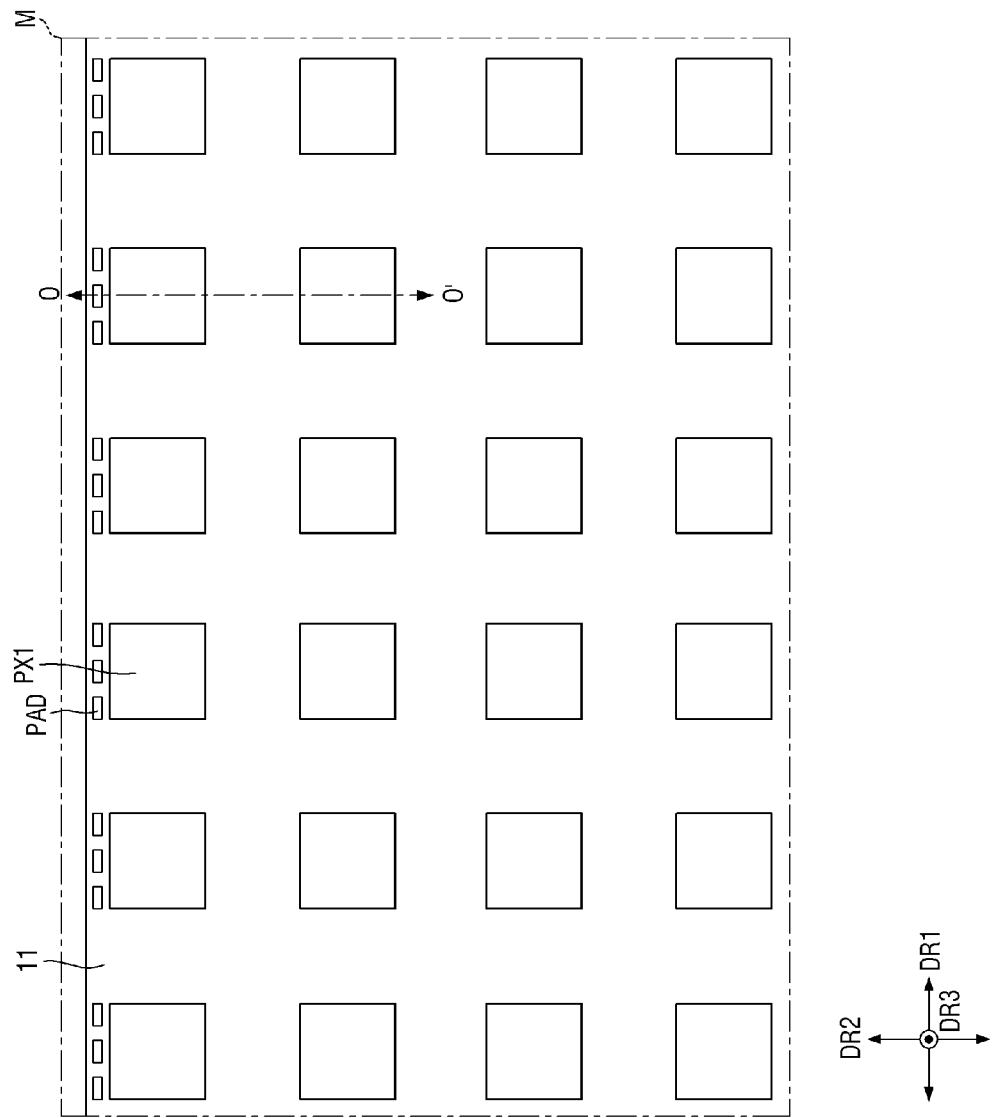
FIG. 44 is a schematic enlarged layout view illustrating area M of FIG. 41 in detail.

FIG. 44 is a schematic enlarged layout view illustrating area M of FIG. 41 in detail.

FIG. 44 illustrates pads PAD and the first pixels PX1 disposed on an upper side of the first display device 10.

Referring to FIG. 44, the pads PAD may be disposed at an upper edge of the first display device 11. In case that the data lines DL of the first display device 11 extend in the second direction DR2, the pads PAD may be disposed at upper and lower edges of the first display device 11. As another example, in case that the data lines DL of the first display device 11 extend in the first direction DR1, the pads PAD may be disposed at left and right edges of the first display device 11.

Each of the pads PAD may be connected to the data line DL. As another example, the pad PAD may be formed as part of the data line DL.

Figure 45:
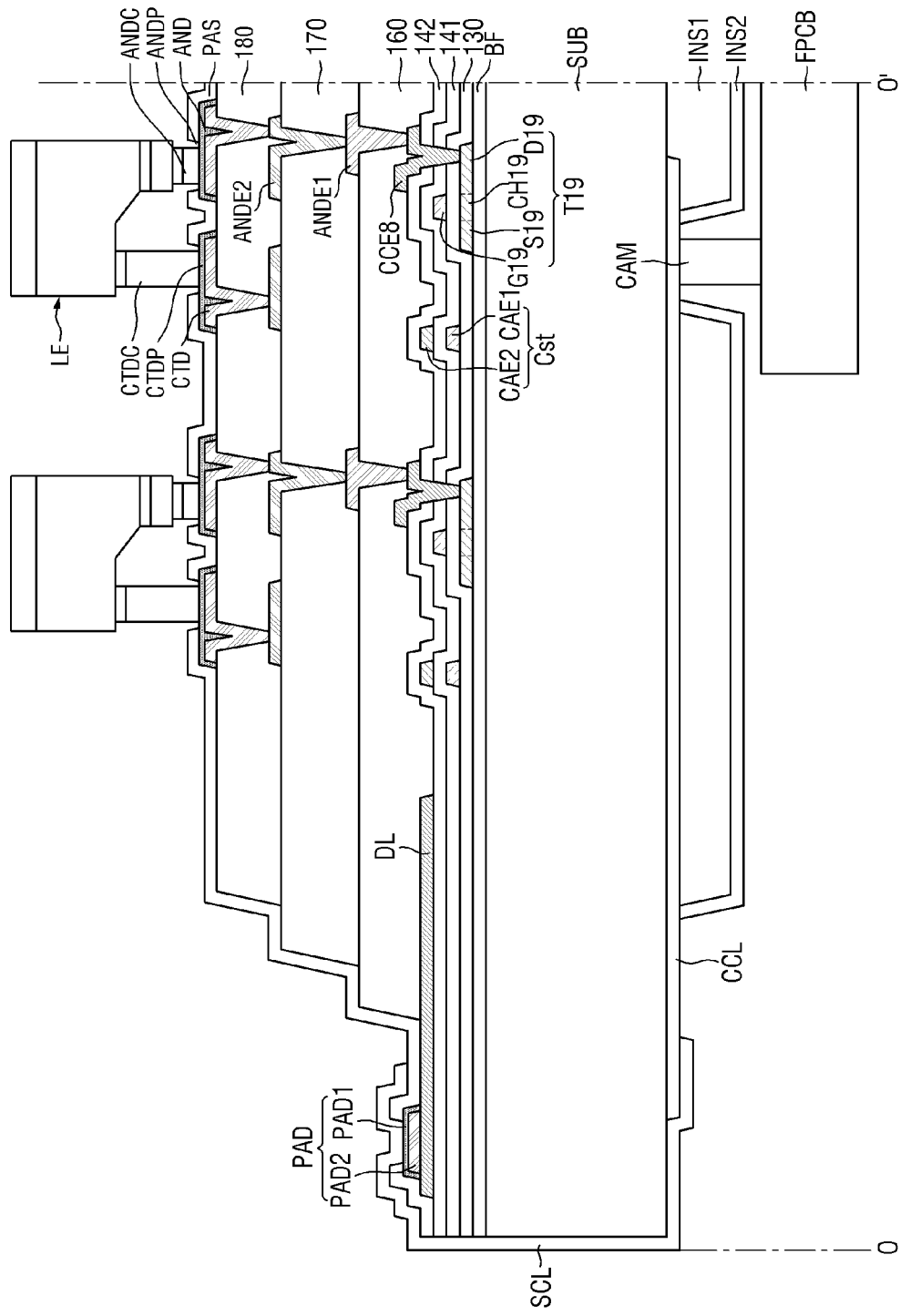
FIG. 45 is a schematic cross-sectional view illustrating an example of a tiled display device taken along line O-O' of FIG. 44.

Each of the pads PAD may be connected to a side line SCL (see FIG. 45). The side line SCL may be disposed on a side surface and the bottom surface (or rear surface) of the substrate SUB. The side line SCL may be connected to a connection line CCL (see FIG. 45) on the bottom surface of the substrate SUB.

FIG. 45 is a schematic cross-sectional view illustrating an example of a tiled display device taken along line O-O' of FIG. 44.

Referring to FIG. 45, the pad PAD may be disposed on part of the data line DL. For example, the pad PAD may include a first pad layer PAD1 formed as the sixth conductive layer such as the anode electrode AND or the like, and a second pad layer PAD2 formed as the seventh conductive layer such as the anode pad ANDP.

As another example, although not separately illustrated, the pad PAD may be formed as part of the data line DL.

As another example, although not separately illustrated, the pad PAD may be formed as a conductive pattern disposed on an insulating layer (not shown) covering the data line DL and contacting part of the data line DL through a hole penetrating the insulating layer.

In case that the pad PAD has a structure including the first pad layer PAD1 and the second pad layer PAD2, part of the pad PAD may be exposed without being covered by the planarization layer or other insulating layers.

The first pad layer PAD1 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like.

The second pad layer PAD2 may be formed of a transparent conductive material (TCO) such as ITO or IZO.

The data line DL may be formed as the third conductive layer on the second interlayer insulating layer 142.

The connection line CCL may be disposed on the bottom surface of the substrate SUB. The connection line CCL may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A lower planarization layer INS1 may be disposed on part of the connection line CCL. The lower planarization layer INS1 may be formed as an organic layer such as acryl resin, epoxy resin, phenolic resin, polyamide resin, polyimide resin and the like.

A lower insulating layer INS2 may be disposed on the lower planarization layer INS1. The lower insulating layer INS2 may be formed as an inorganic layer, for example, a silicon nitride layer, a silicon oxynitride layer, a silicon oxide layer, a titanium oxide layer, or an aluminum oxide layer.

The side line SCL may be disposed at the bottom surface edge, the side surface, and the top surface edge of the substrate SUB. An end of the side line SCL may be connected to the connection line CCL. The end of the side line SCL may contact the side surface and the bottom surface of the connection line CCL. Another end of the side line SCL may be connected to the pad PAD or the data line DL. The another end of the side line SCL may be connected to the pad PAD or the data line DL through the contact hole penetrating the passivation layer PAS.

The side line SCL may be disposed on the side surface of the substrate SUB, the side surface of the buffer layer BF, the side surface of the gate insulating layer 130, the side surface of the first interlayer insulating layer 141, and the side surface of the second interlayer insulating layer 142.

A flexible film FPCB may be disposed on the bottom surface of the lower insulating layer INS2. The flexible film FPCB may be connected to the connection line CCL via the hole penetrating the lower planarization layer INS1 and the lower insulating layer INS2 and a conductive adhesive member CAM. A source driving circuit for supplying data voltages to the data lines DL may be disposed on the bottom surface of the flexible film FPCB. The conductive adhesive member CAM may be an anisotropic conductive film or an anisotropic conductive paste.

As in FIGS. 44 and 45, in the first display device 11, the source driving circuit of the flexible film FPCB disposed under the substrate SUB may be connected to the data line DL through the connection line CCL, the side line SCL, and the pad PAD. For example, since the source driving circuit is disposed under the substrate SUB, the non-display area NDA can be removed from an upper portion of the substrate SUB, so that the pixels PX may be formed even at the edge of the substrate SUB.

Figure 46:
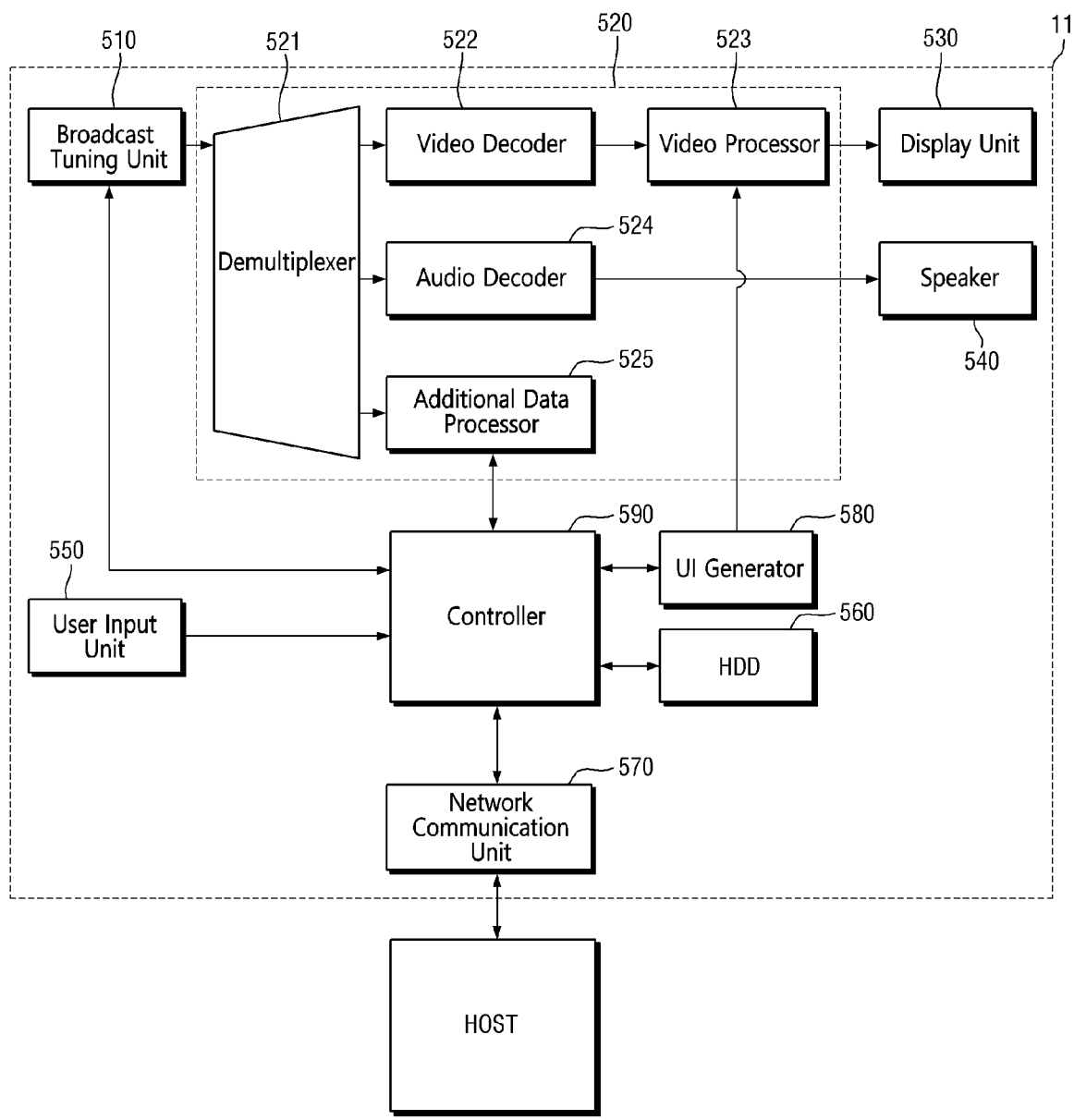
FIG. 46 is a schematic block diagram illustrating a tiled display device according to an embodiment.

FIG. 46 is a schematic block diagram illustrating a tiled display device according to an embodiment.

FIG. 46 illustrates the first display device 11 and a host system HOST.

Referring to FIG. 46, the tiled display device TD according to an embodiment is connected to the host system HOST.

The host system HOST may be implemented as any one of a television system, a home theater system, a set-top box, a navigation system, a DVD player, a Blu-ray player, a personal computer (PC), a mobile phone system, and a tablet computer.

A user's command may be inputted to the host system HOST in various formats. For example, a command by a user's touch input may be inputted to the host system HOST. As another example, a user's command by a keyboard input or a button input of a remote controller may be inputted to the host system HOST.

The host system HOST may receive original video data corresponding to an original image from the outside. The host system HOST may divide the original video data by the number of the display devices. For example, in response to the first display device 11, the second display device 12, the third display device 13, and the fourth display device 14, the host system HOST may divide the original video data into a first video data corresponding to a first image, a second video data corresponding to a second image, a third video data DATA3 corresponding to a third image, and a fourth video data corresponding to a fourth image. The host system HOST may transmit the first video data to the first display device 11, the second video data to the second display device 12, the third video data to the third display device 13, and the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view the original image in which the first to fourth images displayed on the first to fourth display devices 11, 12, 13 and 14 are combined.

The first display device 11 may include a broadcast tuning part 510, a signal processing part 520, a display part 530, a speaker 540, a user input part 550, an HDD 560, a network communication part 570, a user interface (UI) generation part 580, and a control part 590.

The broadcast tuning part 510 may tune a channel frequency under the control of the control part 590 to receive a broadcast signal of a corresponding channel through an antenna. The broadcast tuning part 510 may include a channel detection module and an RF demodulation module.

The broadcast signal demodulated by the broadcast tuning part 510 is processed by the signal processing part 520 and outputted to the display part 530 and the speaker 540. The signal processing part 520 may include a demultiplexer 521, a video decoder 522, a video processor 523, an audio decoder 524, and an additional data processor 525.

The demultiplexer 521 separates the demodulated broadcast signal into a video signal, an audio signal, and additional data. The video signal, the audio signal, and the additional data are restored by the video decoder 522, the audio decoder 524, and the additional data processor 525, respectively. The video decoder 522, the audio decoder 524, and the additional data processor 525 restore them in a decoding format corresponding to an encoding format of a time when the broadcast signal is transmitted.

On the other hand, the decoded video signal is converted by the video processor 523 to fit the vertical frequency, resolution, aspect ratio, and the like that meet the output standard of the display part 530, and the decoded audio signal is outputted to the speaker 540.

The display part 530 includes the display panel 100 on which an image is displayed and a panel driver that controls driving of the display panel 100. Since the detailed block diagram of the display panel 100 and the panel driver has been described with reference to FIG. 4 and the like, a redundant description thereof will be omitted.

The user input part 550 may receive a signal transmitted by the host system HOST. The user input part 550 may be provided to allow the user to select channels transmitted by the host system HOST and select commands related to communication with other display devices DV2 to DV4 as well as data related to selection and manipulation of a UI menu, and to allow data for input to be inputted.

The storage part 560 stores various software programs including OS programs, recorded broadcast programs, videos, photos, and other data, and may be formed as a storage medium such as a hard disk or non-volatile memory.

The network communication part 570 is for short-distance communication with the host system HOST and the other display devices, and may be implemented as a communication module including an antenna pattern that can implement mobile communication, data communication, Bluetooth communication, RF communication, Ethernet communication, or the like.

The network communication part 570 may transmit/receive a wireless signal to/from at least one of a base station, an external terminal, or a server on a mobile communication network constructed according to technical standards or communication methods (e.g., global system for mobile communication (GSM), code division multiple access (CDMA), CDMA2000, enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, and the like) for mobile communication through the antenna pattern to be described later.

The network communication part 570 may transmit or receive a wireless signal in a communication network according to wireless internet techniques through the antenna pattern to be described later. Examples of the wireless internet techniques include wireless LAN (WLAN), wireless-fidelity (Wi-Fi), Wi-Fi direct, digital living network alliance (DLNA), wireless broadband (WiBro), worldwide interoperability for microwave access (WiMAX), high speed downlink packet access (HSDPA), high speed uplink packet access (HSUPA), long term evolution (LTE), long term evolution-advanced (LTE-A), and the like. The antenna pattern transmits and receives data according to at least one of wireless internet techniques including even internet techniques not listed above.

The UI generation part 580 generates a UI menu for communication with the host system HOST and the other display devices, and may be implemented by an algorithm code and an OSD IC. The UI menu for communication with the host system HOST and the other display devices may be a menu for designating a counterpart digital TV for communication and selecting a desired function.

The control part 590 is in charge of overall control of the first display device 11, and communication control of the host system HOST and the second to fourth display devices 12, 13, and 14. The control part 590 may be implemented by a microcontroller unit (MCU) in which a corresponding algorithm code for control is stored and the stored algorithm code is executed.

In response to the input and selection of the user input part 550, the control part 590 controls to transmit a corresponding control command and data to the host system HOST and the second to fourth display devices 12, 13, and 14 through the network communication part 570. In case that a control command and data are received from the host system HOST and the second to fourth display devices 12, 13, and 14, the control part 590 performs an operation according to the corresponding control command.

The block diagram of the second display device 12, the block diagram of the third display device 13, and the block diagram of the fourth display device 14 are substantially the same as the block diagram of the first display device 11 described with reference to FIG. 46, and thus a description thereof will be omitted.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a plurality of sub-pixels arranged in a display area;
   an active layer disposed on a substrate;
   a gate insulating layer overlapping the active layer in a plan view;
   a first interlayer insulating layer overlapping a first conductive layer disposed on the gate insulating layer in a plan view;
   a second interlayer insulating layer overlapping a second conductive layer disposed on the first interlayer insulating layer in a plan view;
   a first planarization layer overlapping a third conductive layer disposed on the second interlayer insulating layer in a plan view;
   a second planarization layer overlapping a fourth conductive layer disposed on the first planarization layer in a plan view;
   a third planarization layer overlapping a fifth conductive layer disposed on the second planarization layer in a plan view;
   a sixth conductive layer disposed on the third planarization layer; and
   a seventh conductive layer disposed on at least part of the sixth conductive layer, wherein
   the sixth conductive layer comprises:
      a plurality of anode electrodes respectively corresponding to the plurality of sub-pixels;
      a plurality of cathode electrodes respectively corresponding to the plurality of sub-pixels and respectively spaced apart from the plurality of anode electrodes; and
      a cathode line electrically connected to the plurality of cathode electrodes, and the seventh conductive layer comprises:
      a plurality of anode pads respectively overlapping the plurality of anode electrodes in a plan view;
      a plurality of cathode pads respectively overlapping the plurality of cathode electrodes in a plan view; and
      a cathode line pad overlapping at least part of the cathode line in a plan view.

2. The display device of claim 1, further comprising:
   a light emitting element disposed on an anode electrode and a cathode electrode of each of the plurality of sub-pixels, wherein
   the light emitting element has a flip chip type.

3. The display device of claim 1, wherein in the plurality of sub-pixels,
   the plurality of anode pads are respectively disposed on the plurality of anode electrodes, respectively overlap top surfaces and side surfaces of the plurality of anode electrodes in a plan view, and are in contact with the third planarization layer, and
   the plurality of cathode pads are respectively disposed on the plurality of cathode electrodes, respectively overlap top surfaces and side surfaces of the plurality of cathode electrodes in a plan view, and are in contact with the third planarization layer.

4. The display device of claim 3, wherein in each of the plurality of sub-pixels, the cathode line pad overlaps an edge of the cathode line facing a corresponding one of the plurality of anode electrodes and a corresponding one of the plurality of cathode electrodes in a plan view.

5. The display device of claim 4, wherein the cathode line pad is disposed on the edge of the cathode line, overlaps a top surface and a side surface of the edge of the cathode line in a plan view, and is in contact with the third planarization layer.

6. The display device of claim 5, wherein
in each of the plurality of sub-pixels, the cathode line pad is spaced apart from a corresponding one of the plurality of anode pads, corresponds to a boundary between the cathode line and a corresponding one of the plurality of anode electrodes and the plurality of cathode electrodes, and forms a closed loop shape together with at least part of an edge of a corresponding one of the plurality of cathode pads, and
the plurality of anode electrodes and the plurality of cathode electrodes of sub-pixels adjacent in a direction among the plurality of sub-pixels are arranged side by side in the direction.

7. The display device of claim 6, wherein
the cathode line pad corresponds to each of the plurality of sub-pixels, and
the cathode line pad of each of the sub-pixels adjacent in the direction is spaced apart from each other.

8. The display device of claim 6, further comprising:
a plurality of pixels each comprising two or more sub-pixels adjacent to each other in the direction among the plurality of sub-pixels, wherein
the cathode line pad corresponds to each of the plurality of pixels and is further disposed at a boundary between the two or more sub-pixels of each of the plurality of pixels, and
the cathode line pad of each of the sub-pixels adjacent in the direction and corresponding to different ones of the pixels is spaced apart from each other.

9. The display device of claim 6, wherein the cathode line pad corresponds to the sub-pixels adjacent in the direction and is further disposed at a boundary between the sub-pixels adjacent in the direction.

10. The display device of claim 6, wherein the cathode line pad overlaps an entire area of the cathode line in a plan view.

11. The display device of claim 6, wherein each of the plurality of anode pads, the plurality of cathode pads, and the cathode line pad extends onto the third planarization layer.

12. The display device of claim 6, further comprising:
a scan write line to which a scan write signal is applied;
a scan initialization line to which a scan initialization signal is applied;
a sweep signal line to which a sweep signal is applied;
a first data line to which a first data voltage is applied; and
a second data line to which a second data voltage is applied, wherein
each of the plurality of sub-pixels is electrically connected to the scan write line, the scan initialization line, the sweep signal line, the first data line, and the second data line, and
each of the plurality of sub-pixels comprises:
a first pixel driver that generates a control current in response to the first data voltage of the first data line;
a second pixel driver that generates a driving current applied to the anode electrode in response to the second data voltage of the second data line; and
a third pixel driver that controls a period in which the driving current is applied to a corresponding one of the plurality of anode electrodes in response to the control current of the first pixel driver,
wherein the first pixel driver comprises:
a first transistor that generates the control current in response to the first data voltage;
a second transistor that applies the first data voltage of the first data line to a first electrode of the first transistor in response to the scan write signal;
a third transistor that applies an initialization voltage of an initialization voltage line to a gate electrode of the first transistor in response to the scan initialization signal;
a fourth transistor that electrically connects a gate electrode and a second electrode of the first transistor in response to the scan write signal; and
a first capacitor disposed between the sweep signal line and the gate electrode of the first transistor.

13. The display device of claim 12, further comprising:
a first power line to which a first power voltage is applied;
a second power line to which a second power voltage is applied;
a first emission line to which a first emission signal is applied;
a scan control line to which a scan control signal is applied,
wherein the first pixel driver further comprises:
a fifth transistor that electrically connects the first power line to the first electrode of the first transistor in response to the first emission signal;
a sixth transistor that electrically connects the second electrode of the first transistor to a first node in response to the first emission signal; and
a seventh transistor that electrically connects the sweep signal line to a gate-off voltage line to which a gate-off voltage is applied in response to the scan control signal.

14. The display device of claim 13, wherein the second pixel driver comprises:
an eighth transistor that generates the driving current in response to the second data voltage;
a ninth transistor that applies the second data voltage of the second data line to a first electrode of the eighth transistor in response to the scan write signal;
a tenth transistor that applies an initialization voltage of the initialization voltage line to a gate electrode of the eighth transistor in response to the scan initialization signal; and
an eleventh transistor that electrically connects the gate electrode and a second electrode of the eighth transistor in response to the scan write signal.

15. The display device of claim 14, wherein the second pixel driver further comprises:
a twelfth transistor that electrically connects the second power line to a second node in response to the first emission signal;
a thirteenth transistor that electrically connects the second power line to a first electrode of the ninth transistor in response to the first emission signal;
a fourteenth transistor that electrically connects the first power line to a second node in response to the scan control signal; and
a second capacitor disposed between the gate electrode of the eighth transistor and the second node.

16. The display device of claim 15, wherein the third pixel driver comprises:
a fifteenth transistor comprising a gate electrode electrically connected to a third node;
a sixteenth transistor that electrically connects the first node to the initialization voltage line in response to the scan control signal;

a seventeenth transistor that electrically connects a second electrode of the fifteenth transistor to a first electrode of a light emitting element in response to a second emission signal;

an eighteenth transistor that electrically connects the first electrode of the light emitting element to the initialization voltage line in response to the scan control signal; and a third capacitor disposed between the first node and the initialization voltage line.

17. The display device of claim 16, further comprising:
a test signal line to which a test signal is applied; and
a third power line to which a third power voltage is applied, wherein
the third pixel driver further comprises a nineteenth transistor that electrically connects the first electrode of the light emitting element to the third power line in response to the test signal, and
the cathode line is electrically connected to the third power line.

18. The display device of claim 17, wherein
the active layer comprises a channel, a source electrode, and a drain electrode of each of the first, second, third, fourth, fifth, sixth, seventh, eighth, ninth, tenth, eleventh, twelfth, thirteenth, fourteenth, fifteenth, sixteenth, seventeenth, eighteenth, and nineteenth transistors,
the first conductive layer comprises:
  a gate electrode of each of the first, second, third, fourth, fifth, sixth, seventh, eighth, ninth, tenth, eleventh, twelfth, thirteenth, fourteenth, fifteenth, sixteenth, seventeenth, eighteenth, and nineteenth transistors; and
  first, third, and fifth capacitor electrodes which are first parts of the first, second, and third capacitors, respectively, and
the second conductive layer comprises second, fourth, and sixth capacitor electrodes which are second parts of the first, second, and third capacitors, respectively.

19. The display device of claim 18, wherein
the third conductive layer comprises the initialization voltage line, the scan initialization line, the scan write line, the first emission line, a second emission line, a first horizontal power line to which the first power voltage is applied, the sweep signal line, a gate-off voltage line, a scan control line, a test signal line, and a third power auxiliary line to which the third power voltage is applied, and
the fourth conductive layer comprises the first data line, a first vertical power line to which the first power voltage is applied, the second data line, and a first anode connection electrode, and
the first anode connection electrode is electrically connected to the drain electrode of the seventeenth transistor and the drain electrode of the eighteenth transistor.

20. The display device of claim 19, wherein the fifth conductive layer comprises:
the third power line; and
a second anode connection electrode electrically connected to the first anode connection electrode.

21. The display device of claim 6, further comprising:
a passivation layer disposed on the third planarization layer and overlapping an edge of each of the plurality of anode pads, an edge of each of the plurality of cathode pads, the cathode line pad, and the cathode line, in a plan view, wherein in each of the plurality of sub-pixels, a corresponding one of the plurality of anode pads is electrically connected to a first contact electrode of a light emitting element through an anode contact electrode, and a corresponding one of the plurality of cathode pads is electrically connected to a second contact electrode of the light emitting element through a cathode contact electrode.

22. A tiled display device comprising:
display devices; and
a seam between the display devices, wherein
one of the display devices comprises:
a plurality of sub-pixels arranged in a display area;
an active layer disposed on a substrate;
a gate insulating layer overlapping the active layer in a plan view;
a first interlayer insulating layer overlapping a first conductive layer disposed on the gate insulating layer in a plan view;
a second interlayer insulating layer overlapping a second conductive layer disposed on the first interlayer insulating layer in a plan view;
a first planarization layer overlapping a third conductive layer disposed on the second interlayer insulating layer in a plan view;
a second planarization layer overlapping a fourth conductive layer disposed on the first planarization layer in a plan view;
a third planarization layer overlapping a fifth conductive layer disposed on the second planarization layer in a plan view;
a sixth conductive layer disposed on the third planarization layer; and
a seventh conductive layer disposed on at least part of the sixth conductive layer, wherein
the sixth conductive layer comprises:
  a plurality of anode electrodes respectively corresponding to the plurality of sub-pixels;
  a plurality of cathode electrodes respectively corresponding to the plurality of sub-pixels and respectively spaced apart from the plurality of anode electrodes; and
  a cathode line electrically connected to the plurality of cathode electrodes, and the seventh conductive layer comprises:
  a plurality of anode pads respectively overlapping the plurality of anode electrodes in a plan view;
  a plurality of cathode pads respectively overlapping the plurality of cathode electrodes in a plan view; and
  a cathode line pad overlapping at least part of the cathode line in a plan view.

23. The tiled display device of claim 22, wherein the substrate is made of glass.

24. The tiled display device of claim 22, wherein one of the display devices further comprises:
pads disposed on a first surface of the substrate; and
a side line disposed on a first surface, a second surface and a side surface of the substrate, the side line electrically connected to one of the pads, the side surface disposed between the first surface and the second surface.

25. The tiled display device of claim 24, wherein
one of the display devices further comprises:
a connection line disposed on the second surface of the substrate; and
a flexible film connected to the connection line through a conductive adhesive member, and the side line is electrically connected to the connection line.

26. The tiled display device of claim 22, wherein the display devices are arranged in a matrix form having m rows and n columns.

27. The tiled display device of claim 22, wherein one of the display devices further comprises a light emitting element disposed on an anode electrode and a cathode electrode of each of the plurality of sub-pixels,
the light emitting element has a flip chip type.

28. The tiled display device of claim 22, wherein in the plurality of sub-pixels,
the plurality of anode pads are respectively disposed on the plurality of anode electrodes, respectively overlap top surfaces and side surfaces of the plurality of anode electrodes in a plan view, and are in contact with the third planarization layer, and
the plurality of cathode pads are respectively disposed on the plurality of cathode electrodes, respectively overlap top surfaces and side surfaces of the plurality of cathode electrodes in a plan view, and are in contact with the third planarization layer.

29. The tiled display device of claim 28, wherein in each of the plurality of sub-pixels, the cathode line pad overlaps an edge of the cathode line facing a corresponding one of the plurality of anode electrodes and a corresponding one of the plurality of cathode electrodes in a plan view.

30. The tiled display device of claim 29, wherein the cathode line pad is disposed on the edge of the cathode line, overlaps a top surface and a side surface of the edge of the cathode line in a plan view, and is in contact with the third planarization layer.

31. The tiled display device of claim 30, wherein
in each of the plurality of sub-pixels, the cathode line pad is spaced apart from a corresponding one of the plurality of anode pads, corresponds to a boundary between the cathode line and a corresponding one of the plurality of anode electrodes and the plurality of cathode electrodes, and forms a closed loop shape together with at least part of an edge of a corresponding one of the plurality of cathode pads, and
the plurality of anode electrodes and the plurality of cathode electrodes of sub-pixels adjacent in a direction among the plurality of sub-pixels are arranged side by side in the direction.

32. The tiled display device of claim 31, wherein each of the plurality of anode pads, the plurality of cathode pads, and the cathode line pad extends onto the third planarization layer.

* * * * *